(12) United States Patent
Fukuoka et al.

(10) Patent No.: US 8,174,047 B2
(45) Date of Patent: May 8, 2012

(54) SEMICONDUCTOR DEVICE

(75) Inventors: Osamu Fukuoka, Aichi (JP); Masahiko Hayakawa, Kanagawa (JP); Hideaki Shishido, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 426 days.

(21) Appl. No.: 12/495,963

(22) Filed: Jul. 1, 2009

(65) Prior Publication Data
US 2010/0006848 A1 Jan. 14, 2010

(30) Foreign Application Priority Data
Jul. 10, 2008 (JP) ................................. 2008-180635

(51) Int. Cl.
*H01L 29/66* (2006.01)
(52) U.S. Cl. ................. 257/173; 257/355; 257/E29.328
(58) Field of Classification Search .................... None
See application file for complete search history.

(56) References Cited

U.S. PATENT DOCUMENTS

| | | | |
|---|---|---|---|
| 5,689,133 A | 11/1997 | Li et al. | |
| 5,825,601 A | 10/1998 | Statz et al. | |
| 6,118,154 A * | 9/2000 | Yamaguchi et al. | 257/360 |
| 6,180,996 B1 * | 1/2001 | Onoda et al. | 257/536 |
| 6,310,379 B1 | 10/2001 | Andresen et al. | |
| 6,492,707 B1 | 12/2002 | Kaku et al. | |
| 6,545,321 B2 | 4/2003 | Morishita | |
| 6,844,596 B2 * | 1/2005 | Ohnakado | 257/355 |
| 7,064,418 B2 * | 6/2006 | Li et al. | 257/656 |
| 7,109,533 B2 | 9/2006 | Kodama | |
| 7,259,029 B2 * | 8/2007 | Tseng et al. | 438/20 |
| 2006/0017139 A1 | 1/2006 | Eguchi et al. | |
| 2009/0310265 A1 * | 12/2009 | Fukuoka et al. | 361/54 |
| 2009/0321869 A1 * | 12/2009 | Fukuoka et al. | 257/461 |

FOREIGN PATENT DOCUMENTS

| | | |
|---|---|---|
| EP | 1 619 725 A2 | 1/2006 |
| JP | 05-029636 | 2/1993 |
| JP | 2002-100761 | 4/2002 |
| JP | 2004-006743 | 1/2004 |
| JP | 2006-060191 | 3/2006 |

* cited by examiner

*Primary Examiner* — Benjamin Sandvik
(74) *Attorney, Agent, or Firm* — Nixon Peabody LLP; Jeffrey L. Costellia

(57) ABSTRACT

To improve the performance of a protection circuit including a diode formed using a semiconductor film. A protection circuit is inserted between two input/output terminals. The protection circuit includes a diode which is formed over an insulating surface and is formed using a semiconductor film. Contact holes for connecting an n-type impurity region and a p-type impurity region of the diode to a first conductive film in the protection circuit are distributed over the entire impurity regions. Further, contact holes for connecting the first conductive film and a second conductive film in the protection circuit are dispersively formed over the semiconductor film. By forming the contact holes in this manner wiring resistance between the diode and a terminal can be reduced and the entire semiconductor film of the diode can be effectively serve as a rectifier element.

15 Claims, 30 Drawing Sheets

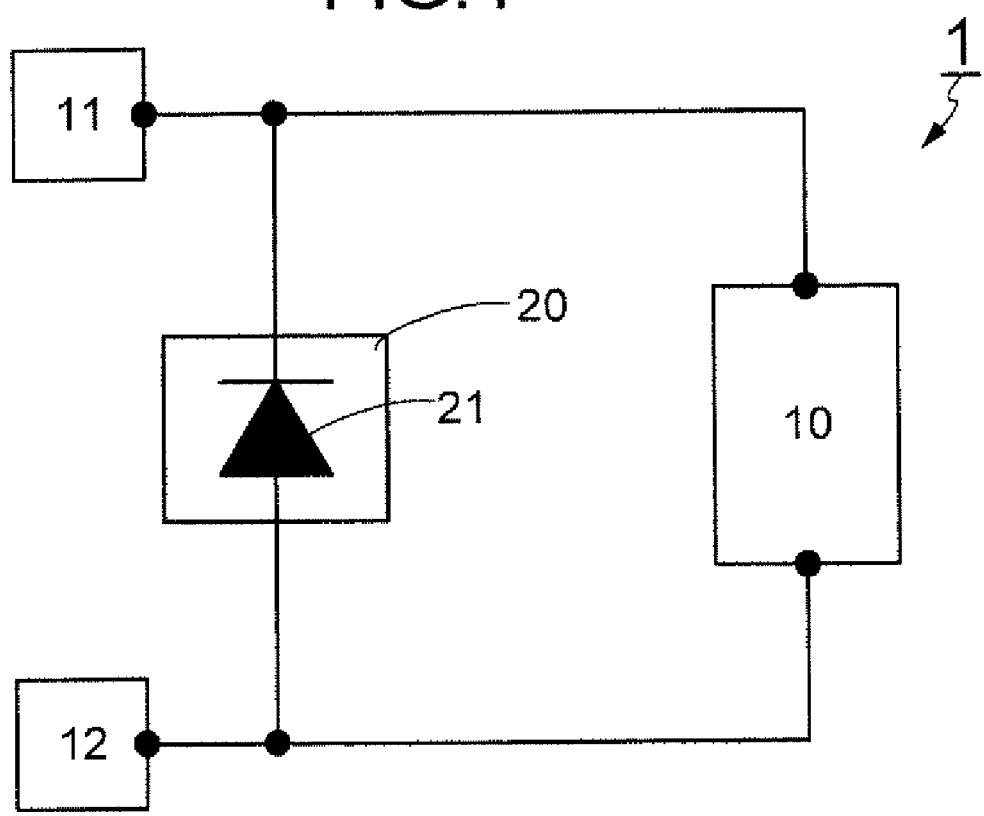

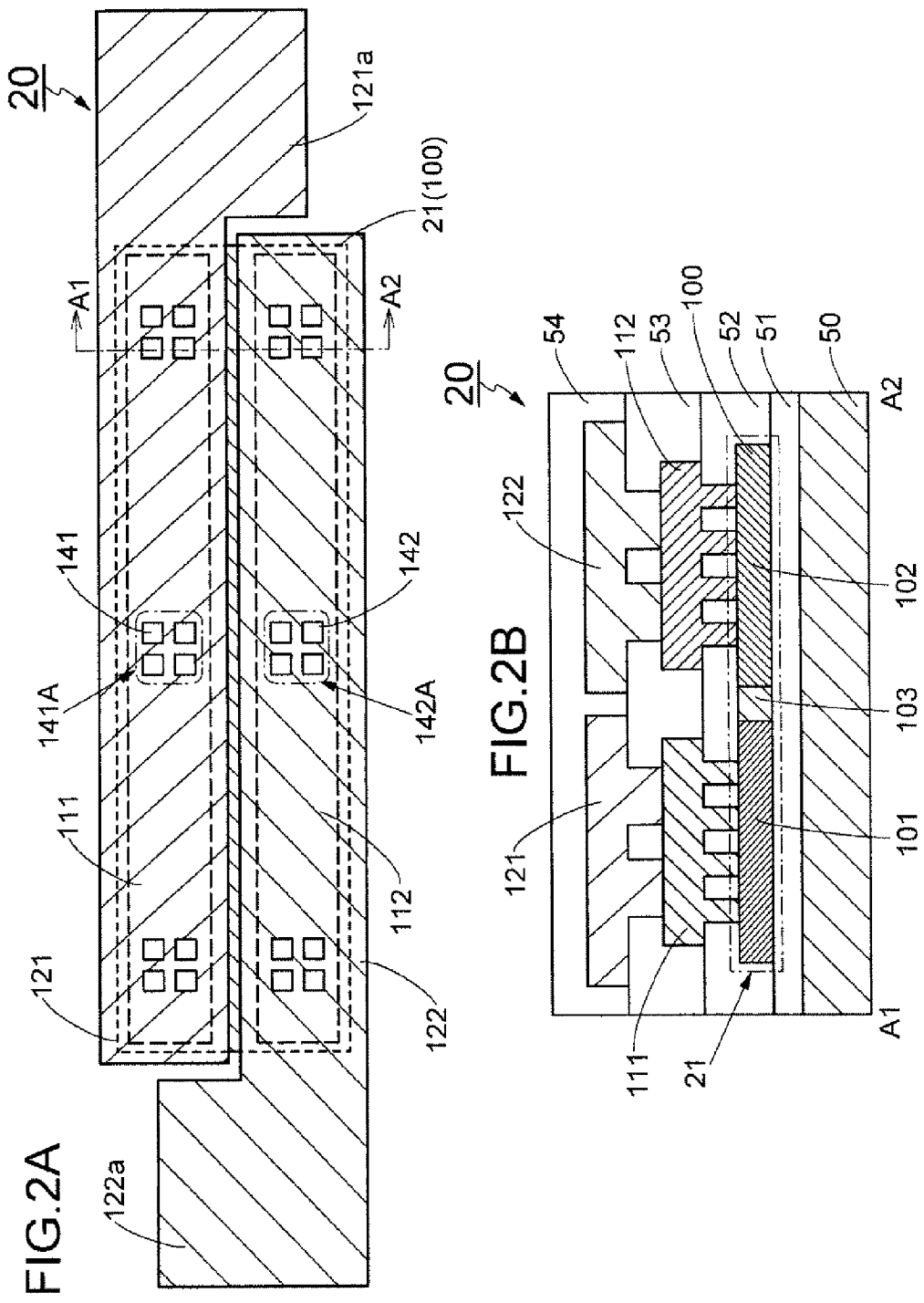

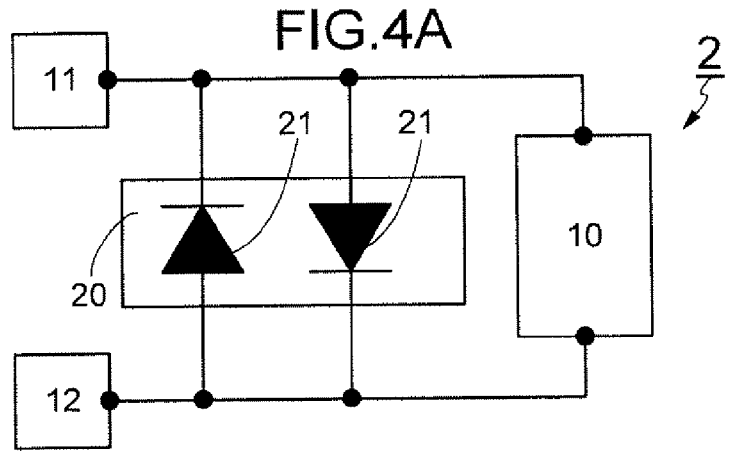
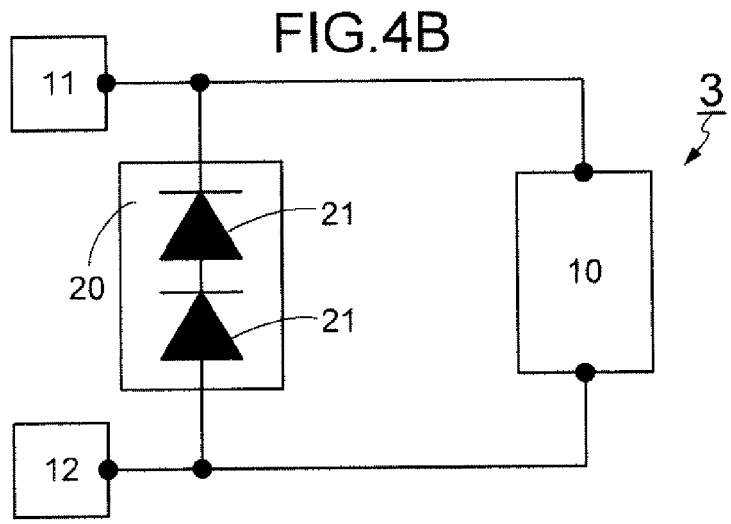
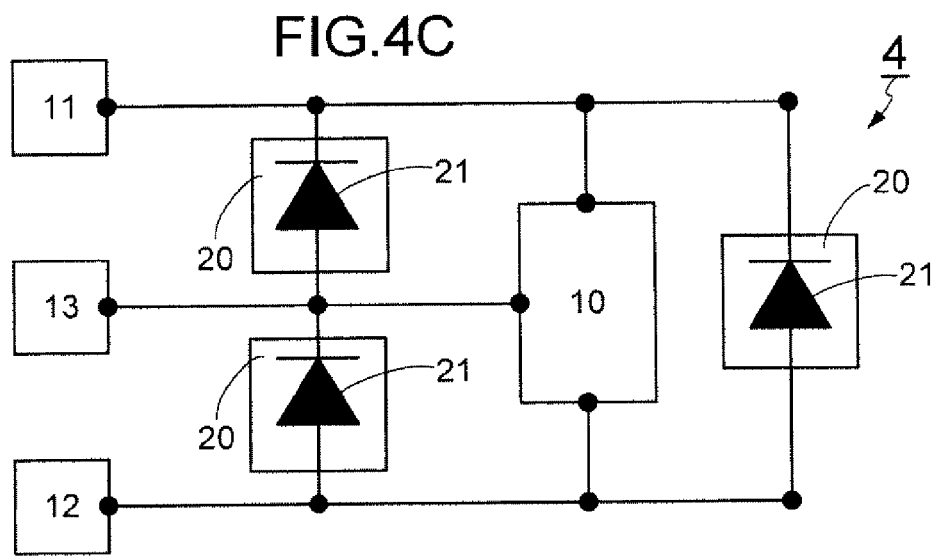

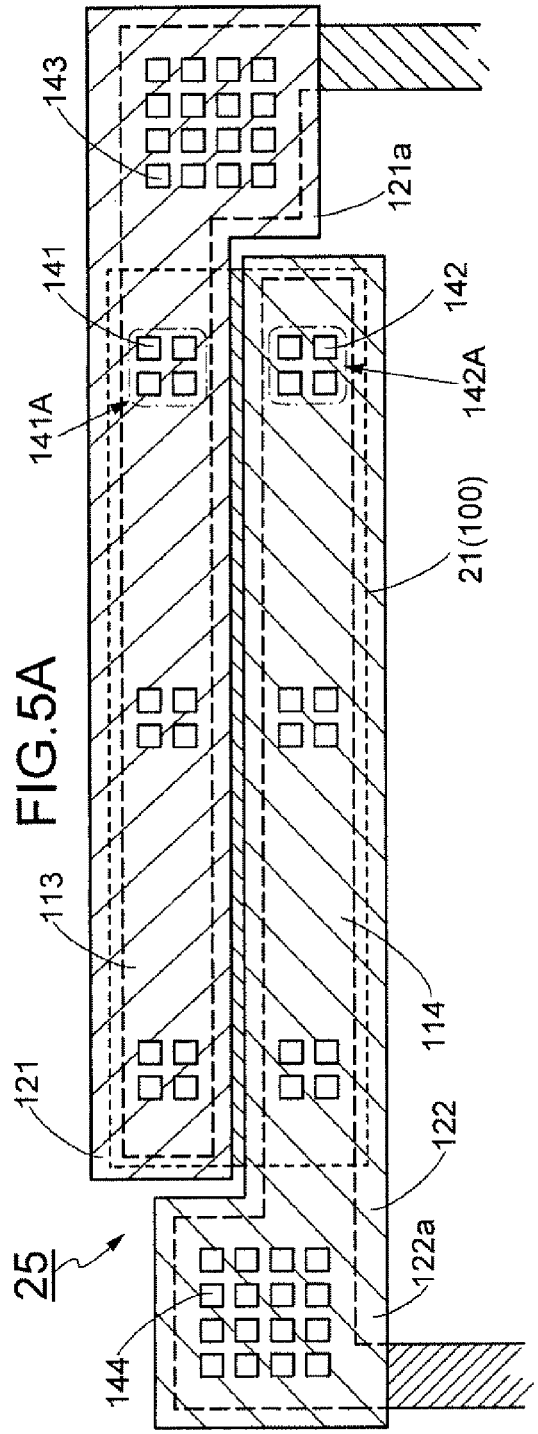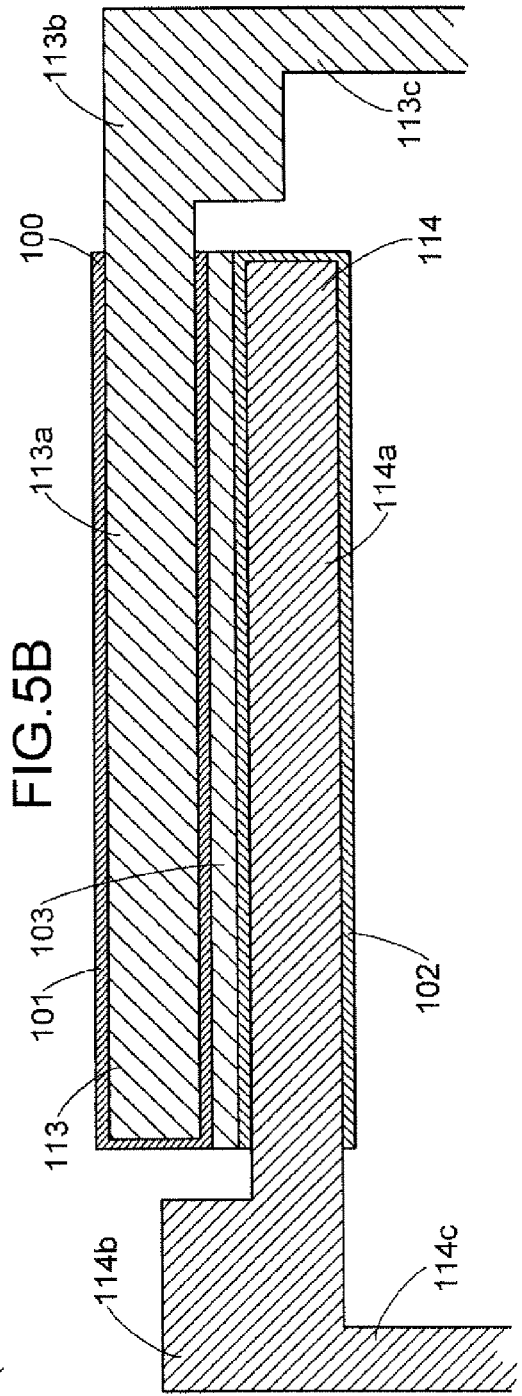

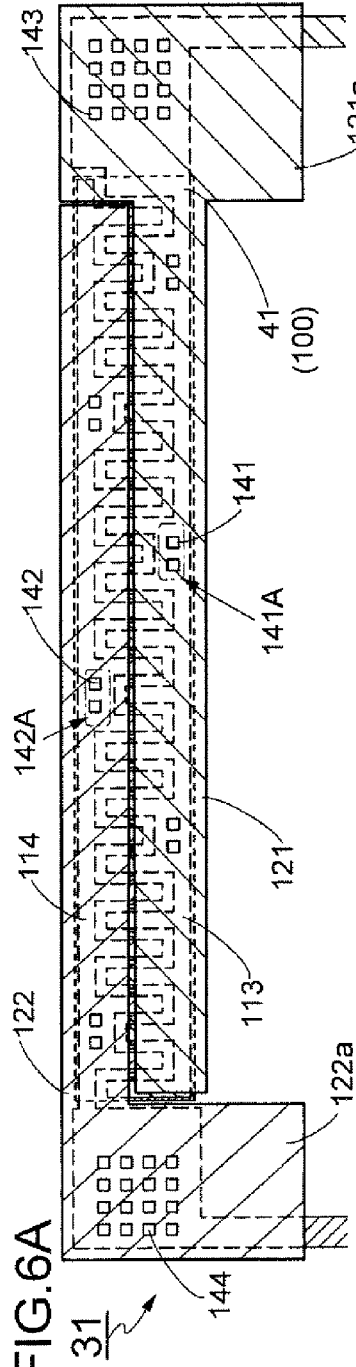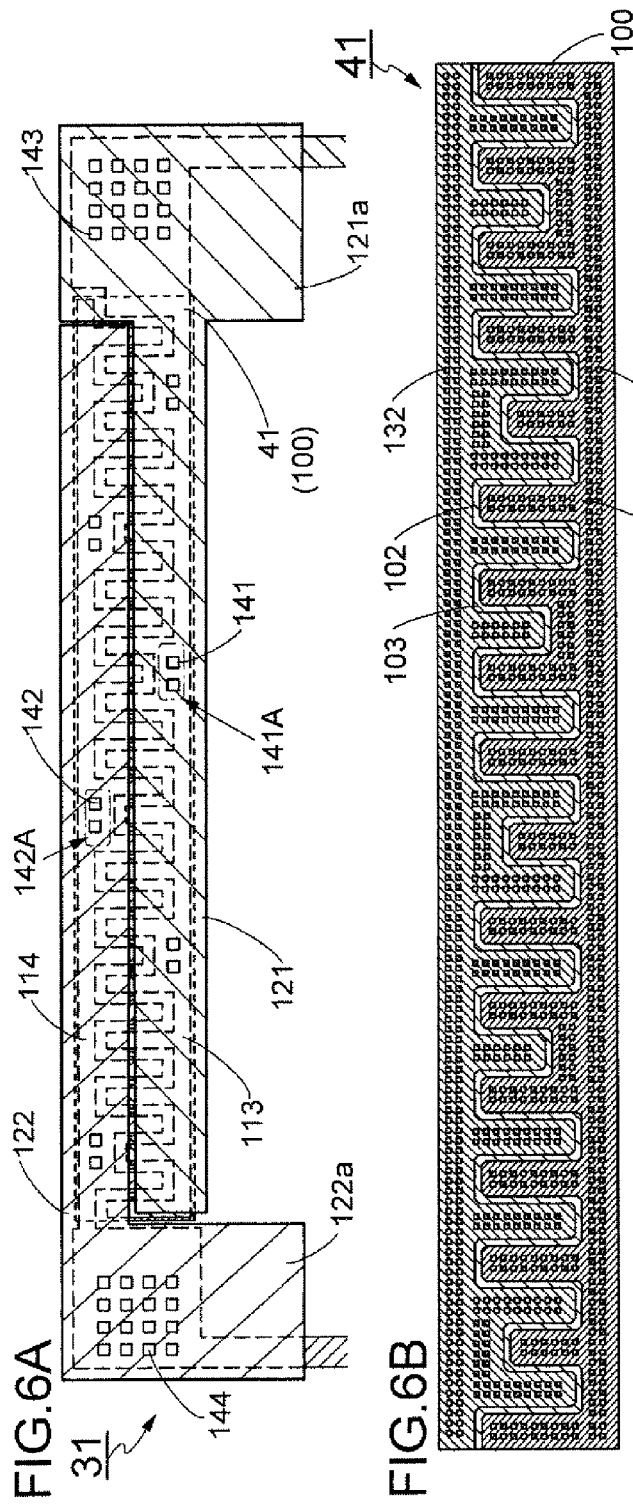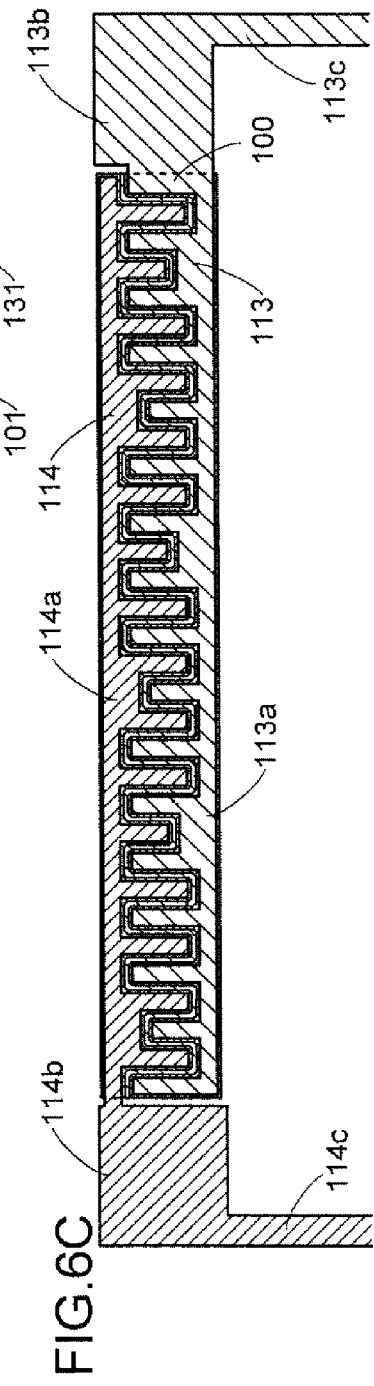

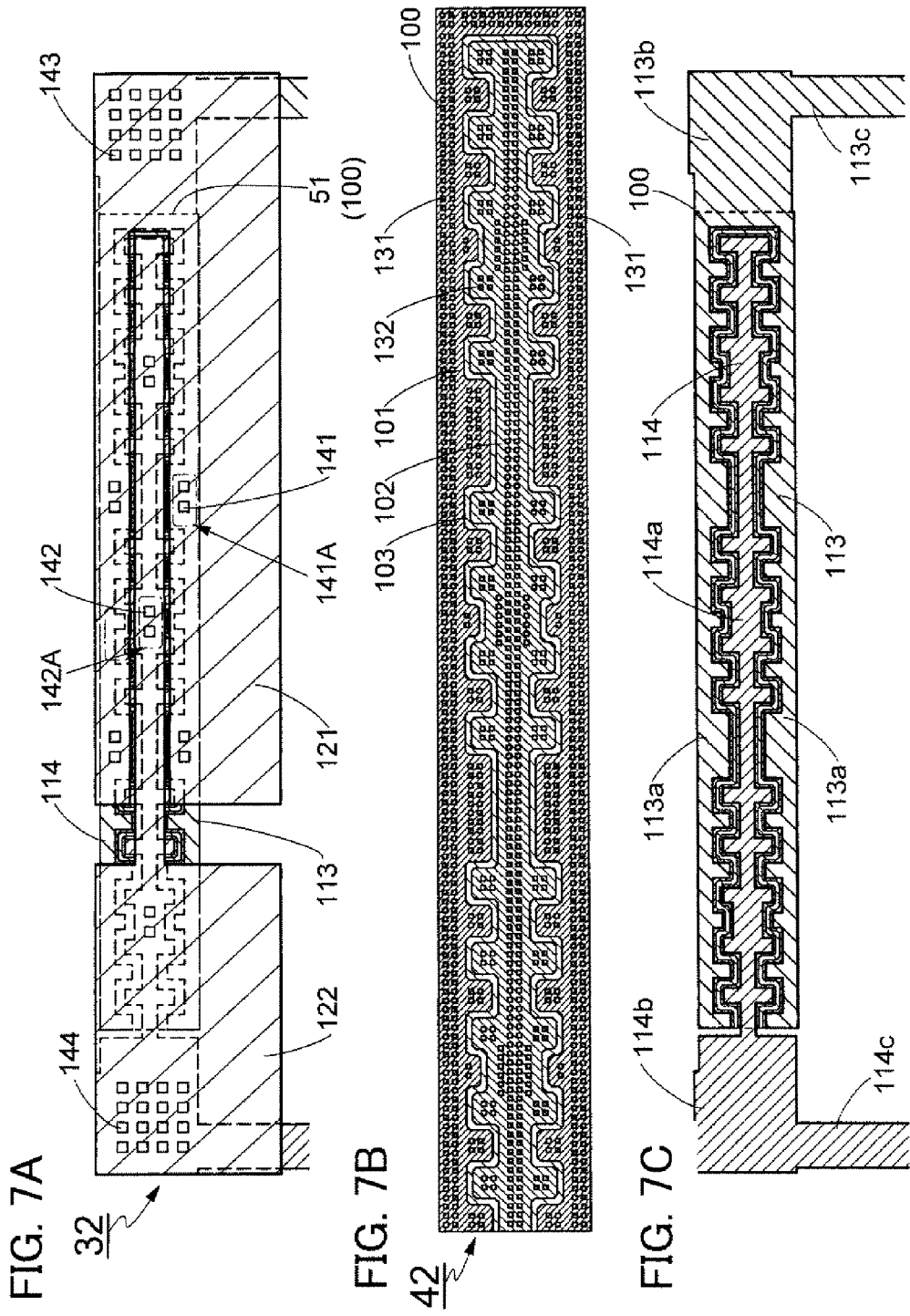

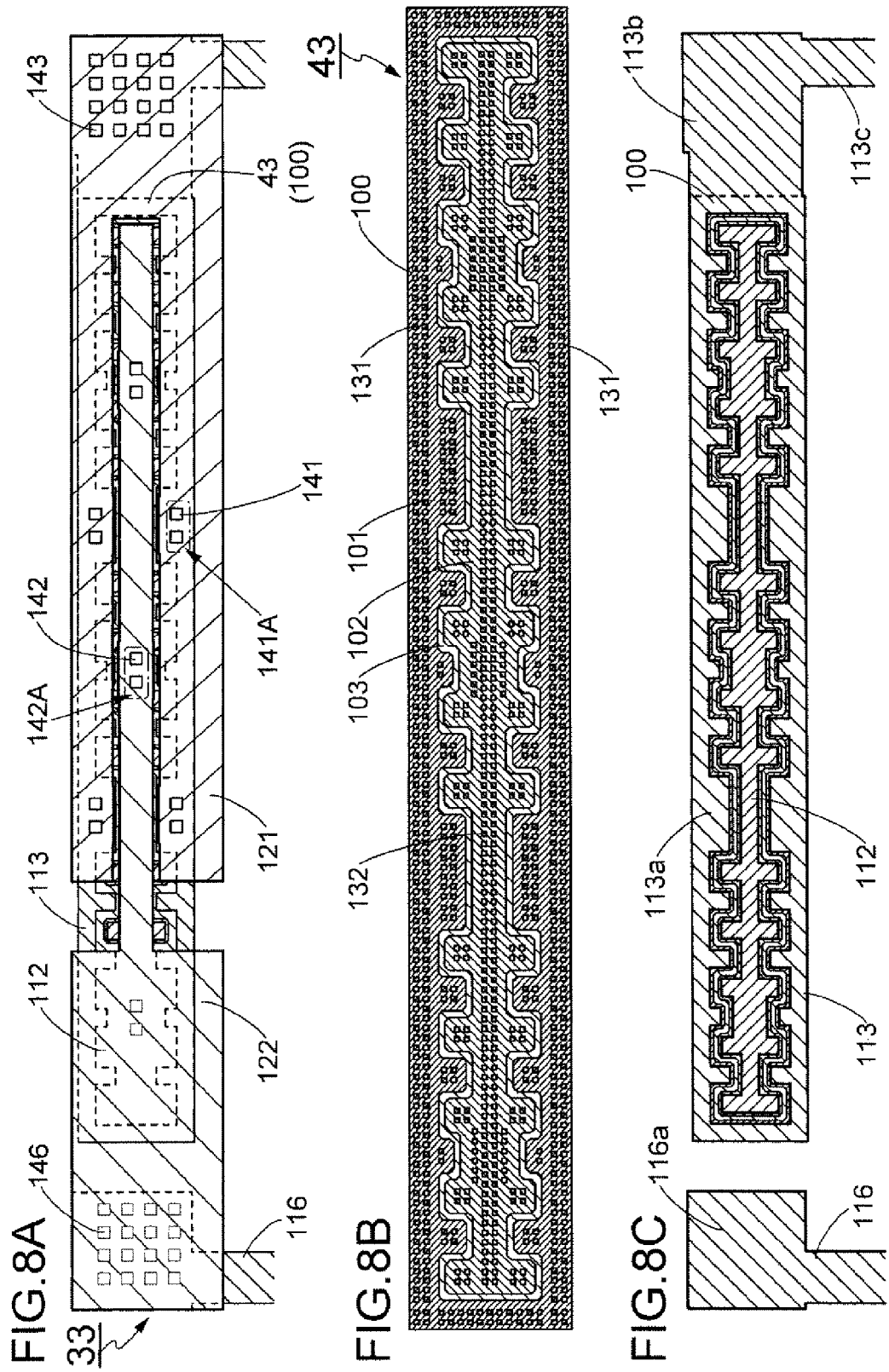

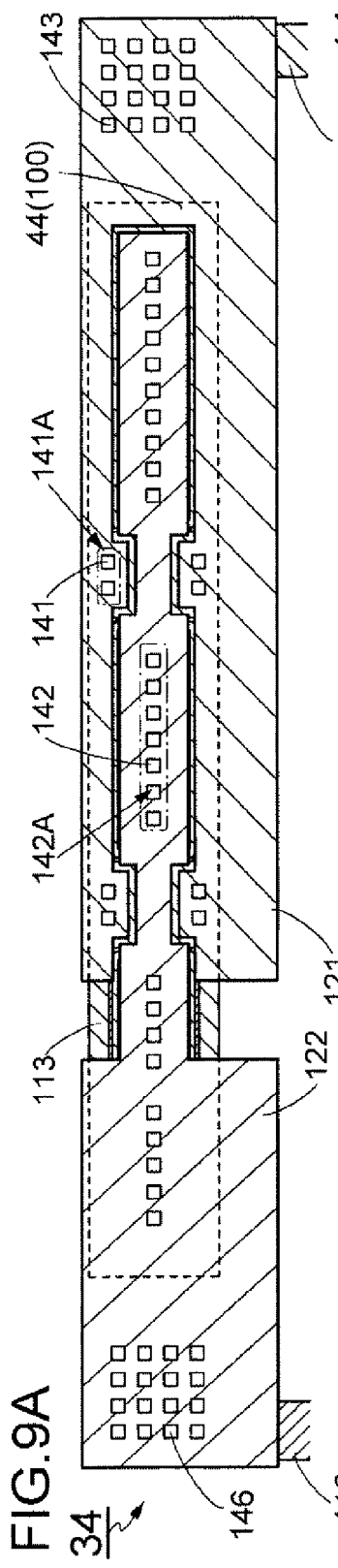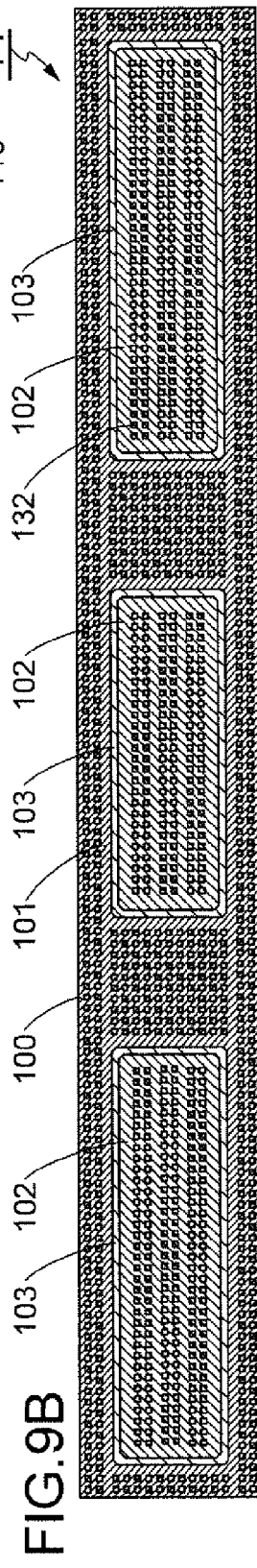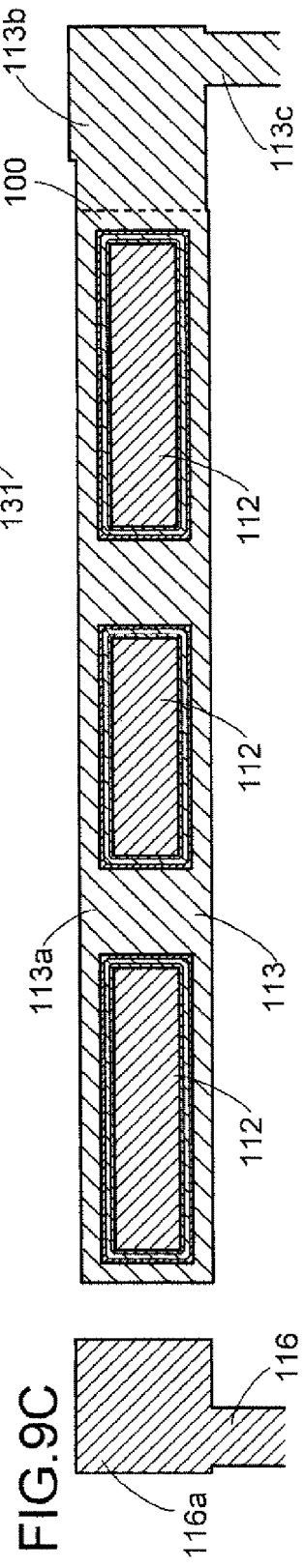

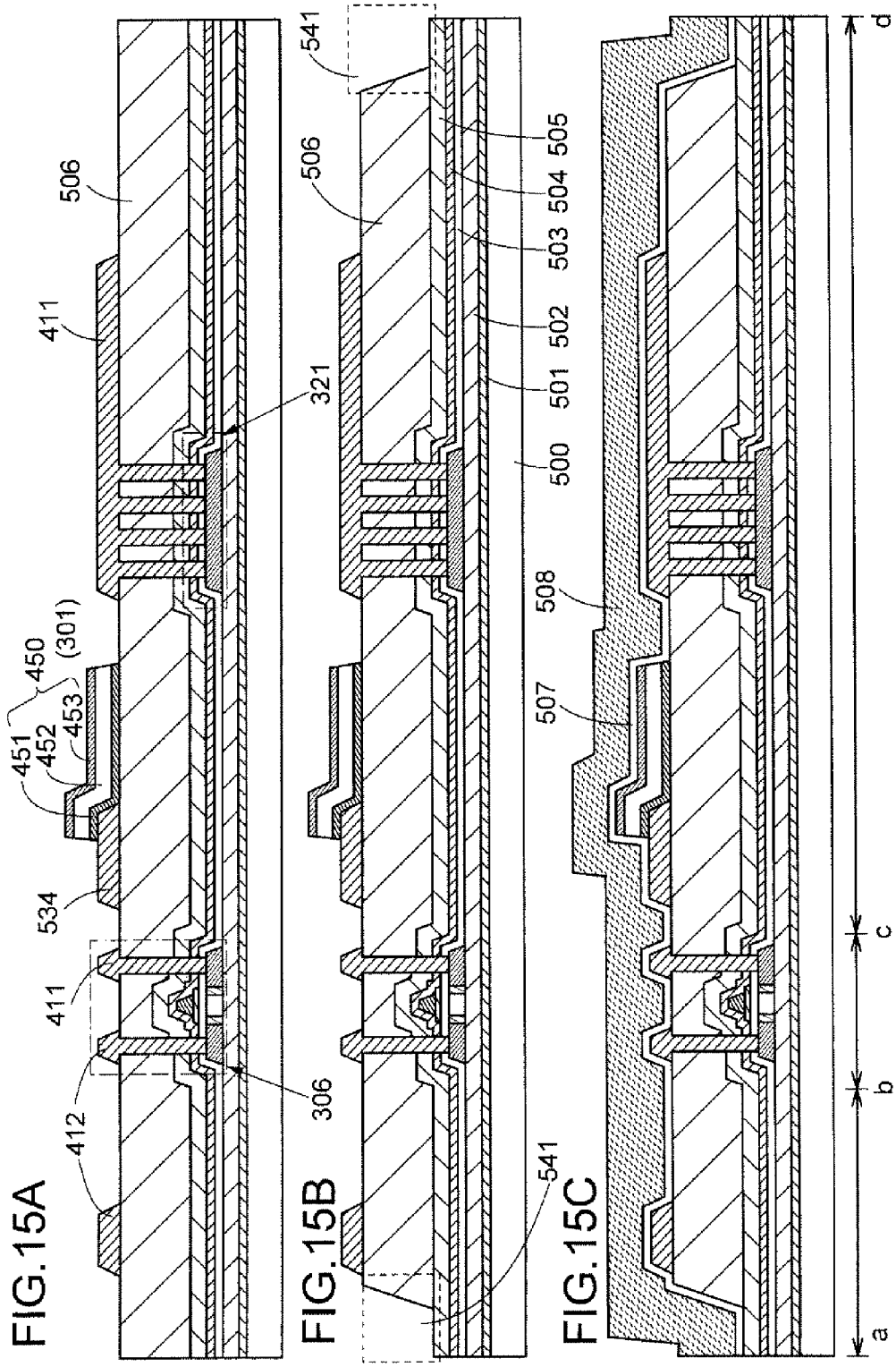

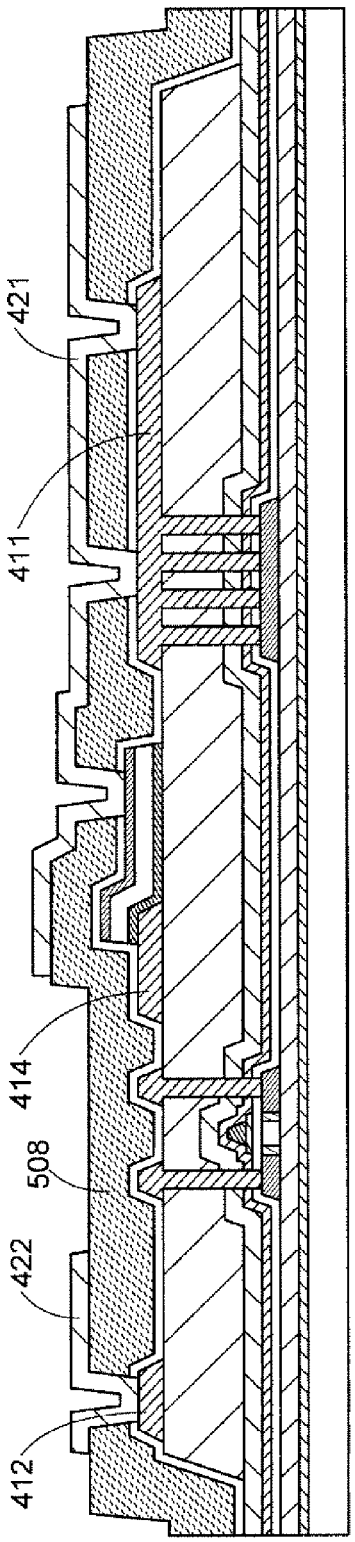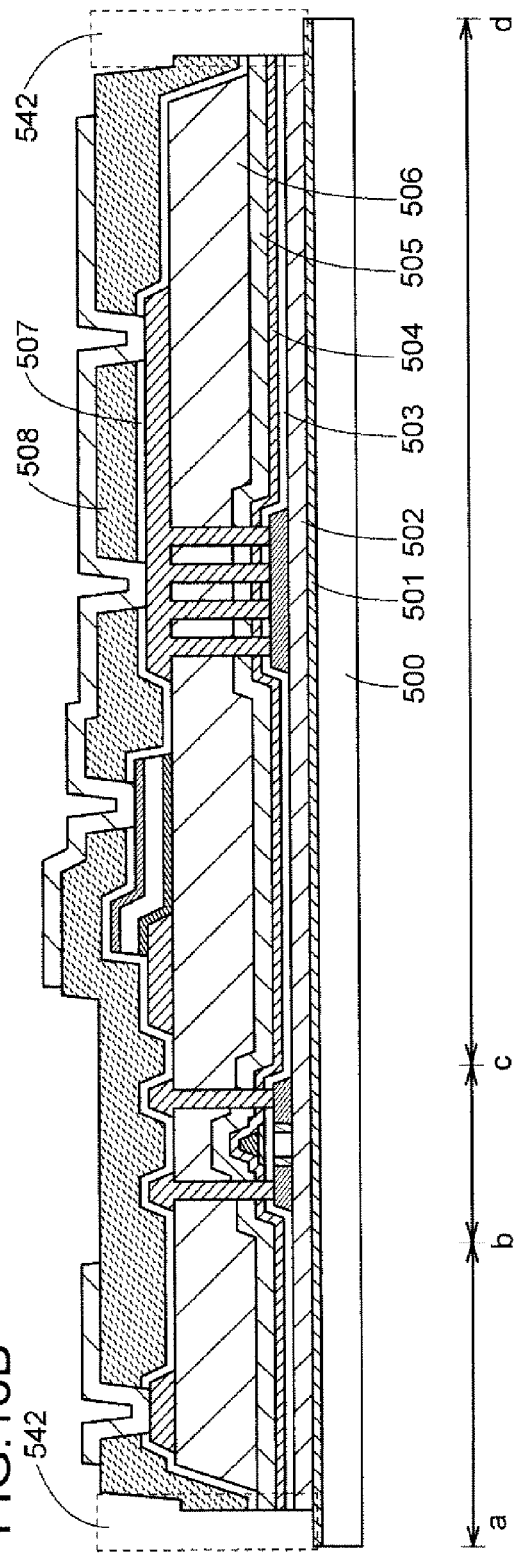
FIG.16A
FIG.16B

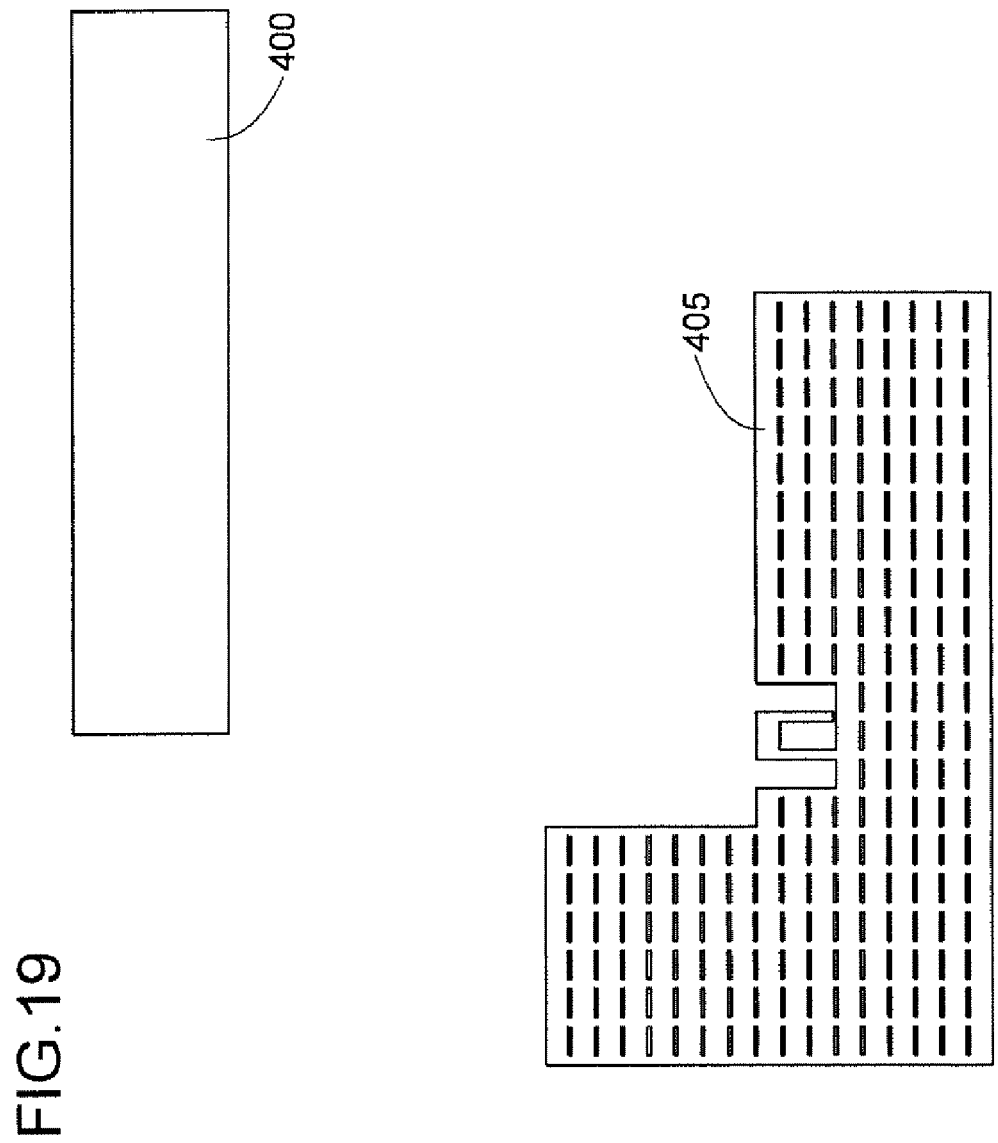

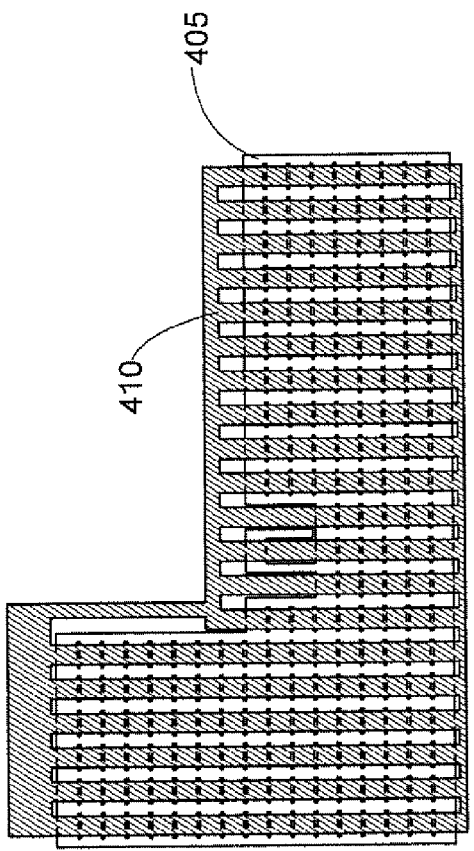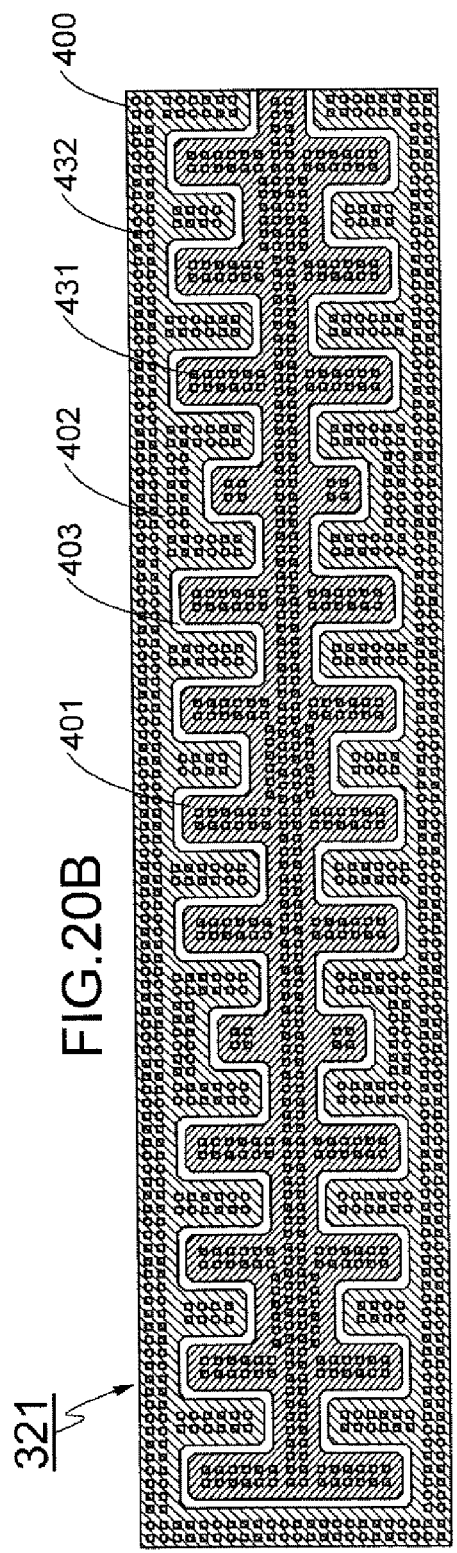
FIG. 20A
FIG. 20B

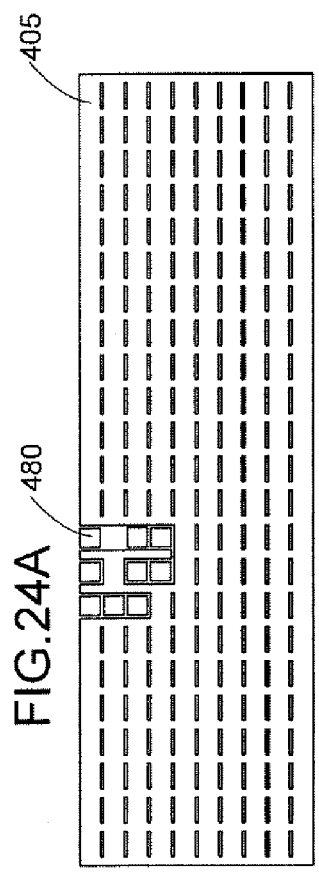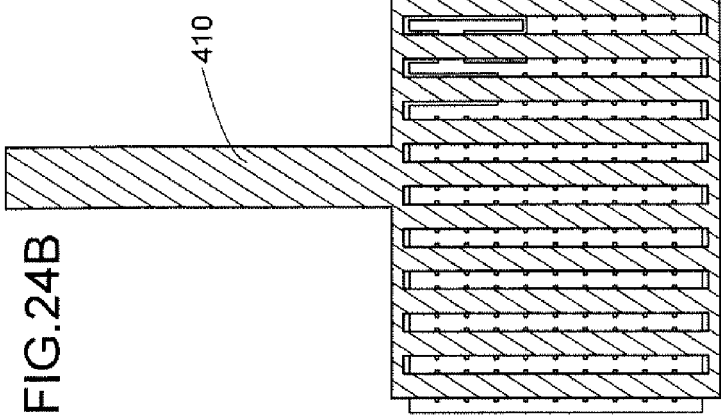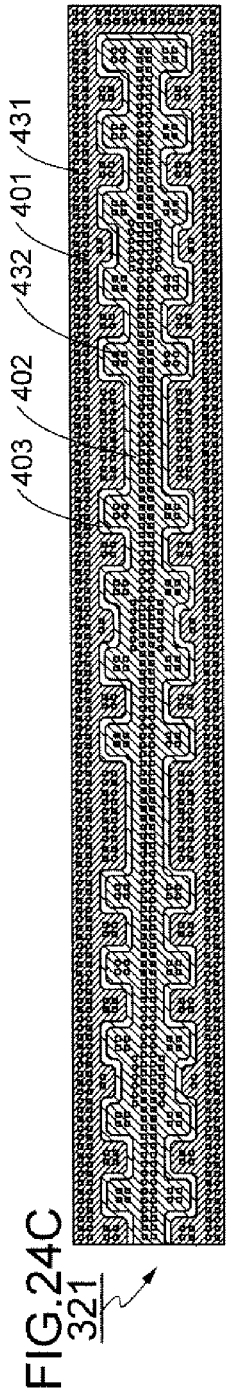
FIG. 24A
FIG. 24B
FIG. 24C

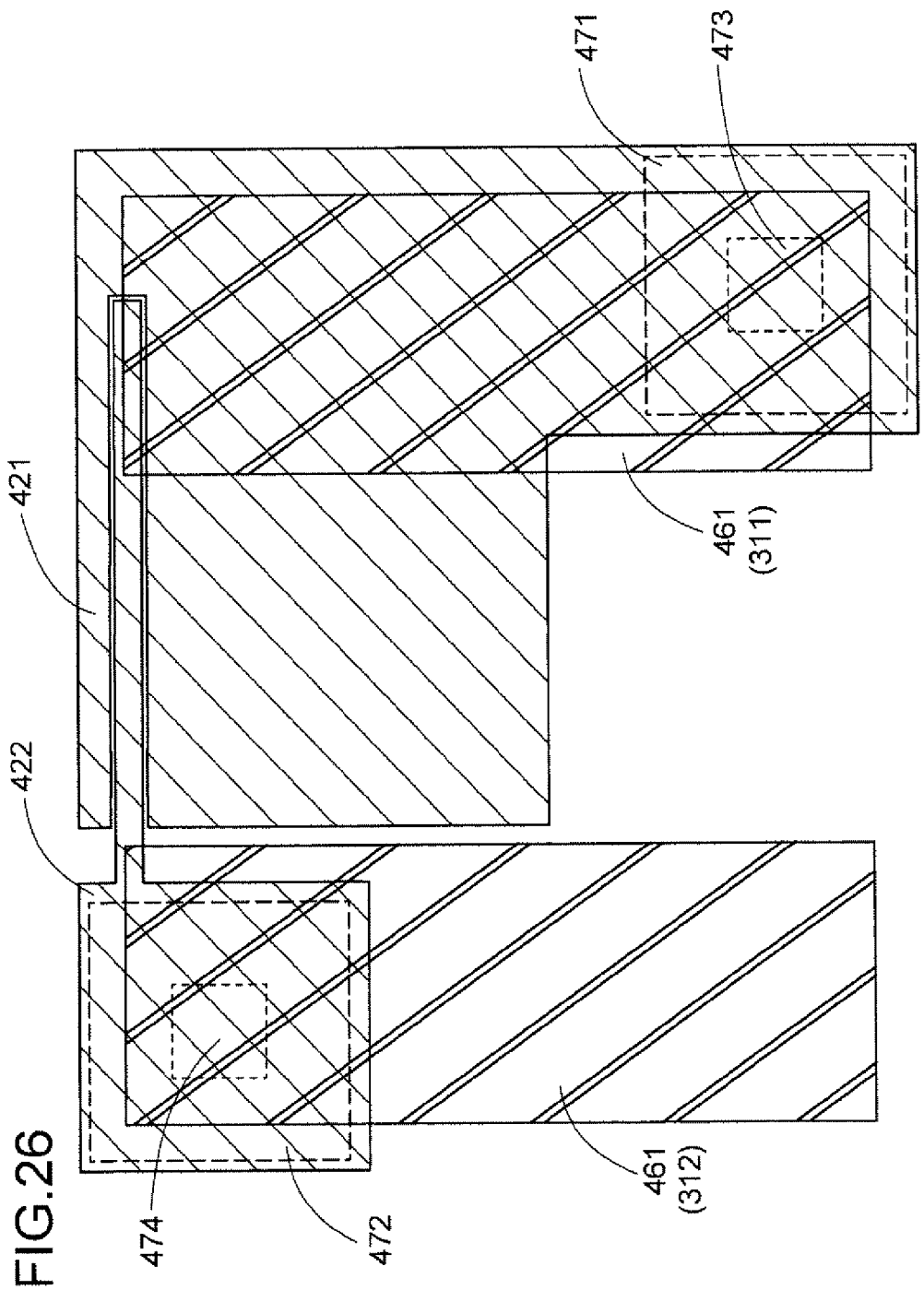

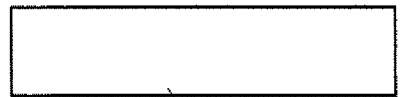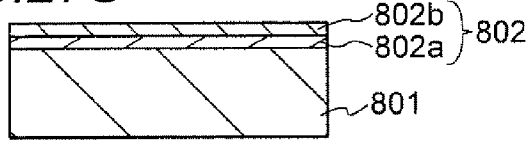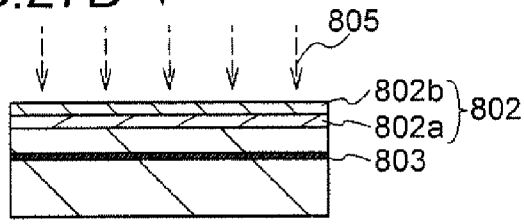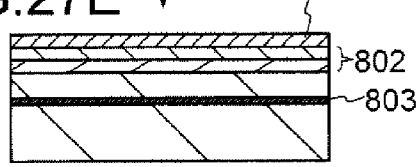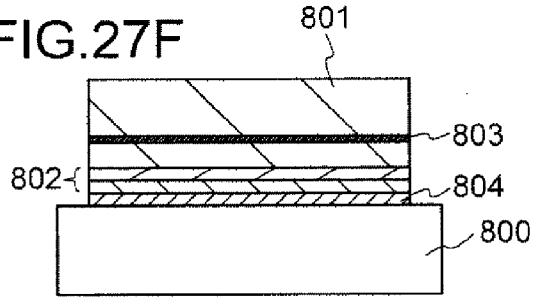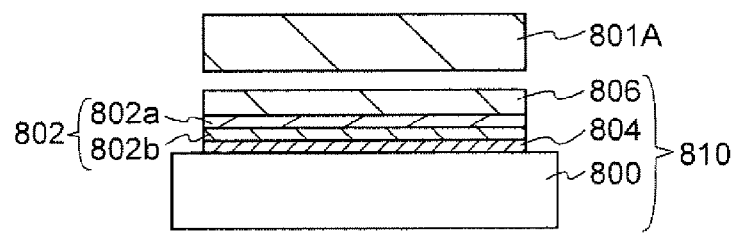

SEMICONDUCTOR DEVICE

BACKGROUND OF THE INVENTION

1. Field of the Invention

The present invention relates to a semiconductor device including a means for preventing a circuit from being damaged by application of unexpected high voltage due to electrostatic discharge or the like.

2. Description of the Related Art

One of major causes of defects in integrated circuits is damage of semiconductor elements, electrodes, or the like due to electrostatic discharge (hereinafter referred to as ESD). Thus, in order to prevent an integrated circuit from being damaged due to ESD, a protection circuit is inserted between a terminal and the integrated circuit. A protection circuit refers to a circuit for preventing overvoltage or overcurrent generated due to ESD from being supplied to an integrated circuit. Typical examples of elements used for protection circuits are resistors, diodes, capacitors, and the like.

For example, in References 1 and 2, a technique by which a diode is formed using a semiconductor layer formed over an insulating film and is used as an element of a protection circuit is disclosed. In Reference 1, a polysilicon lateral diode obtained by forming a PN junction in a polysilicon film in a lateral direction is inserted between a high-frequency input-output signal line and an external power source VDD. In Reference 2, a PIN diode formed using a semiconductor layer is used as a protection element. By providing a floating electrode so that it faces with an i-type layer of the PIN diode, when a gate insulating film is damaged by supply of overcurrent to the element of the protection circuit and is electrically penetrated, a p-type layer (or an n-type layer) of the PIN diode and the floating electrode are short-circuited.

[Reference]

Reference 1: Japanese Published Patent Application No. 2002-100761

Reference 2: Japanese Published Patent Application No. 2006-060191

SUMMARY OF THE INVENTION

However, in Reference 1, the kind of the protection circuit including the lateral diode is limited to a certain kind. Further, the technique disclosed in Reference 2 is not a technique for improving resistance of the circuit itself to ESD but a technique for normally operating the circuit even after the PIN diode is damaged. That is, References 1 and 2 disclose that the performance of protection circuits including diodes formed using semiconductor films is not sufficient.

In view of the foregoing problems, it is an object of an embodiment of the present invention to provide a technique for improving the performance of protection circuits including diodes formed using semiconductor films.

A semiconductor device according to an embodiment of the present invention includes a first terminal, a second terminal, a functional circuit electrically connected to the first terminal and the second terminal, and a protection circuit inserted between the first terminal and the second terminal in order to protect the functional circuit against application of overvoltage. In the embodiment, one protection circuit includes a diode which is formed over an insulating surface and has a semiconductor film where an n-type impurity region and a p-type impurity region are formed, a first insulating film formed over the semiconductor film, a first conductive film which is formed over the first insulating film and is electrically connected to the n-type impurity region through a plurality of first openings formed in the first insulating film, a second conductive film which is formed over the first insulating film and is electrically connected to the p-type impurity region through a plurality of second openings formed in the first insulating film, a second insulating film formed over the first conductive film and the second conductive film, a third conductive film which is formed over the second insulating film and is electrically connected to the first conductive film through a plurality of third openings formed in the second insulating film, and a fourth conductive film which is formed over the second insulating film and is electrically connected to the second conductive film through a plurality of fourth openings formed in the second insulating film. Further, in the embodiment, the third conductive film in the protection circuit is electrically connected to the first terminal, and the fourth conductive film is electrically connected to the second terminal. The plurality of first openings are formed so that a plurality of portions where the n-type impurity region and the first conductive film are electrically connected to each other are distributed over the entire region of the n-type impurity region. The plurality of second openings are formed so that a plurality of portions where the p-type impurity region and the second conductive film are electrically connected to each other are distributed over the entire region of the p-type impurity region. The plurality of third openings are formed so that a plurality of portions where the first conductive film and the third conductive film are electrically connected to each other are provided over the semiconductor film and over part of the first conductive film. The plurality of fourth openings are formed so that a plurality of portions where the second conductive film and the fourth conductive film are electrically connected to each other are provided over the semiconductor film and over part of the second conductive film.

Further, in the above embodiment, each of the first conductive film and the second conductive film can be formed so as to include a portion used for a wiring or an electrode of the functional circuit. Furthermore, in the above embodiment, a high-resistance region can be provided in the semiconductor film of the diode so as to be adjacent to the n-type impurity region and the p-type impurity region. Accordingly, the diode can be a so-called PIN diode. In the above embodiment, the semiconductor film can be formed using a non-single-crystal semiconductor film.

According to an embodiment of the present invention, wiring resistance between a diode and a terminal can be reduced, and the entire semiconductor film of the diode can effectively serve as a rectifier element when ESD occurs. Further, a discharge path can be effectively formed in the semiconductor film included in the diode. Therefore, according to an embodiment of the present invention, the performance of a protection circuit including a diode formed using a semiconductor film can be improved.

BRIEF DESCRIPTION OF THE DRAWINGS

In the accompanying drawings:

FIG. 1 is a block diagram illustrating a structural example of a semiconductor device (Embodiment 1);

FIG. 2A is a plan view illustrating a structural example of a protection circuit in the semiconductor device in FIG. 1, and FIG. 2B is a cross-sectional view taken along section line A1-A2 in FIG. 2A (Embodiment 1);

FIGS. 4A to 4C are block diagrams illustrating structural examples of semiconductor devices (Embodiment 1);

FIG. 5A is a plan view illustrating a structural example of a protection circuit, and FIG. 5B is a layout diagram illustrating a structural example of a semiconductor film and a first conductive film in the protection circuit (Embodiment 2);

FIG. 6A is a plan view illustrating a structural example of a protection circuit, FIG. 6B is a plan view illustrating a structural example of a diode in the protection circuit in FIG. 6A, and FIG. 6C is a layout diagram illustrating a structural example of a semiconductor film and a first conductive film in the protection circuit (Embodiment 3);

FIG. 7A is a plan view illustrating a structural example of a protection circuit, FIG. 7B is a plan view illustrating a structural example of a diode in the protection circuit in FIG. 7A, and FIG. 7C is a layout diagram illustrating a structural example of a semiconductor film and a first conductive film in the protection circuit (Embodiment 3);

FIG. 8A is a plan view illustrating a structural example of a protection circuit, FIG. 8B is a plan view illustrating a structural example of a diode in the protection circuit in FIG. 8A, and FIG. 5C is a layout diagram illustrating a structural example of a semiconductor film and a first conductive film in the protection circuit (Embodiment 3);

FIG. 9A is a plan view illustrating a structural example of a protection circuit, FIG. 9B is a plan view illustrating a structural example of a diode in the protection circuit in FIG. 9A, and FIG. 9C is a layout diagram illustrating a structural example of a semiconductor film and a first conductive film in the protection circuit (Embodiment 4);

FIGS. 15A to 15C are cross-sectional views illustrating an example of a method for manufacturing a photodetector (Embodiment 5);

FIGS. 16A and 16B are cross-sectional views illustrating examples of steps subsequent to FIG. 15C (Embodiment 5);

FIG. 19 is a layout diagram illustrating a structural example of semiconductor films in an amplifier circuit and a protection circuit in the photodetector in FIG. 11 and FIG. 12 (Embodiment 5);

FIG. 20A is a layout diagram illustrating a structural example of a first conductive film in the photodetector, and FIG. 20B is a plan view of a diode in the photodetector (Embodiment 5);

FIG. 24A is a plan view illustrating a structural example of a semiconductor film in an amplifier circuit in the photodetector in FIG. 23, FIG. 24B is a layout diagram illustrating a structural example of a semiconductor Film and a first conductive film in the amplifier circuit, and FIG. 24C is a plan view of a diode in the photodetector in FIG. 23 (Embodiment 6);

FIG. 26 is a layout diagram illustrating a structural example of a power supply terminal in the photodetector (Embodiment 6);

FIGS. 27A to 27G are cross-sectional views illustrating an example of a method for manufacturing an SOI substrate (Embodiment 7);

DETAILED DESCRIPTION OF THE INVENTION

Figure 3A:
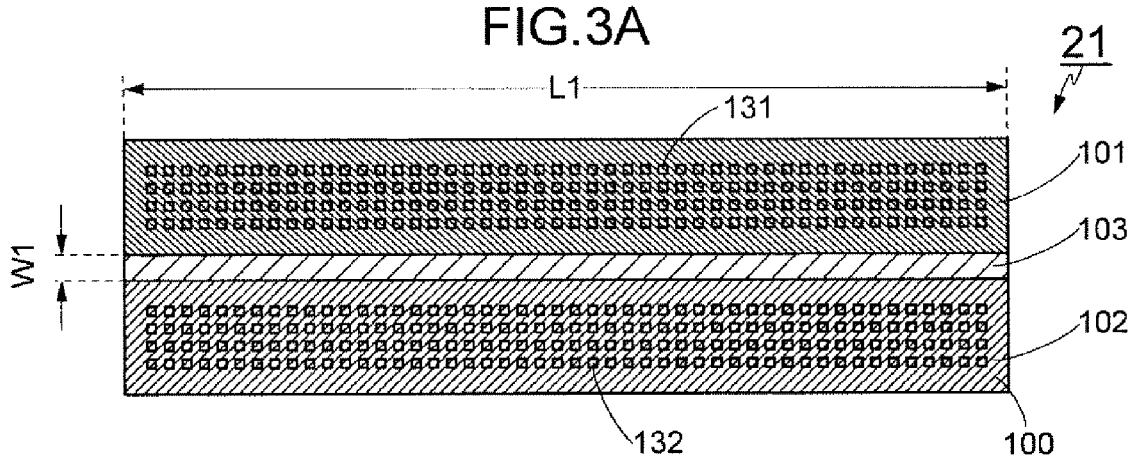
FIG. 3A is a plan view illustrating a structural example of a diode in the protection circuit in FIG. 2A.

The present invention will be described with reference to the drawings. Note that the present invention can be implemented in various different ways and it will be readily appreciated by those skilled in the art that various changes and modifications are possible without departing from the spirit and scope of the present invention, Therefore, the present invention should not be construed as being limited to the following description of embodiments and an example. Further, elements denoted by the same reference numerals in different drawings are the same elements. Therefore, in the following description, description of such elements is not repeated.

(Embodiment 1)

First, a semiconductor device according to this embodiment is described with reference to FIG. 1. FIG. 1 is a block diagram illustrating a structural example of the semiconductor device of this embodiment.

As illustrated in FIG. 1, a semiconductor device 1 of this embodiment includes a circuit 10 including a plurality of semiconductor elements, a first terminal 11, a second terminal 12, and a protection circuit 20. The circuit 10 is electrically connected to the first terminal 11 and the second terminal 12. The first terminal 11 and the second terminal 12 are an output terminal and/or an input terminal of the semiconductor device 1 and are connection portions for connection to a different semiconductor device. For example, each of the first terminal 11 and the second terminal 12 serves as a power supply terminal, a signal output terminal, or a signal input terminal.

The protection circuit 20 is a circuit for preventing overvoltage from being applied to the circuit 10 and for preventing the circuit 10 from being damaged by overvoltage. Here, the protection circuit 20 is inserted between the first terminal 11 and the second terminal 12. When the semiconductor device 1 normally operates, current does not easily flow to the protection circuit 20; however, when unexpected overvoltage is applied to (or overcurrent flows to) the first terminal 11 and/or the second terminal 12, the protection circuit 20 brings the first terminal 11 and the second terminal 12 into conduction (makes the first terminal 11 and the second terminal 12 short-circuited). Thus, overvoltage can be prevented from being applied to (or overcurrent can be prevented from flowing to) the circuit 10, so that the circuit 10 can be prevented from being damaged. The protection circuit 20 of this embodiment includes at least one diode 21. The diode 21 is electrically connected to the first terminal 11 and the second terminal 12. It is an object of an embodiment of the present invention to improve the electrical connection structure between the diode 21 included in the protection circuit 20, and the first terminal 11 and the second terminal 12. With the protection circuit 20, resistance of the circuit 10 to ESD is improved.

Figure 3B:
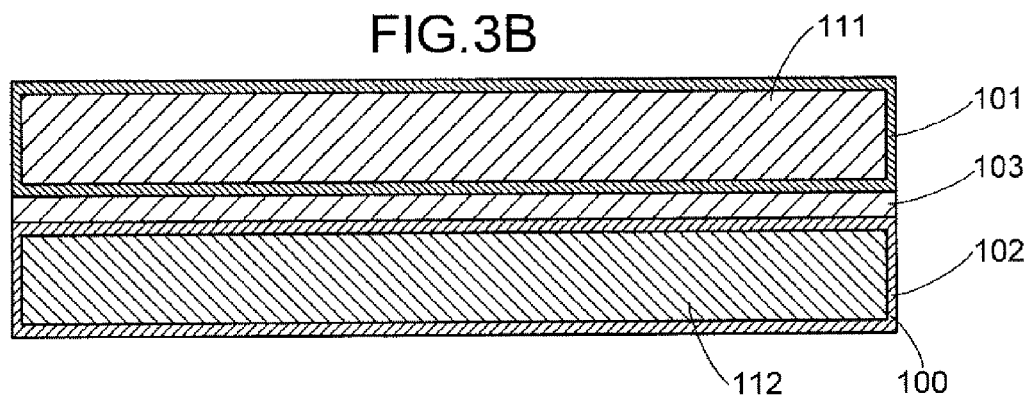
FIG. 3B is a layout diagram illustrating a structural example of a semiconductor film and a first conductive film in the protection circuit in FIG. 2A (Embodiment 1)

The specific structure of the protection circuit 20 is described below with reference to FIG. 2A, FIG. 2B, FIG. 3A, and FIG. 3B. FIG. 2A is a plan view of the protection circuit 20. FIG. 2B is a cross-sectional view in FIG. 2A. FIG. 2B is a cross-sectional view taken along section line A1-A2 in FIG. 2A. FIG. 3A is a plan view of the diode 21. FIG. 3B is a layout diagram of a semiconductor film and a first conductive film in the protection circuit 20. The diode 21 included in the protection circuit 20 of this embodiment is formed using a semiconductor film formed over an insulating surface. Here, a PIN diode is used as the diode 21.

First, the layered structure of the protection circuit 20 is described with reference to FIG. 2B. The semiconductor device 1 of this embodiment includes a substrate 50. The circuit 10 and the protection circuit 20 are formed over the substrate 50. A substrate such as a semiconductor substrate, a glass substrate, a quartz substrate, a sapphire substrate, a ceramic substrate, a stainless steel substrate, a metal substrate, a resin substrate, a resin film, or a sheet in which fabric of carbon fiber or glass fiber is impregnated with resin (e.g., a so-called prepreg) can be used for the substrate 50. A non-alkali glass substrate is preferably used as a glass substrate. As a non-alkali glass substrate, for example, an aluminosilicate glass substrate, an aluminoborosilicate glass substrate, a barium borosilicate glass substrate, or the like can be used.

A top surface of the substrate 50 is covered with an insulating film 51. A semiconductor film 100 included in the diode 21 is formed over the insulating film 51. Although not illustrated in FIG. 2B, a semiconductor film of a semiconductor element included in the circuit 10 is also formed over the insulating film 51. A different film such as a semiconductor film or a conductive film may be formed between the substrate 50 and the insulating film 51. As the semiconductor film 100, a semiconductor film which is formed in the same step as the semiconductor film of the semiconductor element can be used.

The semiconductor film 100 may have either a single-layer structure or a layered structure. A semiconductor film containing an element belonging to Group 14, such as a silicon film, a germanium film, a silicon germanium film, or a silicon carbide film; a compound semiconductor film such as a CaAs film, an InP film, or a GaN film; an oxide semiconductor film containing zinc oxide or tin oxide; or the like can be used as the semiconductor film 100. The crystallinity of the semiconductor film 100 may be either single crystal or non-single-crystal (e.g., polycrystalline, microcrystalline, or amorphous). However, in order to reduce the resistance of a p-type impurity region 102 and an n-type impurity region 101, it is preferable to use not an amorphous semiconductor film but a crystalline semiconductor film such as a polycrystalline semiconductor film or a single crystal semiconductor film.

An insulating film 52 is formed so as to cover an upper portion of the semiconductor film 100. A conductive film 111 and a conductive film 112 are formed over the insulating film 52. The conductive films 111 and 112 are used for a first electrode (or wiring) of the protection circuit 20. Each of the conductive film 111 and the conductive film 112 is electrically connected to the semiconductor film 100 through a plurality of openings formed in the insulating film 52.

An insulating film 53 is formed so as to cover upper portions of the conductive films 111 and 112. A conductive film 121 and a conductive film 122 are formed over the insulating film 53. The conductive films 121 and 122 are used for a second electrode (or wiring) of the protection circuit 20. Through a plurality of openings formed in the insulating film 53, the conductive film 121 is electrically connected to the conductive film 111, and the conductive film 122 is electrically connected to the conductive film 112.

An insulating film 54 is formed so as to cover upper portions of the conductive films 121 and 122. Through one or more openings formed in the insulating film 54 (not illustrated), the conductive film 121 is electrically connected to the first terminal 11, and the conductive film 122 is electrically connected to the second terminal 12. With such a structure, the diode 21 which is inserted between the first terminal 11 and the second terminal 12 can be provided in the protection circuit 20.

The insulating films 51 to 54 may each have either a single-layer structure or a layered structure. An insulating film containing silicon and/or germanium as its component, such as a silicon oxide film, a silicon nitride film, a silicon oxynitride film, a silicon nitride oxide film, a germanium oxide film, a germanium nitride film, a germanium oxynitride film, or a germanium nitride oxide film can be used as each of the insulating films 51 to 54. Alternatively, an insulating film containing a metal oxide such as aluminum oxide, tantalum oxide, or hafnium oxide; an insulating film containing a metal nitride such as aluminum nitride; an insulating film containing a metal oxynitride, such as an aluminum oxynitride film; or an insulating film containing a metal nitride oxide, such as an aluminum nitride oxide film, can be used. Alternatively, an insulating film containing an organic compound can be used. Examples of such an organic compound are acrylic, polyimide, polyamide, polyimide amide, benzocyclobutene, and the like.

Typical examples of a method for forming such insulating films are as follows: chemical vapor deposition (CVD) such as plasma-enhanced CVD (PECVD) or thermal CVD; physical vapor deposition (PVD) such as sputtering or vapor deposition; atomic layer deposition (ALD); a method for forming a film by using a liquid material or a pasty material, such as a spin coating method, a droplet discharge method, or a dip coating method; solid-phase oxidation using plasma, heat, or the like; solid-phase nitriding using plasma, heat, or the like; and the like.

Note that in this specification, oxynitride refers to a substance which contains much oxygen than nitrogen, and nitride oxide refers to a substance which contains much nitrogen than oxygen.

Further, the conductive films 111, 112, 121, and 122 may each have a single-layer structure or a layered structure. For example, a metal film containing a simple metal selected from tantalum, tungsten, titanium, molybdenum, aluminum, chromium, niobium, gold, silver, copper, platinum, or the like as its main component; an alloy film containing the above metal as its main component; a metal compound film of the above metal its main component; or the like can be used as each of the conductive films 111, 112, 121, and 122. For example, as the metal film, a copper film, or an aluminum film to which silicon (Si) or the like is added can be used. As the alloy film, an aluminum-copper alloy film or an aluminum-neodymium alloy film can be used. As the metal compound film, a metal nitride film such as a titanium nitride film or a tungsten nitride film, or a silicide film such as a nickel silicide film or a cobalt silicide film can be used. Such conductive films can be formed by PVD such as sputtering or vapor deposition; a method for forming a film by using a liquid material or a pasty material, such as a printing method, a droplet discharge method, or a dip coating method; soldering; a plating method; or the like.

Next, the layout of the semiconductor film 100 and the conductive films 111, 112, 121, and 122 which are included in the protection circuit 20 is described with reference to FIG. 2A, FIG. 3A, and FIG. 3B. Further, in this embodiment, a PIN diode is used as the diode 21. Thus, in order to form a so-called PIN junction in the semiconductor film 100, an n-type semiconductor region and a p-type semiconductor region are not stacked over an insulating surface but are formed adjacent to each other in a direction parallel to a top surface of the insulating film 51.

As illustrated in FIG. 3A, the planar shape of the semiconductor film 100 is a rectangle. In the semiconductor film 100, the n-type impurity region 101 and the p-type impurity region 102 are formed adjacent to each other in a direction lateral to a surface (an insulating surface) of the insulating film 51. Further, in the semiconductor film 100, a high-resistance region 103 is formed between the n-type impurity region 101 and the p-type impurity region 102.

The n-type impurity region 101 is formed by adding an impurity element which serves as a donor, such as phosphorus or arsenic, to the semiconductor film 100. The p-type impurity region 102 is formed by adding an impurity element which serves as an acceptor, such as boron, to the semiconductor film 100. The n-type impurity region 101 is formed adjacent to the p-type impurity region 102 with a space W1 interposed therebetween.

The high-resistance region 103 has higher resistance than the p-type impurity region 102 and the n-type impurity region 101. When the high-resistance region 103 is formed, the amount of leakage current of the diode 21 can be suppressed. The high-resistance region 103 can be formed using an intrinsic semiconductor (an i-type semiconductor), for example. Ideally, an intrinsic semiconductor refers to a semiconductor whose Fermi level is positioned substantially in the center of a forbidden band; however, here, the intrinsic semiconductor also refers to a semiconductor whose Fermi level is positioned in the center of the forbidden band by intentionally adding an impurity which serves as a donor or an acceptor to the intrinsic semiconductor. Alternatively, the high-resistance region 103 can be formed using an n-type or p-type semiconductor. For example, the high-resistance region 103 can be formed using a semiconductor to which an impurity element which serves as a donor or an acceptor is added, or a non-doped semiconductor to which such an impurity element is not added intentionally. The sheet resistance of the high-resistance region 103 is preferably higher than or equal to 100 kilo-ohm/square. The sheet resistance of each of the p-type impurity region 102 and the n-type impurity region 101 is preferably lower than or equal to several kilo-ohm/square.

In the case where the semiconductor film 100 is a non-single-crystal semiconductor film (typically a polycrystalline silicon film), the width W1 of the high-resistance region 103 is preferably approximately 2 to 10 μm so that the high-resistance region 103 reduces the amount of leakage current in normal operation and serves as a path for supplying electric charge when ESD occurs. For example, in the case of prioritizing the function of the diode 21 as a protection circuit, the width W1 is preferably greater than or equal to 2 μm and less than or equal to 4 μm. Alternatively, in the case of prioritizing reduction in the amount of leakage current from the diode 21, the width W1 is preferably greater than or equal to 8 μm and less than or equal to 10 μm. Further, in the case where the semiconductor film 100 is a non-single-crystal semiconductor film (typically a polycrystalline silicon film), in the layout, the length L1 where the high-resistance region 103 is bonded to the n-type impurity region 101 (or the p-type impurity region 102) is preferably greater than or equal to 1000 μm. For example, the length L1 can be greater than or equal to 2000 μm and less than or equal to 4000 μm.

Note that in the following description, the width of the high-resistance region 103 (the distance between the n-type impurity region 101 and the p-type impurity region 102) is referred to as "I-layer width" for convenience, and in the layout, the length where the high-resistance region 103 is bonded to the n-type impurity region 1001 (or the p-type impurity region 102) is referred to as "bond length" for convenience.

FIG. 3A illustrates a plurality of openings 131 which are formed in the insulating film 52 and serve as portions where the n-type impurity region 101 and the conductive film 111 are electrically connected to each other. In this embodiment, in order to reduce contact resistance between the n-type impurity region 101 and the conductive film 111 as much as possible, the plurality of openings 131 are formed so as to be distributed over the entire n-type impurity region 101 (a region where the conductive film 111 is formed), as illustrated in FIG. 3A. In a similar manner, in order to reduce contact resistance between the p-type impurity region 102 and the conductive film 112, a plurality of openings 132 are formed in the insulating film 52 so as to be distributed over the entire p-type impurity region 102 (a region where the conductive film 112 is formed).

As illustrated in FIG. 3B, the conductive film 111 is formed so as to overlap with the n-type impurity region 101. With such a structure, the conductive film 111 is in close contact with the n-type impurity region 101 through the plurality of openings 131. In a similar manner, since the conductive film 112 is formed so as to overlap with the p-type impurity region 102, the conductive film 112 is in close contact with the p-type impurity region 102 through the plurality of openings 132. That is, the first conductive films 111 and 112 serve as electrodes for electrically connecting the n-type impurity region 101 and the p-type impurity region 102 to the first terminal 11 and the second terminal 12.

It is extremely effective to form the plurality of openings 131 and the plurality of openings 132 in the insulating film 52 in this manner in the case of forming the diode 21 by using a thin-film-like non-single-crystal semiconductor. The reason for this call be understood when the case where the sheet resistance of each of the n-type impurity region 101 and the p-type impurity region 102 is comparatively high is assumed. In such a case, when unexpected overvoltage is applied to the first terminal II or the second terminal 12 due to ESD or the like, there is a possibility that portions where the n-type impurity region 101 and the p-type impurity region 102 are not in close contact with the conductive films 111 and 112 cannot serve as the diode substantially. In such a condition, the diode 21 does not serve as a rectifier element but simply serves as a resistor. That is, since the diode 21 does not serve as a discharge path sufficiently when ESD occurs, overcurrent flows to the circuit 10, so that the circuit 10 is damaged.

Accordingly, it is extremely effective to form the plurality of openings 131 and the plurality of openings 132 in the insulating film 52 as illustrated in FIG. 3A so that the contact resistance between the n-type impurity region 101 and the conductive film 111 and the contact resistance between the p-type impurity region 102 and the conductive film 112 are reduced in the case where the semiconductor film 100 is formed using a non-single-crystal film such as a polycrystalline semiconductor film (typically a polycrystalline silicon film).

Further, in the present invention, portions where the first conductive films 111 and 112 and the second conductive films 121 and 122 in the protection circuit 20 are connected to each other are formed so that the entire semiconductor film 100 effectively serves as a rectifier element. FIG. 2A illustrates the layout of the second conductive films 121 and 122. As illustrated in FIG. 2A, the conductive film 121 has portions overlapping with the n-type impurity region 101 and the conductive film 111 like the case where a plurality of connection portions 141A for connection to the conductive film 111 are provided above the n-type impurity region 101. A portion 121a of the conductive film 121, which does not overlap with the semiconductor film 100, is an electrical connection portion for connection to the first terminal 11. Further, the conductive film 122 has an electrical connection portion for connection to the second terminal 12 in a portion 122a which does not overlap with the semiconductor film 100, in a manner similar to that of the conductive film 121. Furthermore, the conductive film 122 has portions overlapping with the p-type impurity region 102 and the conductive film 112 like the case where a plurality of connection portions 142A for connection to the conductive film 112 are provided above the p-type impurity region 102.

The connection portion 141A includes one or more openings 141 formed in the insulating film 53. Further, in a manner similar to that of the connection portion 141A, the connection portion 142A includes one or more openings 142 formed in the insulating film 53. Here, four openings 141 are provided in the connection portion 141A, and four openings 142 are provided in the connection portion 142A. Note that in the case where the plurality of openings 141 are provided in one connection portion 141A, the distance between two adjacent openings 141 is three times or less the size of one opening 141 (the diameter of a circumscribed circle of one opening 141). In the case where the distance between two openings 141 is greater than three times the size of one opening 141, the two openings 141 are regarded as different connection portions 141A The same can be said for the connection portion 142A.

By forming the second conductive films 121 and 122 so as to overlap with the first conductive films 111 and 112 over the semiconductor film 100 and by dispersively forming the plurality of connection portions 141A and the plurality of connection portions 142A over the semiconductor film 100 as illustrated in FIG. 2A, the entire semiconductor film 100 can effectively serve as a rectifier element when ESD occurs. In order to prevent overvoltage generated due to ESD from being applied to the circuit 10, it is extremely important to apply overvoltage to the entire n-type impurity region 101 and the entire p-type impurity region 102 dispersively. Thus, when ESD occurs, overvoltage is applied to the conductive films 121 and 122 which are upper layers. Therefore, in order to dispersively apply the overvoltage to the conductive films 111 and 112 which are lower layers, a plurality of portions where the second conductive films 121 and 122 and the first conductive films 111 and 112 are provided in regions overlapping with the semiconductor film 100, as described above.

In addition, it is effective to dispersively provide the plurality of connection portions. The reason for this can be understood when the case where the openings 141 and 142 are entirely formed in portions of the insulating film 53, which overlap with the first conductive films, is assumed, like the openings 131 and 132 formed in the insulating film 52. In such a case, the bond length of the diode 21 is shorter than the bond length L1 in design. Accordingly, it is impossible to supply a large amount of electric charge, so that the diode 21 itself tends to be damaged easily.

That is, in the protection circuit 20 of this embodiment, by providing the portion where the first conductive film and the diode are connected to each other so as to be distributed in the entire n-type impurity region or the p-type impurity region and by dispersively forming the portions where the second conductive film and the first conductive film are connected to each other in the first conductive film (n-type impurity region or the p-type impurity region), the diode (the semiconductor film) is electrically connected to the first terminal 11 and the second terminal 12. With such a structure, the entire semiconductor film 100 can effectively serve as a rectifier element. Further, resistance of the diode 21 to ESD can be improved. Therefore, when ESD occurs, the diode 21 can effectively serve as a current path for discharging excessive electric charge. Thus, with the protection circuit 20, resistance of the semiconductor device 1 to ESD can be improved.

As described above, according to this embodiment, a high-performance protection circuit can be manufactured by using a diode formed using a non-single-crystal semiconductor film as a rectifier element of the protection circuit Further, according to this embodiment, a high-performance protection circuit can be manufactured by using a diode in which the length of a portion where a high-resistance region and an n-type impurity region (or a p-type impurity region) are bonded to each other is greater than or equal to 1000 μm as a rectifier element of the protection circuit. Thus, by using the protection circuit of this embodiment, a semiconductor device which includes TFTs and has high resistance to ESD can be provided. Needless to say, in the protection circuit of this embodiment, there is no particular limitation on the usage of connected terminals.

Note that although the protection circuit of this embodiment is a circuit which includes at least one diode, the protection circuit of this embodiment may include two or more diodes or may include a different element. FIGS. 4A to 4C are block diagrams of semiconductor devices 2 to 4 which include the protection circuit and has structures which are different from the structure in FIG. 1. For example, as the semiconductor device 2 in FIG. 4A, two diodes 21 may be inserted in parallel between the first terminal 11 and the second terminal 12. Alternatively, as the semiconductor device 3 in FIG. 4B, the plurality of diodes 21 which are connected in series with each other may be inserted between the first terminal 11 and the second terminal 12. Alternatively, the semiconductor device may include three or more terminals. For example, as illustrated in FIG. 4C, a third terminal 13 which is electrically connected to the circuit 10 can be provided in the semiconductor device 4. In the semiconductor device 4, the protection circuit 20 including the diode 21 is preferably inserted between the terminals 11 to 13.

This embodiment can be combined with any of the other embodiments as appropriate.

(Embodiment 2)

In this embodiment, different structural examples of the first conductive films 111 and 112 in the protection circuit 20

(see FIG. 2A) are described. The first conductive films 111 and 112 can be formed using a conductive film which is the same as a conductive film used for an internal wiring (or an internal electrode) of the circuit 10. FIG. 5A is a plan view of a protection circuit including such conductive films. Here, in order to distinguish this protection circuit from the protection circuit 20 in FIG. 2A, this protection circuit is referred to as a protection circuit 25. Needless to say, the protection circuit 25 can be used as the protection circuit 20 in FIG. 1 and FIGS. 4A to 4C. Further, the layered structure of the protection circuit 25 is similar to the layered structure of the protection circuit 20 (see FIG. 1).

FIG. 5B is a layout diagram of a semiconductor film and a first conductive film in the protection circuit 25. As illustrated in FIG. 5B, a first conductive film 113 in the protection circuit 25 includes an electrode portion 113a which serves as an electrode of the diode 21, a connection portion 113b for connection to the second conductive film 121, and a wiring portion 113c used for the internal wiring of the circuit 10. That is, with the conductive film 113, the electrode which is connected to the semiconductor film 100 in the protection circuit 25 and the internal wiring of the circuit 10 are formed. Further, in a manner similar to that of the conductive film 113, a first conductive film 114 is used for an electrode connected to the semiconductor film 100 and the internal wiring of the circuit 10 and includes an electrode portion 114a, a connection portion 114b, and a wiring portion 114c.

Further, as illustrated in FIG. 5A, the connection portion 113b of the conductive film 113 is electrically connected to the second conductive film 121 through a plurality of openings 143 formed in the insulating film 53. With such a structure, the diode 21 and the circuit 10 are electrically connected to the first terminal 11. The connection portion 114b of the conductive film 114 is electrically connected to the second conductive film 122 through a plurality of openings 144 formed in the insulating film 53. With such a structure, the diode 21 and the circuit 10 are electrically connected to the second terminal 12. Therefore, in the protection circuit 25, resistance between the electrode portions 113a and 114a of the diode 21, and the first terminal 11 and the second terminal 12 can be made lower than that in the protection circuit 20.

This embodiment can be combined with any of the other embodiments as appropriate.

(Embodiment 3)

In this embodiment, a technique for increasing the bond length of a diode without increasing the size of a semiconductor film used for the diode is described. In this embodiment, three structural examples of protection circuits are described with reference to FIGS. 6A to 6C, FIGS. 7A to 7C, and FIGS. 5A to 8C. Here, in order to distinguish the protection circuits in the three structural examples described in this embodiment from the protection circuit 20 (FIGS. 2A and 2B) and the protection circuit 25 (FIG. 5A), these protection circuits are referred to as protection circuits 31 to 33. Diodes which are used in the protection circuits 31 to 33 are referred to as diodes 41 to 43.

In addition, in this embodiment, an example is described in which a conductive film including a portion which serves as the internal wiring of the circuit 10 is used as a first conductive film in each of the protection circuits 31 to 33, in a manner similar to that of the protection circuit 25 in FIG. 5A. Needless to say, like the protection circuit 20 in FIG. 2A, the first conductive film in each of the protection circuits 31 to 33 can be a conductive film which is different from the conductive film used for the internal wiring of the circuit 10. Furthers the layered structure of each of the protection circuits 31 to 33 is similar to that of the protection circuit 20 (see FIG. 2B). Note that in the drawings used for illustrating the protection circuits 31 to 33 (FIGS. 6A to 6C, FIGS. 7A to 7C, and FIGS. 8A to 8C), reference numerals which are the same as the protection circuits 20 and 25 are used, and the description in Embodiments 1 and 2 is incorporated in the description of elements denoted by the same reference numerals.

STRUCTURAL EXAMPLE 1

The structure of the protection circuit 31 is described with reference to FIGS. 6A to 6C. FIG. 6A is a plan view of the protection circuit 31. FIG. 6B is a plan view of the diode 41. In FIG. 6B, the openings 131 and 132 formed in the insulating film 52 are also illustrated. FIG. 6C is a layout diagram of a semiconductor film and a first conductive film in the protection circuit 31.

As illustrated in FIG. 6B, like the diode 21, the diode 41 includes the rectangular semiconductor film 100. In the semiconductor film 100, the n-type impurity region 101, the p-type impurity region 102, and the high-resistance region 103 are provided adjacent to each other in a lateral direction. The diode 21 and the diode 41 are different from each other on the following point. In the diode 21, the portion where the n-type impurity region 101 and the high-resistance region 103 are connected to each other and the portion where the p-type impurity region 102 and the high-resistance region 103 are connected to each other are straight in the layout; in the diode 41, each connection portion is bent into a square wave (meanderingly). By forming the n-type impurity region 101 and the p-type impurity region 102 in this manner, the bond length of the diode 41 can be made larger than the length of the long side of the semiconductor film 100.

The high-resistance region 103 is formed between the n-type impurity region 101 and the p-type impurity region 102, and the planar shape of the high-resistance region 103 is meandering. On the other hand, the planar shapes of the n-type impurity region 101 and the p-type impurity region 102 are comb shapes where a plurality of L-shaped regions are connected to each other. In addition, a projecting portion of the p-type impurity region 102 is provided so as to fit into a depressed portion of the n-type impurity region 101, and the n-type impurity region 101 and the p-type impurity region 102 are formed adjacent to each other with a predetermined interval provided therebetween.

STRUCTURAL EXAMPLE 2

The structure of the protection circuit 32 is described with reference to FIGS. 7A to 7C. FIG. 7A is a plan view of the protection circuit 32. FIG. 7B is a plan view of the diode 42. In FIG. 7B, the openings 131 and 132 formed in the insulating film 52 are also illustrated. FIG. 7C is a layout diagram of a semiconductor film and a first conductive film in the protection circuit 32.

As illustrated in FIG. 7B, like the diode 21, the diode 42 includes the rectangular semiconductor film 100. In the semiconductor film 100, the n-type impurity region 101 and the p-type impurity region 102 are provided adjacent to each other with a predetermined interval provided therebetween. Further, in the semiconductor film 100, the high-resistance region 103 is formed between and adjacent to the n-type impurity region 101 and the p-type impurity region 102.

The p-type impurity region 102 includes an end portion of the semiconductor film 100 and is provided in the center portion of the semiconductor film 100. The planar shape of the p-type impurity region 102 is a double comb shape where a plurality of T-shaped regions are connected to each other.

The n-type impurity region 101 includes an end portion of the semiconductor film 100 and is formed so as to surround the p-type impurity region 102. A side of the n-type impurity region 101, which is adjacent to the p-type impurity region 102, is comb-shaped (uneven) where a plurality of L-shaped regions are connected to each other. The n-type impurity region 101 includes a projecting portion which fits into a depressed portion of the p-type impurity region 102. By forming the n-type impurity region 101 and the p-type impurity region 102 in this manner, the bond length of the diode 42 can be made larger than the length of the long side of the semiconductor film 100. Note that the n-type impurity region 101 and the p-type impurity region 102 can be switched from each other.

STRUCTURAL EXAMPLE 3

The structure of the protection circuit 33 is described with reference to FIGS. 5A to 5C. FIG. 8A is a plan view of the protection circuit 33, FIG. 8B is a plan view of the diode 43. In FIG. 5B, the openings 131 and 132 formed in the insulating film 52 are also illustrated. FIG. 5C is a layout diagram of a semiconductor film and a first conductive film in the protection circuit 33.

As illustrated in FIG. 8B, like the diode 21, the diode 43 includes the rectangular semiconductor film 100. In the semiconductor film 100, the n-type impurity region 101 and the p-type impurity region 102 are provided adjacent to each other with a predetermined interval provided therebetween. Further, in the semiconductor film 100, the high-resistance region 103 is formed between and adjacent to the n-type impurity region 101 and the p-type impurity region 102.

Unlike the diode 42, in the diode 43, the p-type impurity region 102 does not include an end portion of the semiconductor film 100 and a peripheral portion of the p-type impurity region 102 is surrounded by the high-resistance region 103 and the n-type impurity region 101. The planar shape of the p-type impurity region 102 is a double comb shape where a plurality of T-shaped regions are connected to each other. A side of the n-type impurity region 101, which is adjacent to the p-type impurity region 102, is comb-shaped (uneven) where a plurality of L-shaped regions are connected to each other. The n-type impurity region 101 includes a projecting portion which fits into a depressed portion of the p-type impurity region 102. By forming the n-type impurity region 101 and the p-type impurity region 102 in this manner, the bond length of the diode 43 can be made larger than the length of the long side of the semiconductor film 100. Note that the n-type impurity region 101 and the p-type impurity region 102 can be switched from each other.

A conductive film 116 illustrated in FIG. 8C is a conductive film which is formed in the same layer where the first conductive films 113 and 114 in the protection circuit 33 are formed and is used for the internal wiring of the circuit 10. An end portion 116a of the conductive film 116 is electrically connected to the second conductive film 122 through openings 146 formed in the insulating film 53 (see FIGS. 8A and 8B).

(Embodiment 4)

In the diode 21 of Embodiment 1, one n-type impurity region 101 and one p-type impurity region 102 are formed in the semiconductor film 100; however, one of the regions can be divided into a plurality of regions. In such a case, since the impurity region is divided, it is not necessary to dispersively provide a plurality of portions where the second conductive film and the first conductive film are connected to each other with respect to the divided one impurity region. In this embodiment, a protection circuit 34 for which a diode 44 having such a structure is used is described. Note that the layered structure of the protection circuit 34 is similar to that of the protection circuit 20 (see FIG. 213).

The structure of the protection circuit 34 is described with reference to FIGS. 9A to 9C. FIG. 9A is a plan view of the protection circuit 34, FIG. 9B is a plan view of the diode 44. In FIG. 9B, the openings 131 and 132 formed in the insulating film 52 are also illustrated. FIG. 9C is a layout diagram of a semiconductor film and a first conductive film in the protection circuit 34.

As illustrated in FIG. 9B, like the diode 21, the diode 44 includes the rectangular semiconductor film 100. The plurality of p-type impurity regions 102 are formed in the semiconductor film 100. Further, in the semiconductor film 100, the n-type impurity region 101 is formed so as to be away from each of the p-type impurity regions 102 at a predetermined distance and to surround each of the p-type impurity regions 102. In other words, in the layout, the plurality of island-shaped p-type impurity regions 102 are provided inside the n-type impurity region 101. Further, in the semiconductor film 100, the plurality of high-resistance region 103 are formed so as to surround the plurality of p-type impurity regions 102.

Here, although the planar shape of the p-type impurity region 102 is a rectangular the planar shape of the p-type impurity region 102 may be a shape like the shape of the p-type impurity region 102 in FIG. 8B and the n-type impurity region 10 and the high-resistance region 103 may be formed in accordance with this shape. Further, the n-type impurity region 101 and the p-type impurity region 102 can be switched from each other.

As illustrated in FIG. 9C, in the protection circuit 34, the plurality of conductive films 112 are formed corresponding to the plurality of p-type impurity regions 102. Since the first conductive film is formed using the plurality of conductive films 112, the number of the connection portions 142A with respect to each of the conductive films 112 may be either plural or singular. In FIG. 9A, one connection portion 142A is formed with respect to the conductive films 112 on a right side and in the center, and two connection portions 142A are formed with respect to the conductive film 112 on a left side. Note that like the protection circuit 33 (see FIG. 8C), the conductive film 116 illustrated in FIG. 9C is a conductive film used for an internal wiring (or electrode) of the circuit 10.

This embodiment can be combined with any of the other embodiments as appropriate.

(Embodiment 5)

Figure 10:
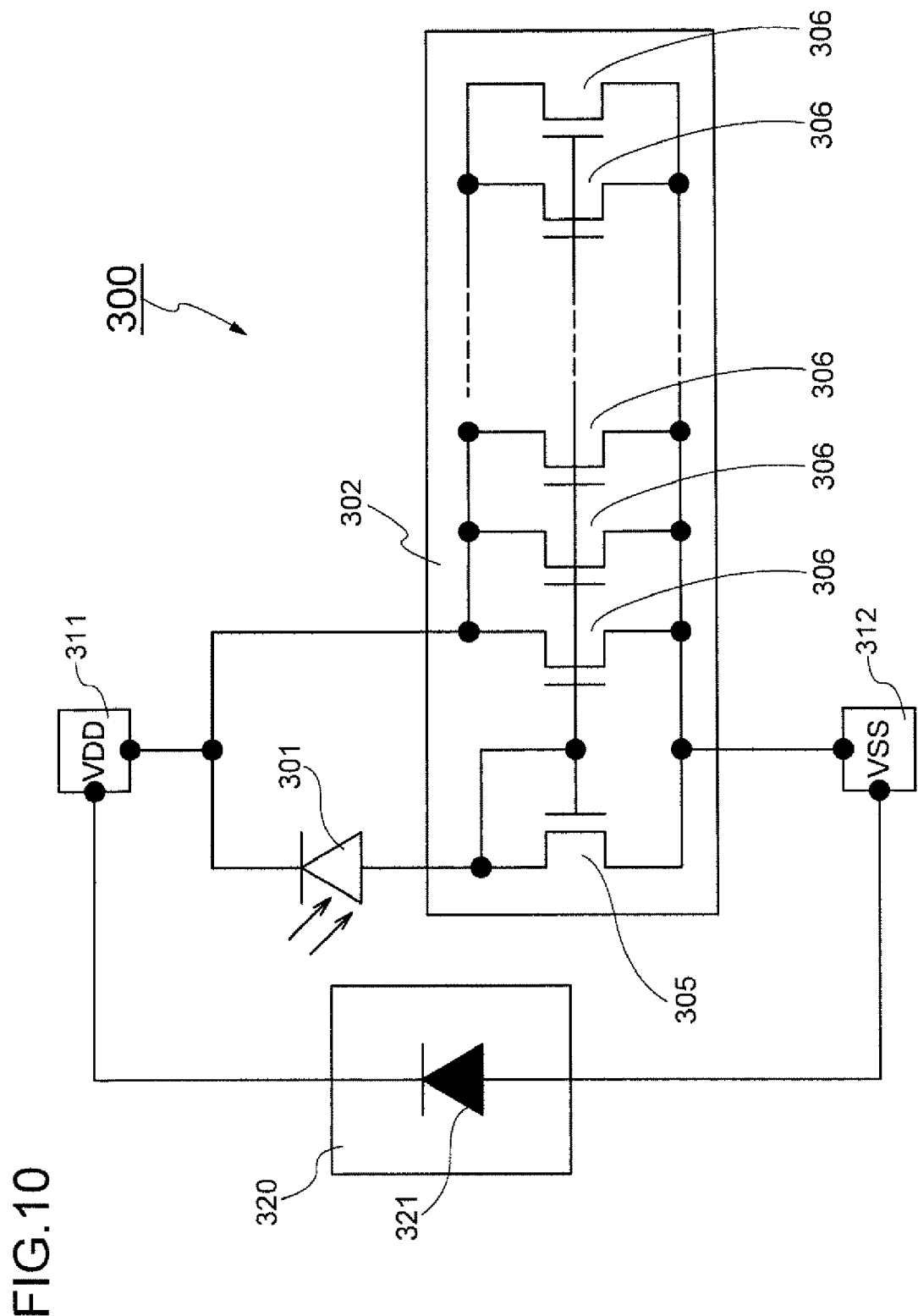
FIG. 10 is a circuit diagram illustrating a structural example of a photodetector (Embodiment 5)
Figure 11:
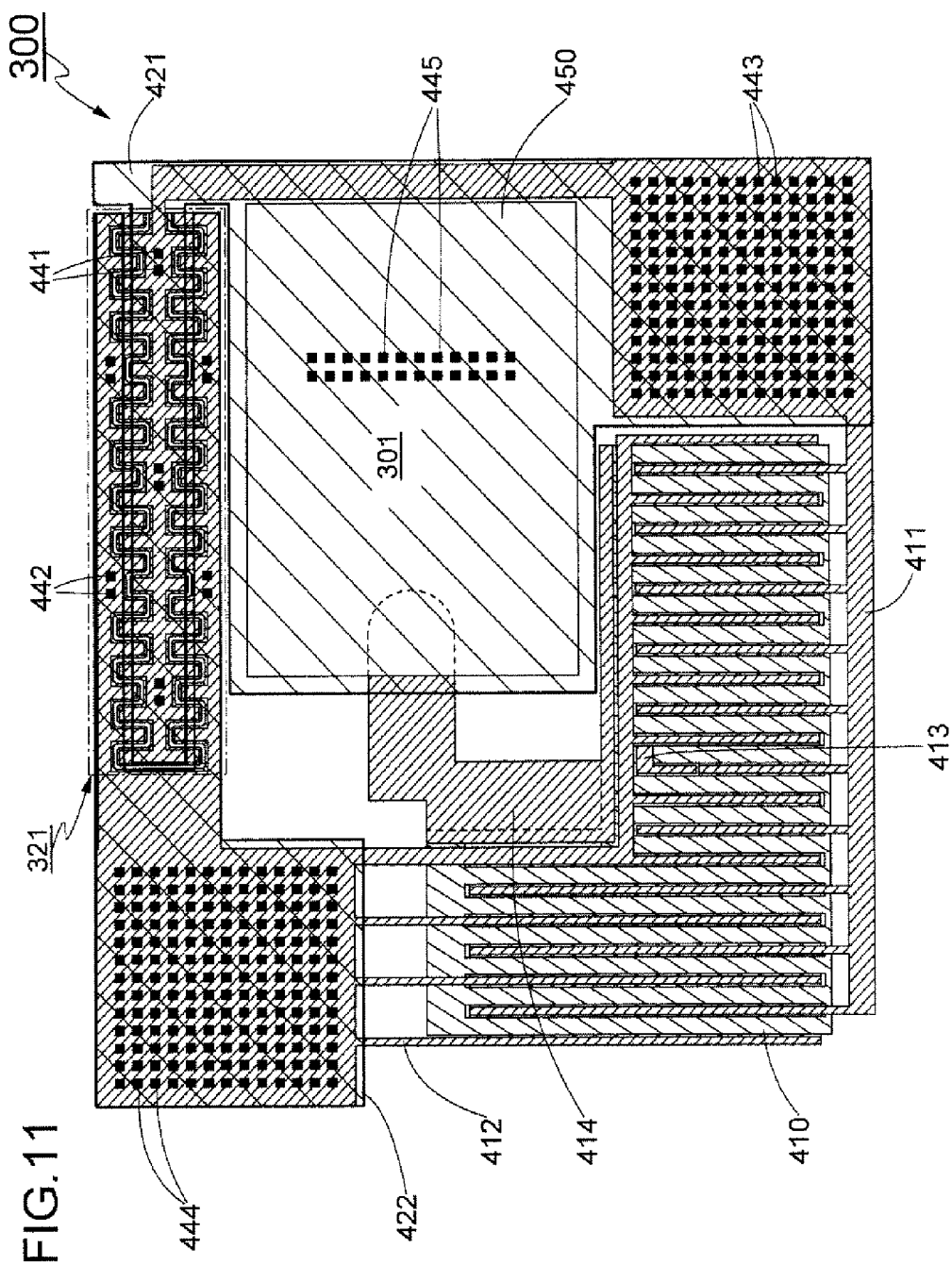
FIG. 11 is a layout diagram illustrating a structural example of the photodetector in FIG. 10 (Embodiment 5)
Figure 12:
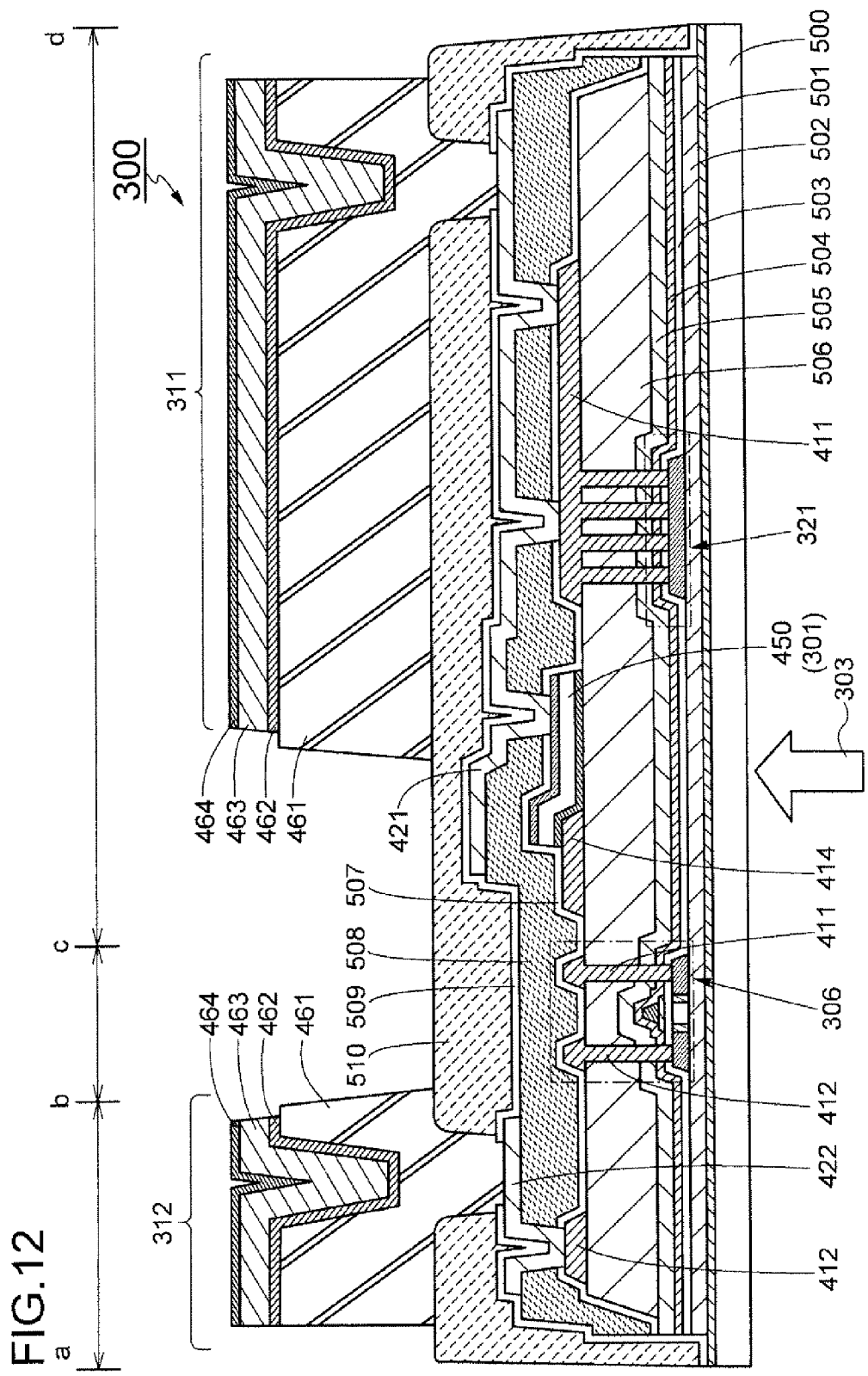
FIG. 12 is a cross-sectional view illustrating an example of a layered structure of the photodetector in FIG. 10 (Embodiment 5)

In this embodiment, a photodetector is described as a specific example of a semiconductor device including a protection circuit. First, the structure of the photodetector is described with reference to FIG. 10, FIG. 11, and FIG. 12. FIG. 10 is a circuit diagram of a photodetector of this embodiment. FIG. 11 is a plan view illustrating the layout of the photodetector. FIG. 12 is a cross-sectional view illustrating the layered structure of the photodetector.

As illustrated in FIG. 10, a photodetector 300 of this embodiment includes a photodiode 301, an amplifier circuit 302, a power supply terminal 311 to which a high power supply potential VDD is applied, a power supply terminal 312 to which a low power supply potential VSS is applied, and a protection circuit 320. In the photodetector 300, a potential of the power supply terminal 312 can be a ground potential GND.

The photodiode 301 is a photoelectric conversion element for converting received light into electrical signals. Instead of the photodiode 301, a phototransistor may be provided as a photoelectric conversion element. The amplifier circuit 302 is a circuit for amplifying the output of the photodiode 301. Here, the amplifier circuit 302 is formed using a current mirror circuit. The current mirror circuit includes one transistor 305, and a plurality of transistor 306 connected in parallel to each other. The amplification factor of current flowing to the transistor 305 can be adjusted in accordance with the number of the transistors 306. For example, in order to amplify the output of the photodiode 301 100-fold, for example, ninety-nine transistors 306 are connected in parallel with respect to one transistor 305.

In this embodiment, the transistor 305 and the transistors 306 in the amplifier circuit 302 are both n-channel transistors. Each of sources of the transistor 305 and the plurality of transistors 306 is electrically connected to the power supply terminal 312. A drain of the transistor 305 is electrically connected to an anode of the photodiode 301. Each of drains of the plurality of transistors 306 is electrically connected to the power supply terminal 311. Note that the transistor 305 and the transistors 306 can be both p-channel transistors.

In addition, instead of the amplifier circuit 302, an attenuation circuit which attenuates the output current of the photodiode 301 may be provided. The attenuation circuit can be formed using a current mirror circuit. In such a current mirror circuit, the number of the transistors 305 is made larger than the number of the transistors 306. For example, in order to attenuate the output of the photodiode 301 hundredth, one transistor 306 is provided with respect to hundred transistors 305 connected in parallel.

The protection circuit 320 includes a diode 321. The diode 321 is inserted between the power supply terminal 311 and the power supply terminal 312. A cathode of the diode 321 is electrically connected to the power supply terminal 311. An anode of the diode 321 is electrically connected to the power supply terminal 312. In the case where overvoltage is applied to the power supply terminal 311 and/or the power supply terminal 312 due to ESD or the like, the power supply terminal 311 and the power supply terminal 312 are short-circuited by the diode 321, so that overvoltage can be prevented from being applied to the amplifier circuit 302 and the photodiode 301.

Next, the layout of the photodetector 300 of this embodiment is described with reference to FIG. 11. FIG. 11 illustrates a semiconductor film used for the transistors 305 and 306 in the amplifier circuit 302, a semiconductor film (a photoelectric conversion layer) used for the photodiode 301, a semiconductor film used for the diode 321, and first to third conductive films of the photodetector 300. The photodetector 300 further includes a fourth conductive film used for the power supply terminals 311 and 312. The protection circuit 32 of Embodiment 3 (see FIGS. 7A to 7C) is used as the protection circuit 320.

A conductive film 410 is the first conductive film. The conductive film 410 is used for gate wirings (gate electrodes) of the transistors 305 and 306 in the amplifier circuit 302. Below the conductive film 410, the one conductive film used for the transistors 305 and 306 is formed with an insulating film interposed therebetween. The semiconductor film used for the diode 321 is formed in the same layer as this semiconductor film.

Second conductive films are formed over the conductive film 410 with an insulating film interposed therebetween. Here, as the second conductive films, four conductive films 411 to 414 are formed. The conductive film 411 is used for a drain wiring of the transistor 306 and the cathode of the diode 321. The conductive film 412 is used for a source wiring of each of the transistor 305 and the transistor 306. The conductive film 413 is used for a drain electrode of the transistor 305. With the conductive film 413, a gate electrode of the transistor 305 is electrically connected to the drain electrode thereof. The conductive film 414 is used for an electrode for electrically connecting the photodiode 301 and the amplifier circuit 302 to each other. In addition, the conductive film 414 is electrically connected to the first conductive film 410 through an opening formed in the insulating film. Thus, the gate electrodes (the gate wirings) of the transistors 305 and 306 are electrically connected to the anode of the photodiode 301.

A photoelectric conversion layer 450 is formed over and in contact with the second conductive film 414. The photoelectric conversion layer 450 is used for the photodiode 301.

An insulating film which covers the second conductive films 411 to 414 and the photoelectric conversion layer 450 is formed. Over the insulating film, a conductive film 421 and a conductive film 422 are formed as third conductive films. In addition, a plurality of openings 441 to 445 are formed in the insulating film. The conductive film 421 is electrically connected to the photoelectric conversion layer 450 through the plurality of openings 445 and is electrically connected to the conductive film 411 through the plurality of openings 441 and 443. Further, the conductive film 422 is electrically connected to the conductive film 412 through the plurality of openings 442 and 444.

The photodetector 300 further includes a fourth conductive film. As illustrated in FIG. 12, the fourth conductive film is used for the power supply terminal 311 and the power supply terminal 312. In this embodiment, the power supply terminals 311 and 312 are formed using a conductive film having a four-layer structure; the power supply terminal 311 is electrically connected to the conductive film 421; the power supply terminal 312 is electrically connected to the conductive film 422.

Note that FIG. 12 is not a cross-sectional view taken along a particular section line in the plan view of FIG. 11 but a cross-sectional view for illustrating the layered structure of films used for the photodetector 300 and electrical connections of conductive films formed in different layers. In FIG. 12, in a cross-sectional view taken along line a-b, the electrical connection structure between the second and third conductive films and the power supply terminal 312 is mainly illustrated. In a cross-sectional view taken along line b-c, the transistor 306 is typically illustrated as a cross section of the amplifier circuit 302. In a cross-sectional view taken along line c-d, the electrical connection structure between the second and third conductive films and the power supply terminal 311 and the cross-sectional structures of the photodiode 301 and the diode 321 are mainly illustrated.

In this embodiment, a glass substrate 500 is used as a substrate over which an integrated circuit is formed. When light 303 transmitted through the glass substrate 500 enters the photodiode 301, the photodiode 301 converts light into electric signals. The electric signals are amplified in the amplifier circuit 302, and the amplified signals are output from the photodetector 300 as current flowing between the power supply terminal 311 and the power supply terminal 312. In this embodiment, a coloring layer for selectively transmitting light in a predetermined wavelength range (a color filter layer) can be formed on a side of the glass substrate 500, where the light 303 enters. For the coloring layer, a resin in which a pigment is dispersed or the like can be used, for example.

Next, a method for manufacturing the photodetector 300 and the cross-sectional structure of the photodetector 300 are described. First, the method for manufacturing the photodetector 300 is described with reference to cross-sectional views in FIGS. 13A to 13E, FIGS. 14A to 14D, FIGS. 15A to 15C, FIGS. 16A and 16B, FIGS. 17A and 17B, and FIG. 18 and plan views in FIG. 19, FIGS. 20A and 20B, and FIG. 21.

The glass substrate 500 is prepared. A non-alkali glass substrate is preferably used as the glass substrate 500. As a non-alkali glass substrate, for example, an aluminosilicate glass substrate, an aluminoborosilicate glass substrate, a barium borosilicate glass substrate, or the like can be used. Instead of the glass substrate 500, a quartz substrate can be used.

Figure 13A:
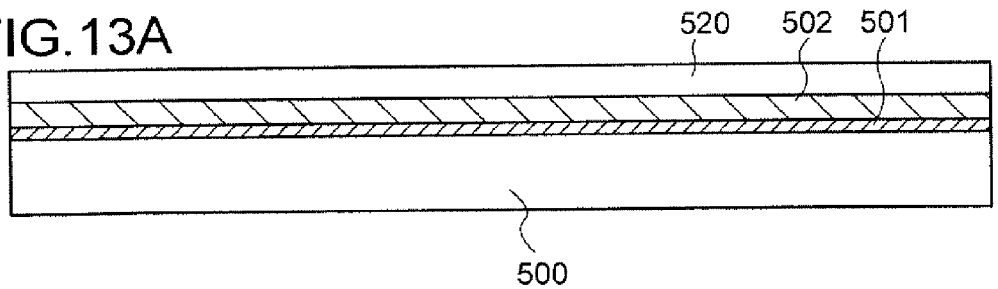
FIGS. 13A to 13E are cross-sectional views illustrating an example of a method for manufacturing the photodetector in FIG. 11 and FIG. 12 (Embodiment 5)

Next, a base insulating film having a thickness greater than or equal to 50 nm and less than or equal to 300 nm is formed over the glass substrate 500. Here, as illustrated in FIG. 13A, a two layer insulating film of a silicon nitride oxide film 501 and a silicon oxynitride film 502 is formed as the base insulating film. Next, a semiconductor film having a thickness greater than or equal to 20 nm and less than or equal to 100 nm is formed over the base insulating film as each of semiconductor films of the diode 321 and the transistors 305 and 306. First, through the base insulating film, the transistors 305 and 306 and the diode 321 are formed over the glass substrate 500. A method for forming the transistors 305 and 306 and the diode 321 is described below with reference to FIGS. 13A to 13E and FIGS. 14A to 14D.

The base insulating film is provided so as to prevent an alkali metal (typically Na) or an alkaline earth metal contained in the glass substrate 500 from diffusing and adversely affecting electric characteristics of a semiconductor element such as a transistor. The base insulating film may have either a single-layer structure or a layered structure; however, the base insulating film preferably includes at least one barrier film for preventing diffusion of an alkali metal and an alkaline earth metal. In this embodiment, the silicon nitride oxide film 501 is provided as a barrier film. As the barrier film, a nitride oxide film such as a silicon nitride oxide film, or a nitride film such as a silicon nitride film or an aluminum nitride film is preferably used. In order to decrease the interface state density between the semiconductor film and the base insulating film which are included in the transistors 305 and 306, the silicon oxynitride film 502 is formed.

In this embodiment, the 140-nm-thick silicon nitride oxide film 501, the 100-nm-thick silicon oxynitride film 502, and a 50-nm-thick amorphous silicon film 520 are successively formed using one PECVD apparatus. The source gas of the silicon nitride oxide film 501 is $SiH_4$, $N_2O$, $NH_3$, and $H_2$. The source gas of the silicon oxynitride film 502 is $SiH_4$ and $N_2O$. The source gas of the amorphous silicon film 502 is $SiH_4$ and $H_2$. By changing the source gases, the three films can be successively formed in one chamber.

In this embodiment, the transistors 305 and 306 and the diode 321 are formed using a crystalline semiconductor film. Therefore, an amorphous silicon film is crystallized so that a crystalline silicon film is formed. As a method for crystallizing the semiconductor film, a solid phase epitaxy method using a lamp annealing apparatus or a furnace, a method for crystallizing and melting the semiconductor film by laser light irradiation, or the like can be used.

Figure 13B:
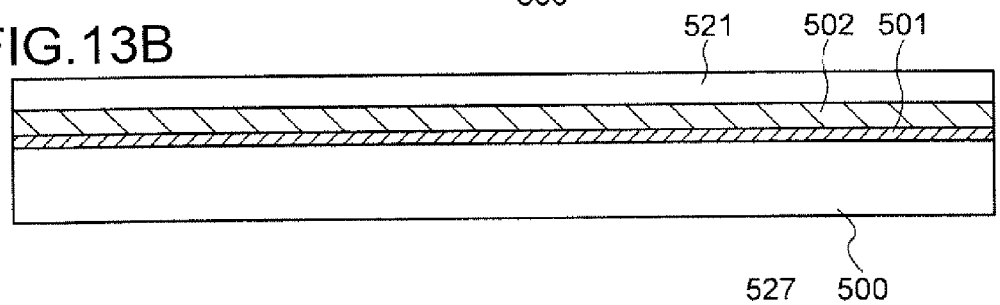

Here, the amorphous silicon film 520 is formed over the base insulating film and is subjected to solid phase epitaxy to be crystallized so that a crystalline silicon film 521 is formed (see FIGS. 13A and 13B). Here, in order to perform the solid phase epitaxy on the amorphous silicon film 520 at a heating temperature lower than or equal to 600° C. for a short time, a metal element is added to the amorphous silicon film 520. A method for crystallizing the amorphous silicon film 520 is specifically described below.

First, a surface of the amorphous silicon film 520 is cleaned with ozone water so that an ultrathin (several-nanometer-thick) oxide film is formed. Thus, the wettability of the surface of the amorphous silicon film 520 is improved. Subsequently, the surface of the amorphous silicon film 520 is coated with a nickel acetate solution containing 10 ppm by weight of nickel by a spinner.

Next, the amorphous silicon film 520 is heated in a furnace so that the crystalline silicon film 521 is formed. For example, in order to crystallize the amorphous silicon film 520, the amorphous silicon film 520 is heated at 500° C. for 1 hour, for example, and then, is heated at 550° C. for 4 hours. With the catalytic action of nickel, the crystalline silicon film 521 can be formed at low temperature for a short time. Further, with the catalytic action of nickel, the crystalline silicon film 521 having few dangling bonds at crystal grain boundaries can be formed. As a metal element which promotes the crystallization of silicon, Fe, Co, Ru, Rh, Pd, Os, Ir, Pt, or the like can be used instead of Ni.

As a method for introducing such a metal element into the amorphous silicon film 520, a method by which a film containing a metal element as its main component is formed on the surface of the amorphous silicon film 520, a method by which a metal element is added to the amorphous silicon film 520 by plasma doping, or the like can be used instead of the method by which the amorphous silicon film 520 is coated with a solution of such a metal element.

Next, in order to reduce the crystal defects in the crystalline silicon film 521 and to improve the degree of crystallization, the crystalline silicon film 521 is irradiated with laser light. Here, the crystalline silicon film 521 is irradiated with excimer laser light (XeCl: a wavelength of 308 nm). A beam having a wavelength less than or equal to 400 nm is preferably used for the laser light. As such laser light, for example, excimer laser light such as XeCl excimer laser light, the second harmonic or the third harmonic of a YAG laser, or the like can be used. Before the laser light irradiation, an oxide film formed on a surface of the crystalline silicon film 521 is preferably removed using dilute hydrofluoric acid or the like.

In this embodiment, treatment for gettering of nickel, which is introduced for the crystallization, from the crystalline silicon film 521 is performed for the following reason. Nickel is useful for the crystallization of the amorphous silicon film 520, however, if nickel is included in the crystalline silicon film 521 at high concentration, nickel might be a factor of making the electric characteristics of the transistors 305 and 306 worse, for example, the leakage current of the transistors 305 and 306 is increased. An example of the gettering treatment is described below.

First, the surface of the crystalline silicon film 521 is cleaned with ozone water for about 120 seconds so that an oxide film having a thickness of approximately 1 to 10 nm is formed on the surface of the crystalline silicon film 521. Instead of the surface treatment with ozone water, UV light irradiation may be performed. Next, an amorphous silicon film containing Ar is formed to a thickness of approximately 10 to 400 nm on the surface of the crystalline silicon film 521 with the oxide film interposed therebetween. The concentration of Ar in the amorphous silicon film is preferably higher than or equal to $1 \times 10^{18}$ atoms/cm$^3$ and lower than or equal to $1 \times 10^{22}$ atoms/cm$^3$. In addition, instead of Ar, another element of Group 18 may be added to the amorphous silicon film.

An element of Group 18 is added to the amorphous silicon film in order to form a gettering site in the amorphous silicon film by generating distortion in the amorphous silicon film. There are two factors which cause the distortion by the addition of the element of Group 18. One is the formation of dangling bonds in crystals by the addition of the element of Group 18. The other is the addition of the element of Group 18 between crystal lattices.

For example, in order to form the amorphous silicon film containing Ar (hereinafter referred to as the Ar:a-Si film) by PECVD, $SiH_4$, $H_2$, and Ar are used as a source gas. The flow ratio of $SiH_4$ to Ar ($SiH_4$/Ar) is preferably greater than or equal to 1/999 and less than or equal to 1/9. Further, process temperature is preferably higher than or equal to 300° C. and lower than or equal to 500° C. RF power density for exciting the source gas is preferably higher than or equal to 0.0017 $W/cm^2$ and lower than or equal to 0.48 $W/cm^2$. Process pressure is preferably higher than or equal to 1.333 Pa and lower than or equal to 66.65 Pa.

For example, in the case of forming the Ar:a-Si film by sputtering, single crystal silicon is used for a target and Ar is used for a sputtering gas. By performing grow discharge of the Ar gas and sputtering of the single crystal silicon target with Ar ions, the amorphous silicon film containing Ar can be formed. The concentration of Ar in the amorphous silicon film can be controlled in accordance with power, pressure, temperature, or the like for the grow discharge. Process pressure is preferably higher than or equal to 0.1 Pa and lower than or equal to 5 Pa. As the pressure is decreased, the concentration of Ar in the amorphous silicon film can be made higher. Thus, the pressure is preferably lower than or equal to 1.5 Pa. It is not necessary to heat the glass substrate 500 in the process particularly, and process temperature is preferably lower than or equal to 300° C.

After the Ar:a-Si film is formed, heat treatment at 650° C. for 3 minutes is performed in the furnace for gettering. With this heat treatment Ni contained in the crystalline silicon film 521 is separated out to the Ar:a-Si film and is captured. Accordingly, the concentration of Ni in the crystalline silicon film 521 can be lowered. After the heat treatment is completed, the Ar:a-Si film is removed by etching. In this etching, the oxide film serves as an etching stopper. After the Ar:a-Si film is removed, the oxide film formed on the surface of the crystalline silicon film 521 is removed using dilute hydrofluoric acid or the like. Thus, the crystalline silicon film 521 in which the concentration of Ni is reduced is formed.

Here, an acceptor element is added to the crystalline silicon film 521 so that the threshold voltage of the transistors 305 and 306 is controlled. For example, boron is used as an acceptor element and is added to the crystalline silicon film 521 so as to be contained at a concentration higher than or equal to $1 \times 10^{16}$ atoms/$cm^3$ and lower than or equal to $5 \times 10^{17}$ atoms/$cm^3$.

Figure 13C:
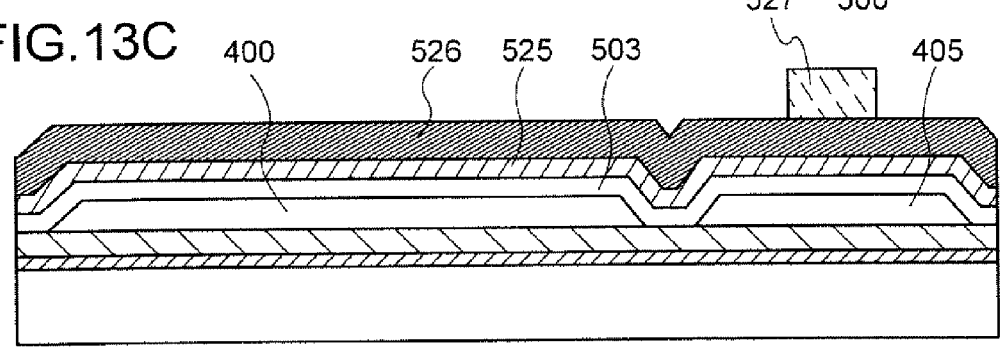

Subsequently, a resist mask is formed over the crystalline silicon film 521, and the crystalline silicon film 521 is etched using the resist mask so that a semiconductor film 400 used for the diode 321 and a semiconductor film 405 used for the amplifier circuit 302 are formed, as illustrated in FIG. 13C. FIG. 19 illustrates the layout of the semiconductor film 400 and the semiconductor film 405.

In this embodiment, the semiconductor films 400 and 405 are formed using a silicon film; however, the semiconductor films 400 and 405 can be formed using a semiconductor film including a different element of Group 14, such as germanium, silicon germanium, or silicon carbide. Alternatively, a compound semiconductor such as GaAs, InP, SiC, ZnSe, GaN, or SiGe, or an oxide semiconductor such as zinc oxide or tin oxide can be used.

Next, as illustrated in FIG. 13C, a gate insulating film is formed over the semiconductor films 400 and 405. Here, as the gate insulating film, a 30-nm-thick silicon oxynitride film 503 is formed. The silicon oxynitride film 503 is formed using $SiH_4$ and $N_2O$ as a source gas by PECVD.

In addition, as a conductive film used as the conductive film 410, a conductive film having a two-layer structure of a 30-nm-thick tantalum nitride film 525 and a 170-nm-thick tungsten film 526 is formed. The tantalum nitride film 525 and the tungsten film 526 are formed by sputtering. Instead of the stacked film of the tantalum nitride film 525 and the tungsten film 526, for example, a stacked film of a tungsten nitride film and a tungsten film or a stacked film of a molybdenum nitride film and a molybdenum film can be formed. In this embodiment, since a source region, a drain region, and a low concentration impurity region are formed in the semiconductor film 405 in a self-aligned manner by using the conductive film 410 as a mask for addition of an impurity, the upper-layer conductive film is made smaller than the lower-layer conductive film when viewed from above. In order to facilitate the formation of the conductive film 410, the etching selectivity of the upper-layer conductive film with respect to the lower-layer conductive film is preferably higher. In this respect, the stacked film of the tantalum nitride film 525 and the tungsten film 526 is preferable.

Figure 13D:
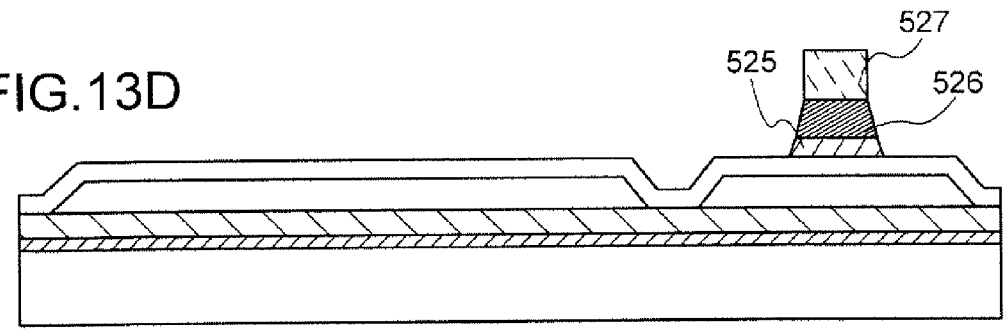

Next, a resist mask 527 is formed over the tungsten film 526. Etching is performed twice using the resist mask 527. First, as illustrated in FIG. 13D, the tantalum nitride film 525 and the tungsten film 526 are etched using the resist mask 527. With this first etching, cross sections of the stacked film of the tantalum nitride film 525 and the tungsten film 526 are tapered. For example, this etching can be performed using a mixture gas of $CF_4$, $Cl_2$, and $O_2$ as an etching gas by an inductively coupled plasma (ICP) etching apparatus.

Figure 13E:
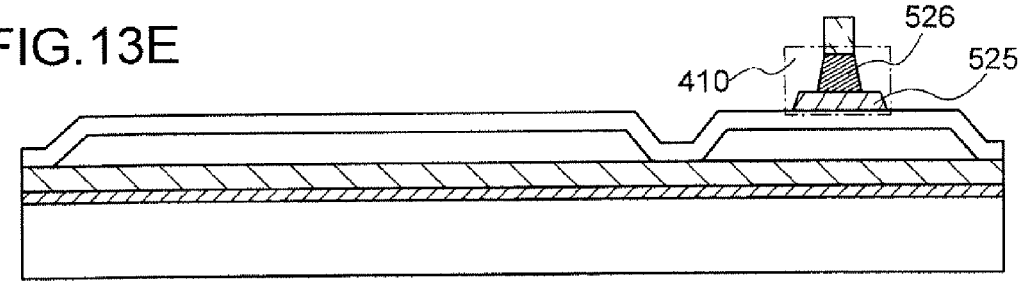

Further, as illustrated in FIG. 13E, the upper-layer tungsten film 526 is selectively etched using the resist mask 527. This etching is anisotropic etching and can be performed using a mixture gas of $Cl_2$, $SF_6$, and $O_2$ as an etching gas by an ICP etching apparatus, for example. With this second etching, the first conductive film 410 is formed. In the conductive film 410, end portions of the tungsten film 526 are on a top surface of the tantalum nitride film 525, and the tungsten film 526 is smaller than the tantalum nitride film 525 when viewed from above. FIG. 20A illustrates the layout of the semiconductor film 405 and the conductive film 410.

Figure 14A:
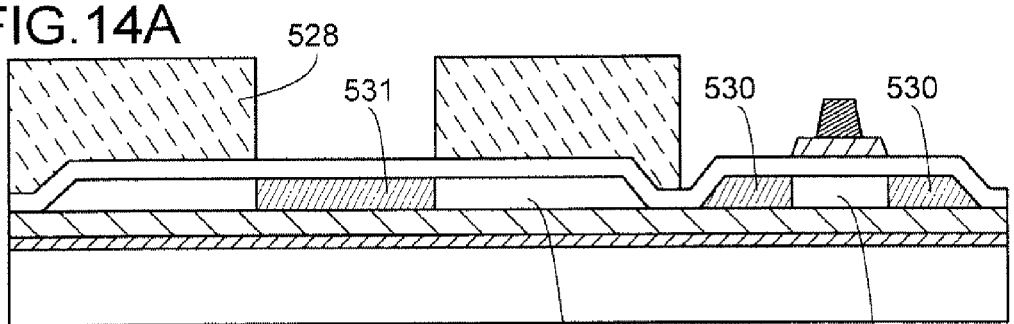
FIGS. 14A to 14D are cross-sectional views illustrating examples of steps subsequent to FIG. 13E (Embodiment 5)

After the resist mask 527 is removed, a resist mask 528 is formed so as to cover a high-resistance region and a p-type impurity region of the semiconductor film 400, as illustrated in FIG. 14A. Subsequently, a donor element is added to the semiconductor films 400 and 405 so that n-type impurity regions are formed. Here, phosphorus is added as the donor element. First, in order to form low-concentration n-type impurity regions in the semiconductor film 405, phosphorus is added to the semiconductor films 400 and 405 under conditions of a low dosage and high accelerating voltage. $PH_3$ can be used as a source gas of phosphorus. Under these conditions, only a portion of the conductive film 410, where the tantalum nitride film 525 and the tungsten film 526 are stacked, serves as a mask, and phosphorus is added through a portion of the conductive film 410, where only the tantalum nitride film 525 is formed, so that low concentration impurity regions 530 are formed in the semiconductor film 405. Further, a low concentration impurity region 531 is formed in the semiconductor film 400.

Figure 14B:
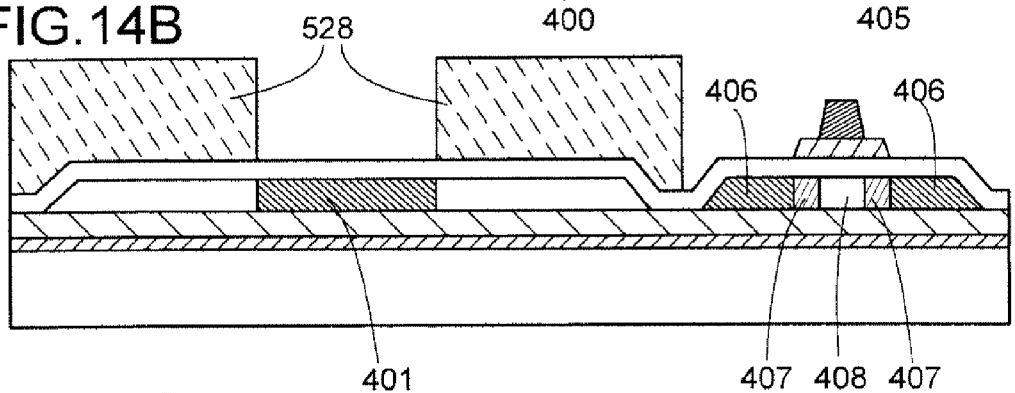

Next, in order to form source regions and drain regions of the transistors 305 and 306 and an n-type impurity region of the diode 321, phosphorus is added under conditions of a high dosage and low accelerating voltage. Under these conditions, the entire conductive film 410 serves as a mask, and n-type impurity regions 406, low concentration impurity regions 407, and a channel formation region 408 are formed in the semiconductor film 405 in a self-aligned manner, as illustrated in FIG. 14B. The n-type impurity regions 406 serve as a source region and a drain region. Further, an n-type impurity region 401 which is used for a PIN junction is formed in the semiconductor film 400.

Figure 14C:
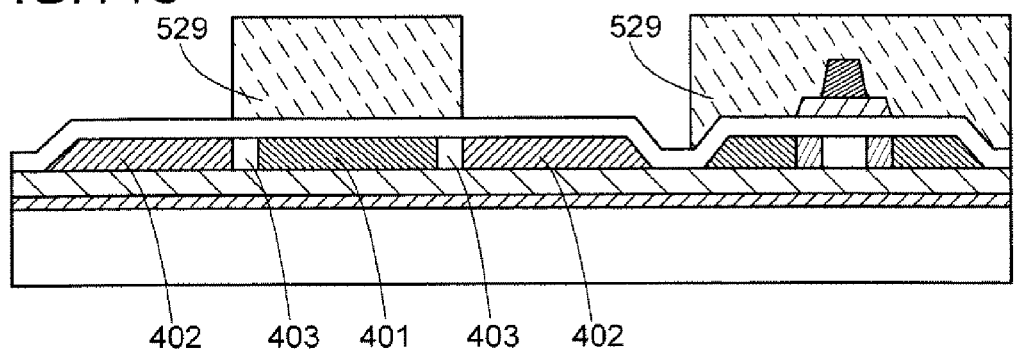

After the resist mask 528 is removed, a resist mask 529 is formed so as to cover the entire semiconductor film 405 and regions which serves as the high-resistance regions and an n-type impurity region of the semiconductor film 400, as illustrated in FIG. 14C. Subsequently, an acceptor element is added to the semiconductor film 400 so that p-type impurity regions are formed. Here, boron is added as the acceptor element $B_2H_6$ can be used as a source gas of boron. By adding boron to the semiconductor film 400 under conditions of a low dosage and high accelerating voltage, p-type impurity regions 402 are formed in the semiconductor film 400. Further, in the semiconductor film 400, regions where the donor element and the acceptor element are not added in the step of adding impurity elements in FIGS. 14A to 14C are high-resistance regions 403. FIG. 20B is a plan view of the diode 321. FIG. 20B also illustrates openings 431 through which the n-type impurity region 401 and the conductive film 411 are connected to each other and openings 432 through which the p-type impurity region 402 and the conductive film 411 are connected to each other.

Figure 14D:
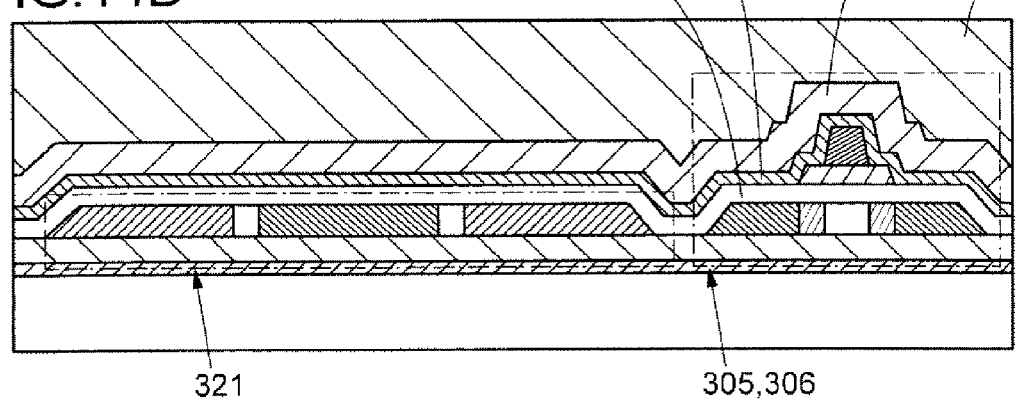

After the resist mask 529 is removed, a first interlayer insulating film is formed over the glass substrate 500 so as to cover the conductive film 410, as illustrated in FIG. 14D. In this embodiment, the first interlayer insulating film has a three-layer structure. A first layer is a 30-nm-thick silicon oxynitride film 504. A second layer is a 165-nm-thick silicon nitride oxide film 505. A third layer is a 600-nm-thick silicon oxynitride film 506. These films 504 to 506 are formed using a PECVD apparatus.

First, the silicon oxynitride film 504 is formed using $SiH_4$ and $N_2O$ as a source gas. Then, heat treatment is performed so that phosphorus and boron, which are added to the semiconductor films 400 and 405, are activated. Here, heat treatment is performed at 480° C. for 1 hour. After the heat treatment is completed, the silicon nitride oxide film 505 and the silicon oxynitride film 506 are formed using a PECVD apparatus. $SiH_4$, $N_2O$, $NH_3$, and $H_2$ are used as a source gas of the silicon nitride oxide film 505 so that the concentration of hydrogen in the silicon nitride oxide film 505 is high. $SiH_4$ and $N_2O$ are used as a source gas of the silicon oxynitride film 506. After the silicon oxynitride film 506 is formed, heat treatment is performed so that hydrogen contained in the silicon nitride oxide film 505 is dispersed, whereby dangling bonds in the semiconductor films 400 and 405 are terminated with hydrogen. This heat treatment can be performed at a temperature higher than or equal to 300° C. and lower than or equal to 550° C.

Figure 21:
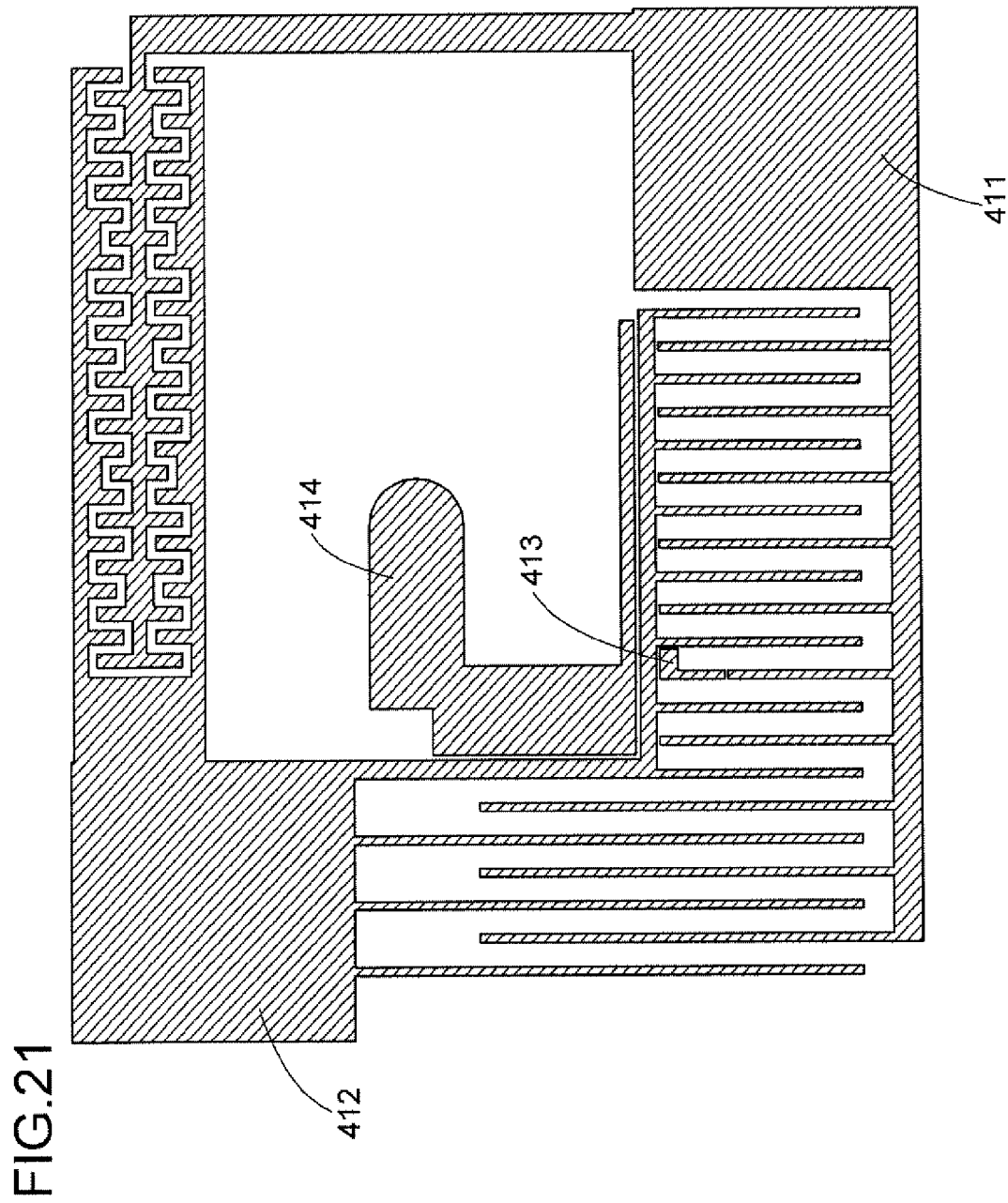
FIG. 21 is a layout diagram illustrating a structural example of a second conductive film in the photodetector (Embodiment 5)
Figure 22:
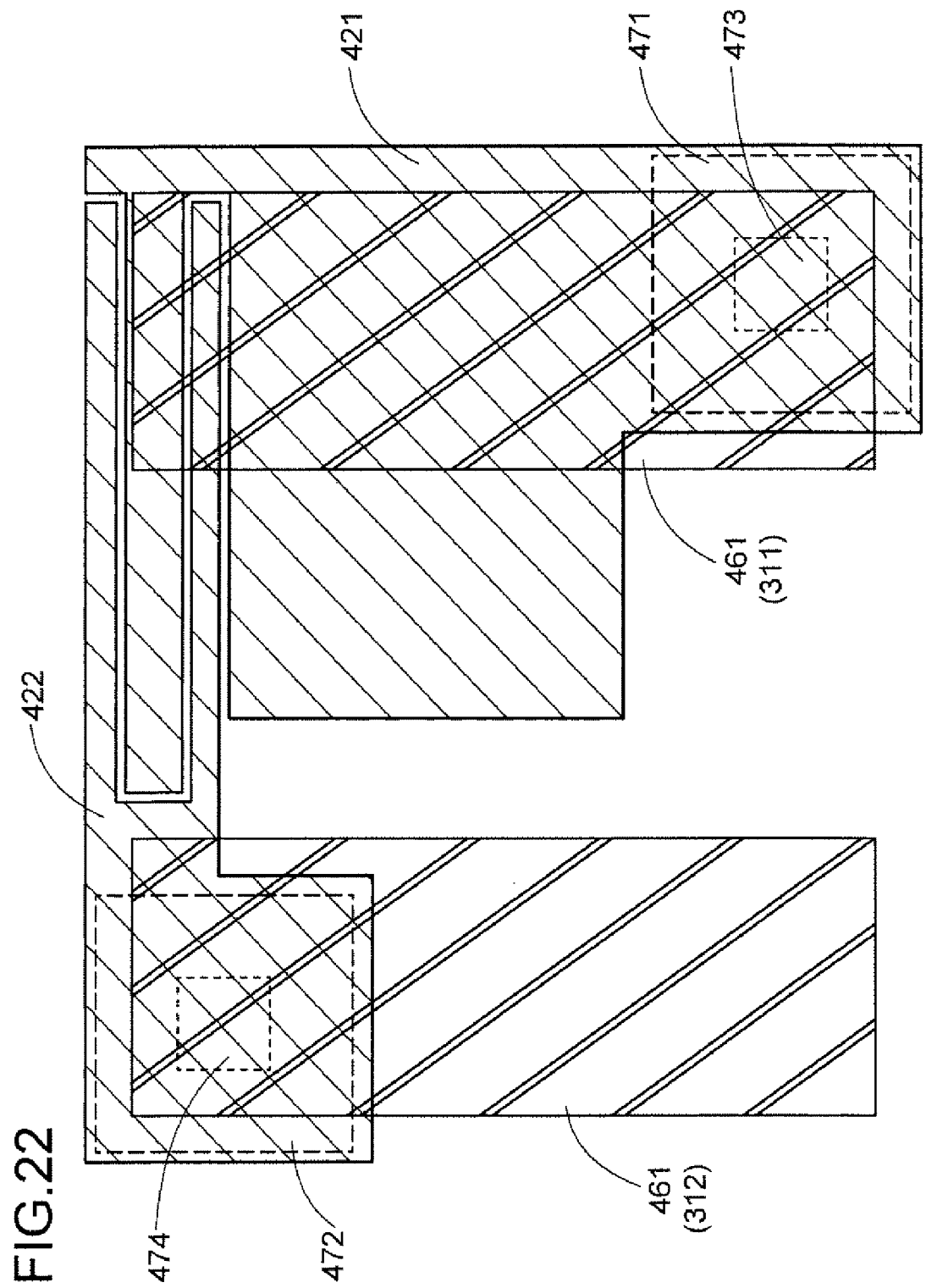
FIG. 22 is a layout diagram illustrating a structural example of a power supply terminal in the photodetector (Embodiment 5)

The subsequent steps are described with reference to the cross-sectional views in FIGS. 15A to 15C, FIGS. 16A and 16B, FIGS. 17A and 17B, and FIG. 18, and plan views in FIG. 21 and FIG. 22. Methods for illustration in FIGS. 15A to 15C, FIGS. 16A and 16B, FIGS. 17A and 17B, and FIG. 18 are similar to that of FIG. 12.

The stacked film formed using the silicon oxynitride film 503, the silicon oxynitride film 504, the silicon nitride oxide film 505, and the silicon oxynitride film 506 is etched using a resist mask so that openings which serve as contact holes are formed. The openings are formed in a connection portion between the conductive film 411 and the n-type impurity region 401 of the semiconductor film 400, a connection portion between the conductive film 412 and the p-type impurity region 402 of the semiconductor film 400, a connection portion between the conductive film 411 and the n-type high-concentration impurity region 406 of the semiconductor film 405, a connection portion between the conductive film 412 and the n-type high-concentration impurity region 406 of the semiconductor film 405, a connection portion between the conductive film 413 and the conductive film 410, and a connection portion between the conductive film 414 and the conductive film 410.

With this etching, the plurality of openings 431 are distributed in the entire n-type impurity region 401 so that the n-type impurity region 401 is electrically connected to the conductive film 411, and the plurality of openings 432 are distributed in the entire p-type impurity region 402 so that the p-type impurity region 402 is electrically connected to the conductive film 412 (see FIG. 20B). By forming the plurality of openings 431 and 432 in this manner, contact resistance between the n-type impurity region 401 and the conductive film 411 and contact resistance between the p-type impurity region 402 and the conductive film 412 can be reduced.

Next, a conductive film used for the second conductive films 411 to 414 is formed over the silicon oxynitride film 506. Here, a 400-nm-thick titanium film is formed by sputtering. A resist mask is formed over the titanium film and is used for etching of the titanium film so that the conductive films 411 to 414 are formed (see FIG. 15A). FIG. 21 is a plan view of the second conductive films 411 to 414.

Note that the second conductive films 411 to 414 and the third conductive films 421 and 422 are each preferably formed using a film of titanium, a titanium alloy, a titanium compound, molybdenum, a molybdenum alloy, or a molybdenum compound. The film formed using such a conductive material has advantages that heat resistance is high, electrolytic corrosion due to contact with a silicon film does not easily occur, and migration does not easily occur.

Next, as illustrated in FIG. 15A, the photoelectric conversion layer 450 used for the photodiode 301 is formed over the silicon oxynitride film 506. Here, an amorphous silicon film is formed for the photoelectric conversion layer 450 by using a PECVD apparatus. Further, in order to provide a PIN junction in the photoelectric conversion layer 450, the photoelectric conversion layer 450 has a three-layer structure of a layer which has p-type conductivity, a layer which has i-type (intrinsic) conductivity, and a layer which has n-type conductivity. Note that the photoelectric conversion layer 450 is not limited to the amorphous silicon film, and may be either a microcrystalline silicon film or a single crystalline silicon film, for example.

First, a 60-nm-thick p-type amorphous silicon film 451, a 400-nm-thick i-type amorphous silicon film 452, and an 80-nm-thick n-type amorphous silicon film 453 are successively formed using a PECVD apparatus so as to cover the conductive films 411 to 414. Boron is added by using $SiH_4$, $H_2$, and $B_2H_6$ as a source gas of the p-type amorphous silicon film 451. An amorphous silicon film to which an impurity element which serves as a donor or an acceptor is not added intentionally is formed by using $SiH_4$ and $H_2$ as a source gas of the i-type amorphous silicon film 452, Phosphorus is added by using $SiH_4$, $H_2$, and $PH_3$ as a source gas of the n-type amorphous silicon film 453. Subsequently, the stacked film formed using the amorphous silicon films 451 to 453 is etched using a resist mask so that the photoelectric conversion layer 450 is formed (see FIG. 12 and FIG. 15A).

Here, the plurality of photodetectors 300 are simultaneously formed over one glass substrate 500. After the photodetectors 300 are completed, the glass substrate 500 is cut in accordance with the size of the photodetectors 300 so that the photodetectors 300 are divided into separate photodetectors. Here, in order to appropriately protect side surfaces of the divided photodetectors 300, the silicon oxynitride film 506 formed in peripheral portions 541 of the photodetector 300 (portions indicated by dotted lines) is removed, as illustrated in FIG. 15B. This step can be performed by etching.

Next, a second interlayer insulating film is formed so as to cover the silicon nitride oxide film 50S, the silicon oxynitride film 506, the conductive films 411 to 414, and the photoelectric conversion layer 450. Here, as illustrated in FIG. 15C, a two-layer insulating film formed using a 100-nm-thick silicon nitride oxide film 507 and an 800-nm-thick silicon oxide film 508 is formed.

The silicon nitride oxide film 507 is formed using a PECVD apparatus by using $SiH_4$, $N_2O$, $NH_3$, and $H_2$ as a source gas. The silicon nitride oxide film 507 serves as a passivation film. Instead of the silicon nitride oxide film 507, a silicon nitride film may be formed. The silicon nitride film can be formed using a PECVD apparatus by using $SiH_4$, $NH_3$, and $H_2$ as a source gas. Further, the silicon oxide film 508 is formed using a PECVD apparatus by using $O_2$ and tetraethoxysilane (abbr.: TEOS and chemical formula: $Si(OC_2H_5)_4$) as a source gas. Instead of the silicon oxide film 508, a silicon oxynitride film may be formed using a PECVD apparatus.

Next, the stacked film formed using the silicon nitride oxide film 507 and the silicon oxide film 508 is etched using a resist mask so that the plurality of openings 441 to 445 are formed (see FIG. 11).

The openings 441 are openings through which the conductive film 411 and the conductive film 421 are connected to each other and are dispersively formed in the n-type impurity region 401 of the diode 321. The openings 442 are openings through which the conductive film 412 and the conductive film 422 are connected to each other and are dispersively formed in the p-type impurity region 402 of the diode 321. The openings 443 and the openings 444 are openings through which the internal wirings of the amplifier circuit 302 (the conductive films 411 and 412) and the conductive films 421 and 422 are electrically connected to each other. The openings 445 are openings through which the photoelectric conversion layer 450 and the conductive film 421 are electrically connected to each other.

Next, a conductive film used for the third conductive films 421 and 422 is formed over the silicon oxide film 508. Here, a 200-nm-thick titanium film is formed by sputtering. A resist mask is formed over the titanium film and is used for etching of the titanium film so that the conductive films 421 and 422 are formed (see FIG. 11 and FIG. 16A).

Next, as illustrated in FIG. 16B, except for the silicon nitride oxide film 501, the insulating films 502 to 508 are removed from peripheral portions 542 of the photodetector 300 (portions indicated by dotted lines). This step can be performed by etching. The insulating films are removed from the peripheral portions of the photodetector in this manner in order to appropriately protect the side surfaces of the photodetectors 300 after the glass substrate 500 is cut, in a manner similar to that of the case of removing the silicon oxynitride film 506 in the step of FIG. 15B.

Figure 17A:
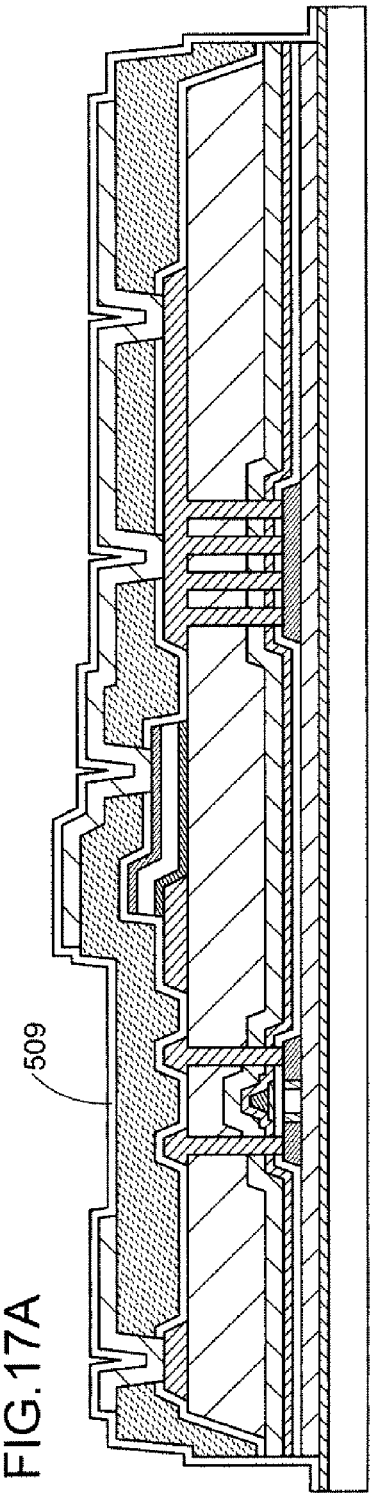
FIGS. 17A and 17B are cross-sectional views illustrating examples of steps subsequent to FIG. 16B (Embodiment 5)

Next, as illustrated in FIG. 17A, a 100-nm-thick silicon nitride oxide film 509 is formed. The silicon nitride oxide film 509 is formed using a PECVD apparatus by using $SiH_4$, $N_2O$, $NH_3$, and $H_2$ as a source gas. The silicon nitride oxide film 509 serves as a passivation film. A portion where the third conductive films 421 and 422 and all the insulating films 501 to 508 are exposed is covered with the silicon nitride oxide film 509. Therefore, in the photodetector 300 including the amplifier circuit 302, the photodiode 301, and the protection circuit 320, the glass substrate 500 side is protected with the silicon nitride oxide film 501 which serves as the barrier film, and a side where the power supply terminal 311 and the power supply terminal 312 are formed is protected with the silicon nitride oxide film 509. With such a structure, invasion of moisture or an impurity such as an organic substance into the photodetector 300 can be prevented.

Figure 17B:
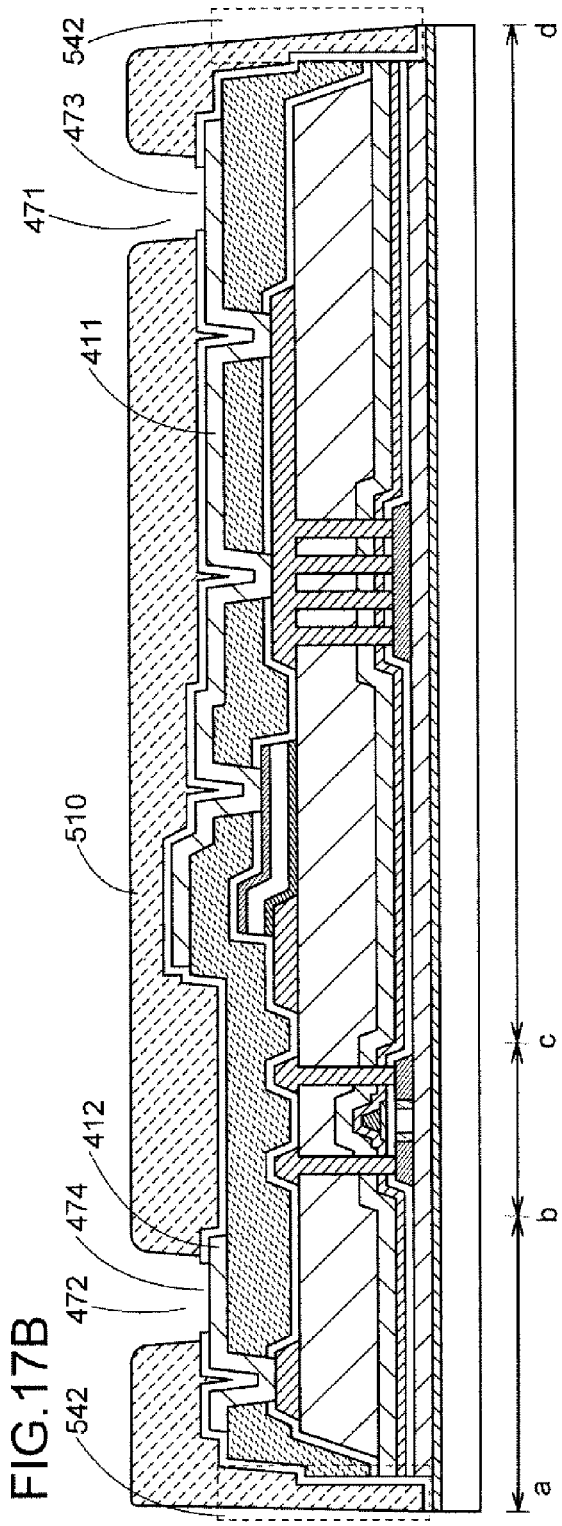
Figure 18:
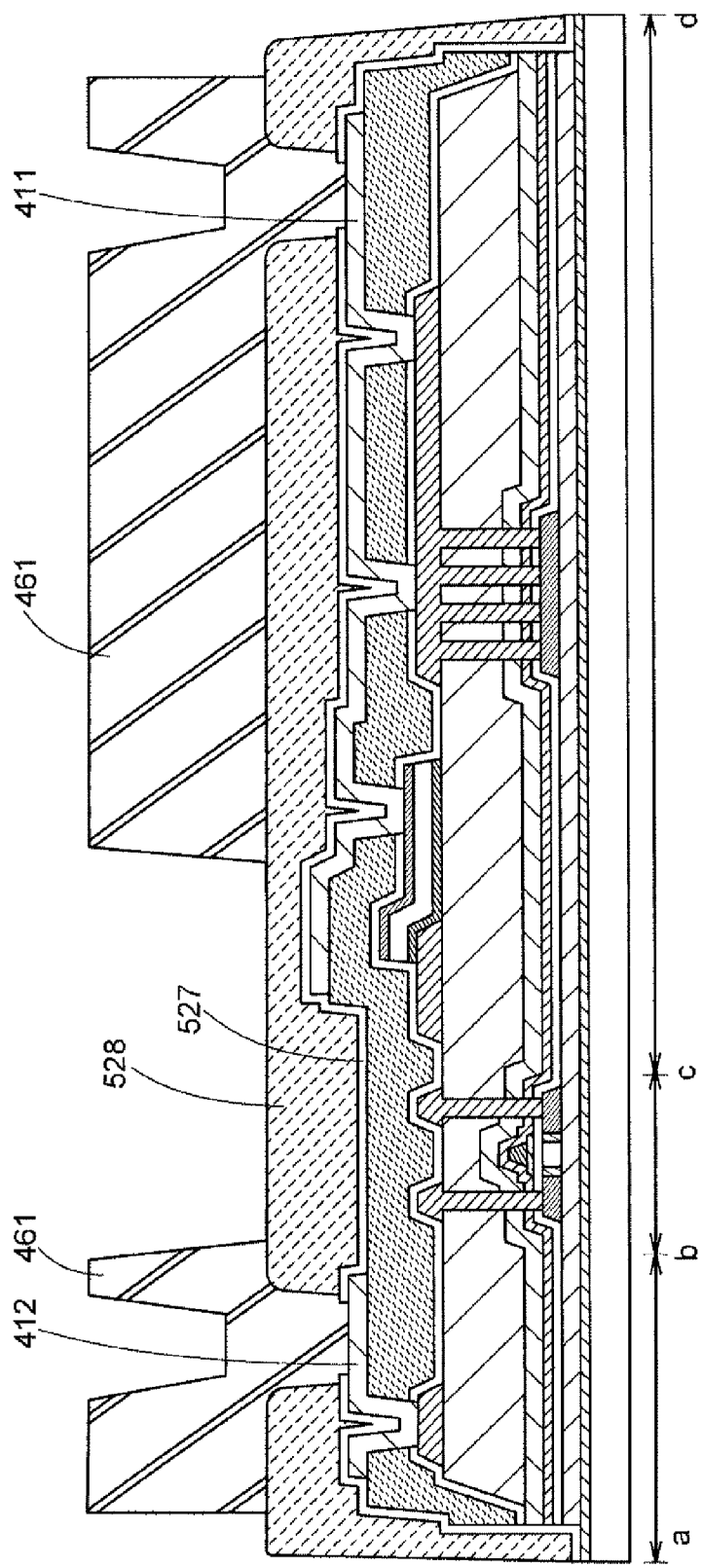
FIG. 18 is a cross-sectional view illustrating an example of a step subsequent to FIG. 17B (Embodiment 5)

Next, as illustrated in FIG. 17B, a sealing film 510 is formed. With the sealing film 510, a top surface and side surfaces of the photodetector 300 are sealed. The thickness of the sealing film 510 is preferably greater than or equal to 1 µm, and is approximately 1 to 30 µm. Since the sealing film 510 is formed thick in this manner, the sealing film 510 is preferably formed using a resin film. Here, by forming a photosensitive epoxy-phenol-based resin film by a printing method, the sealing film 510 having openings 471 and 472 (illustrated in FIG. 22) in connection portions for connection to the power supply terminals 311 and 312 is formed. Next, the silicon nitride oxide film 509 is etched using a resist mask so that openings 473 and 474 (illustrated in FIG. 22) are formed in a connection portion in the conductive film 421 for connection to the power supply terminal 311 and a connection portion in the conductive film 422 for connection to the power supply terminal 312.

Next, the power supply terminals 311 and 312 are formed over the sealing film 510. FIG. 22 is a layout diagram of the power supply terminals 311 and 312. FIG. 22 also illustrates the third conductive films 421 and 422, the openings 471 and 472 formed in the sealing film 510, and the openings 473 and 474 formed in the silicon nitride oxide film 509.

In this embodiment, the power supply terminals 311 and 312 are formed using a conductive film having a four-layer structure. First, first conductive films 461 are formed by a printing method such as a screen printing method. In this embodiment, each of the conductive films 461 is formed to a thickness of approximately 15 µm by a screen printing method by using a conductive paste containing nickel particles.

A conductive paste refers to a material in which metal particles or metal powder is dispersed into a binder formed using a resin. By solidifying such a conductive paste, a conductive resin film is formed. Thus, since each of the conductive films 461 is formed using a conductive resin film, adhesion thereof to a solder is weak. Therefore, in order to improve the adhesion of the power supply terminals 311 and 312 to a solder, a conductive film having a predetermined shape is formed on each top surface of the conductive films 461 by sputtering using a metal mask. Here, as illustrated in FIG. 12, a three-layer conductive film is formed over each of the conductive films 461. A 150-nm-thick titanium film 462 is formed as a first conductive film. A 750-nm-thick nickel film 463 is formed as a second conductive film. A 50-nm-thick Au film 464 is formed as a third conductive film. Through the steps, the power supply terminals 311 and 312 each having a four-layer structure are completed.

Next, the glass substrate 500 is cut into separate photodetectors 300 in the peripheral portions 542 of the photodetector 300 (the portions indicated by dotted lines in FIG. 16B). The glass substrate 500 can be cut by dicing, laser cutting, or the like. Before the glass substrate 500 is cut into separate photodetectors, the glass substrate 500 can be made thinner by polishing or grinding a rear surface of the glass substrate 500. This step is preferably performed before conductive films 593 to 598 are formed by sputtering. By making the glass substrate 500 thinner, wearing out of a cutting tool used for cutting the glass substrate 500 can be reduced. Further, by making the glass substrate 500 thinner the photodetector 300 can be made thinner. For example, the glass substrate 500 having a thickness of approximately 0.5 mm can be made to have a thickness of approximately 0.25 mm. In the case of making the glass substrate 500 thinner, it is preferable the rear surface and the side surfaces of the glass substrate 500 be covered with a resin film so that the glass substrate 500 is protected.

As described above, in this embodiment, transistors (the transistors 305 and 306) in a functional circuit (the amplifier circuit 302) and a diode (the diode 321) in a protection circuit (the protection circuit 320) are simultaneously formed. It is preferable to form a diode in a protection circuit by using a semiconductor film which is formed in the same step as a semiconductor film of a transistor as in this embodiment because steps are not complicated. In the case of forming a diode in a protection circuit and a transistor in a functional circuit simultaneously as in this embodiment, resistance of a semiconductor device to ESD can be improved by applying the structure of this embodiment to a connection structure between a diode and a terminal of a semiconductor device.
(Embodiment 6)

In this embodiment, a structural example of a photodetector, which is different from that of the photodetector 300 of Embodiment 5, is described. A photodetector of this embodiment is referred to as a photodetector 330. The structure of the photodetector 330 is described below with reference to FIG. 23, FIGS. 24A to 24C, FIG. 25, and FIG. 26. In these diagrams, components in the photodetector 330, which are the same as the components in the photodetector 300, are denoted by the same reference numerals, and the description in Embodiment 5 is incorporated in description thereof.

In this embodiment, a technique by which overvoltage generated due to ESD is prevented from being applied to mainly one portion of the amplifier circuit 302 in order to further improve resistance of the photodetector 330 to ESD is described. Specifically, the shapes of the second conductive films 411 and 412 in the photodetector 300 are improved. That is, in a semiconductor device according to this embodiment, in the case where a plurality of current paths are provided from a terminal to a circuit, wiring resistance is equivalent among the plurality of current paths. With such a structure, even though overcurrent flows from the terminal to the circuit due to ESD or the like the overcurrent can be prevented from being supplied to mainly one current path. That is, resistance of the circuit to ESD can be improved.

Figure 23:
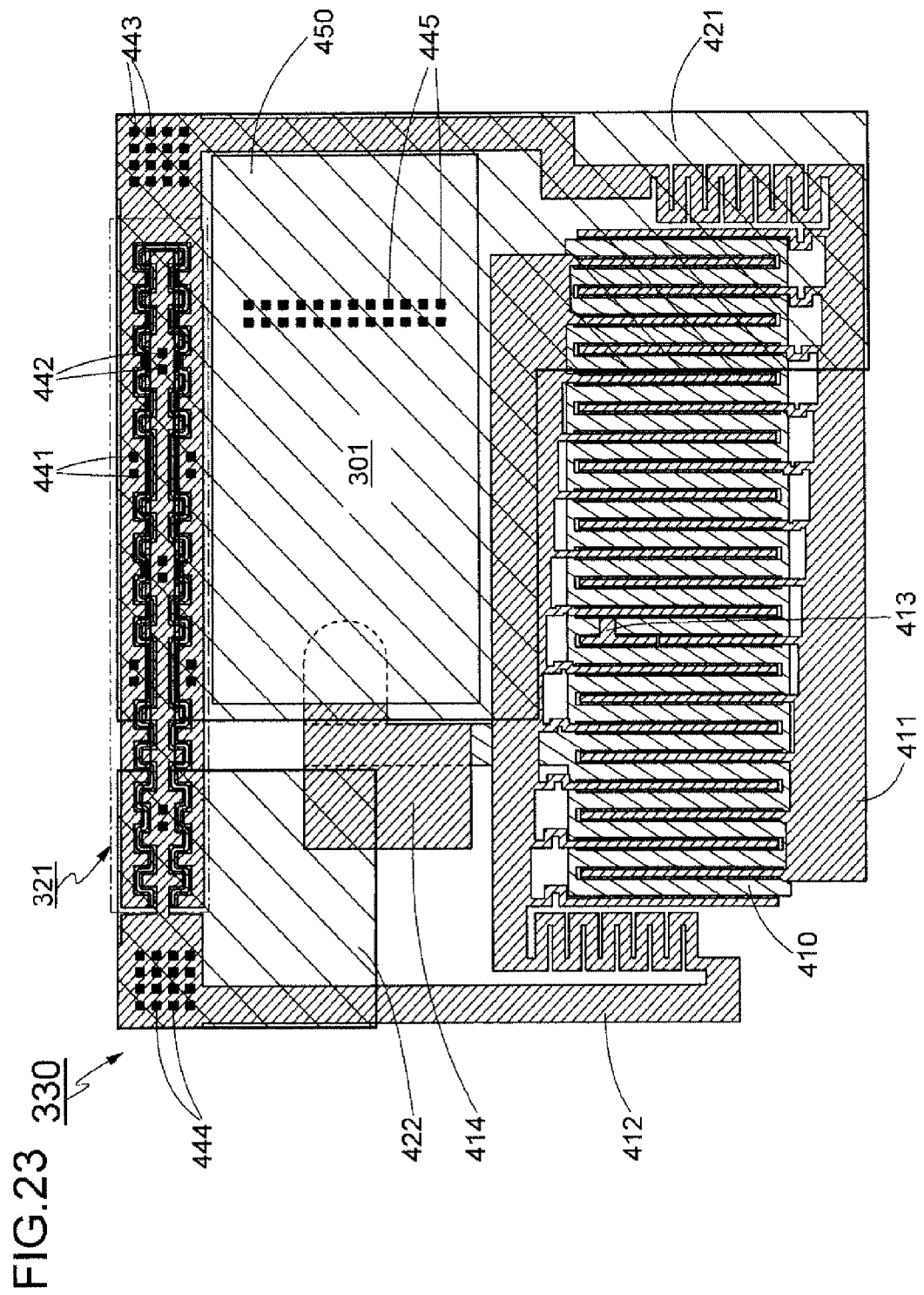
FIG. 23 is a layout diagram illustrating a structural example of the photodetector in FIG. 10 (Embodiment 6)

FIG. 23 is a plan view illustrating the layout of the photodetector 330. The photodetector 330 has the same circuit structure as the photodetector 300 (see FIG. 10). Further, the photodetector 330 can be formed in the same steps as the photodetector 300 and has a layered structure which is similar to the layered structure in FIG. 11. FIG. 23 illustrates the semiconductor film used for the transistors 305 and 306 in the amplifier circuit 302, the semiconductor film (the photoelectric conversion layer) used for the photodiode 301, the semiconductor film used for the diode 321, and the first to third conductive films of the photodetector 300. The protection circuit 32 is used as the protection circuit 320 in the photodetector 330 as in the photodetector 300. The planar shapes of films and the layout thereof are different between photodetector 300 and the photodetector 330. The films whose planar shapes and layout are different are described below.

FIG. 24A is a plan view of the semiconductor film 405 included in the amplifier circuit 302. FIG. 24B is a layout diagram of the semiconductor film 405 and the first conductive film 410. The semiconductor film 405 in the photodetector 300 is L-shaped as illustrated in FIG. 24A, and the outer shape of the semiconductor film 405 is rectangular in this embodiment. In addition, in the amplifier circuit 302, a plurality of semiconductor films 480 are formed in addition to the semiconductor film 405. The semiconductor films 480 are dummy semiconductor films and are not used for transistors. By forming the semiconductor film 480, the following advantageous effects can be obtained: the thickness of a conductive film formed above the semiconductor film 405 is made uniform and etching is uniformly performed on the conductive film.

FIG. 24C is a plan view of the diode 321. In this embodiment, the positions of the n-type impurity region 401 and the p-type impurity region 402 are opposite to those of the diode 321 in Embodiment 5. Note that FIG. 24C also illustrates the openings 431 through which the n-type impurity region 401 and the conductive film 411 are connected to each other and the openings 432 through which the p-type impurity region 402 and the conductive film 411 are connected to each other.

Figure 25:
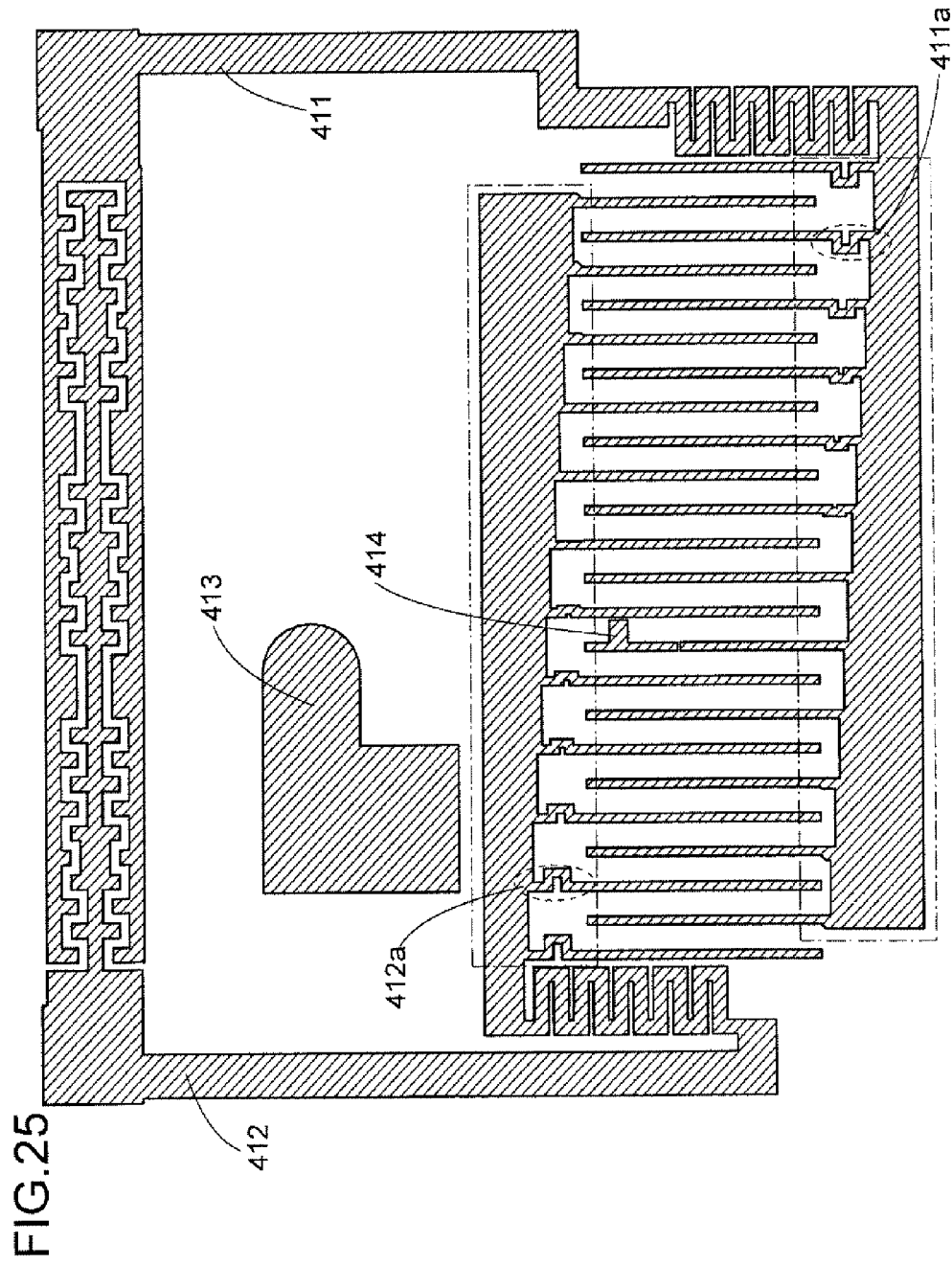
FIG. 25 is a layout diagram illustrating a structural example of a second conductive film in the photodetector (Embodiment 6)

FIG. 25 is a plan view of the second conductive films 411 to 414. In this embodiment, the shape of the conductive film 411 is improved so that wiring resistance of the plurality of transistors 306 in a first stage of the amplifier circuit 302 is equivalent to wiring resistance of the first terminal 11. Since the conductive film 411 includes twelve branch points which correspond to connection portions for connection to the amplifier circuit 302 in regions surrounded by dashed-dotted lines, the wiring width of portions to which the branch points are connected is gradually narrowed from a direction away from the connection portions for connection to the first terminal 11 to a direction close to the connection portions for connection to the first terminal 11 (from left to right in the diagram). In addition, a bend portion 411a is formed in part of the branch points so that the length of wiring is increased. The conductive film 412 is similar to the conductive film 411. The wiring width of portions to which the twelve branch points are connected is gradually narrowed from a direction away from the connection portions for connection to the second terminal 12 to a direction close to the connection portions for connection to the second terminal 12 (from right to left in the diagram). In addition, a bend portion 412a is formed in part of the branch points so that the length of wiring is increased. By forming the conductive film 411 and the conductive film 412 in this manner, in the case where overvoltage is transiently applied to the power supply terminal 311 or the power supply terminal 312 due to ESD or the like, voltage can be prevented from being applied to mainly one transistor 305 or 306 in the amplifier circuit 302. Thus, the possibility of damage to the amplifier circuit 302 can be lowered.

FIG. 26 illustrates the layout of the third conductive films 421 and 422 and the fourth conductive film 461. FIG. 26 also illustrates the openings 471 and 472 formed in the sealing film 510 and the openings 473 and 474 formed in the silicon nitride oxide film 509.

In the photodetector 330 of this embodiment, the second conductive films 411 and 412 are provided so that resistance of a plurality of current paths between the amplifier circuit 302 and the power supply terminal 311 and resistance of a plurality of current paths between the amplifier circuit 302 and the power supply terminal 312 are made uniform. Accordingly, high voltage can be prevented from being applied to the amplifier circuit 302, so that resistance of the amplifier circuit 302 itself to ESD is improved. That is, according to this embodiment, combined with improvement in performance of the protection circuit 320, even though unexpected overvoltage is applied to the terminal due to ESI) or the like, the possibility of damage to the amplifier circuit 302 can be further lowered.

Needless to say, the usage of this embodiment is not limited to photodetectors. In this embodiment, since connection wirings (second conductive films) are used for part of the functions of a protection circuit, the protection circuit can be easily made smaller. Thus, it is preferable to apply this embodiment to a small semiconductor device having a size less than or equal to 10 mm×10 mm. Note that the semiconductor device having the size less than or equal to 10 mm×10 mm is a semiconductor device which is provided in a region of 10 mm×10 mm in the layout.

(Embodiment 7)

In Embodiment 5, a method for forming each functional circuit by using the crystalline semiconductor film obtained by crystallizing the amorphous semiconductor film is described. A semiconductor device of this embodiment can be formed using a single crystal semiconductor film formed on an insulating surface. In this embodiment, a method for forming a single crystal semiconductor film on an insulating surface is described with reference to FIGS. 27A to 27G.

As illustrated in FIG. 27A, a glass substrate 800 is prepared. The glass substrate 800 is a base substrate for supporting a single crystal semiconductor film separated from a single crystal semiconductor substrate. As the glass substrate 800, it is preferable to use a substrate having a coefficient of thermal expansion greater than or equal to $25 \times 10^{-7}/°$ C. and less than or equal to $50 \times 10^{-7}/°$ C. (preferably greater than or equal to $30 \times 10^{-7}/°$ C. and less than or equal to $40 \times 10^{-7}/°$C) and a strain point higher than or equal to 580° C. and lower than or equal to 680° C. (preferably higher than or equal to 600° C. and lower than or equal to 680° C.). In addition, in order to suppress the contamination of each functional circuit, a non-alkali glass substrate is preferably used as the glass substrate. As a non-alkali glass substrate, for example, an aluminosilicate glass substrate, an aluminoborosilicate glass substrate, a barium borosilicate glass substrate, or the like can be used.

Alternatively, instead of the glass substrate 800, an insulating substrate formed using an insulator, such as a ceramic substrate, a quartz substrate, or a sapphire substrate; a conductive substrate formed using a conductive material such as metal or stainless steel; a semiconductor substrate formed using a semiconductor such as silicon or gallium arsenide; or the like can be used.

As illustrated in FIG. 27B, a single crystal semiconductor substrate 801 is prepared. By attaching a single crystal semiconductor film separated from the single crystal semiconductor substrate 801 to the glass substrate 800, an SOI substrate is formed. As the single crystal semiconductor substrate 801, a single crystal semiconductor substrate formed using an element belonging to Group 14, such as silicon, germanium, silicon germanium, or silicon carbide, can be used. In addition, in this embodiment, a substrate which is larger than the single crystal semiconductor substrate 801 is used as the glass substrate 800.

As illustrated in FIG. 27C, an insulating film 802 is formed on the single crystal semiconductor substrate 801. The insulating film 802 can have either a single-layer structure or a layered structure. The thickness of the insulating film 802 can be greater than or equal to 5 nm and less than or equal to 400 nm. As a film used for the insulating film 802, an insulating film containing silicon or germanium such as silicon oxide, silicon nitride, silicon oxynitride, silicon nitride oxide, germanium oxide, germanium nitride, germanium oxynitride, or germanium nitride oxide as its component can be used. Alternatively, an insulating film containing a metal oxide such as aluminum oxide tantalum oxide, or hafnium oxide; an insulating film containing a metal nitride such as aluminum nitride; an insulating film containing a metal oxynitride such as aluminum oxynitride; or an insulating film containing a metal nitride oxide such as aluminum nitride oxide can be used. Such an insulating film used for the insulating film 802 can be formed by a method such as CVD, sputtering, or oxidation or nitriding of the single crystal semiconductor substrate 801.

In addition, at least one film which prevents impurities from being diffused into the single crystal semiconductor film from the glass substrate 800 is preferably provided for the insulating film 802. As such a film, a silicon nitride film, a silicon nitride oxide film, an aluminum nitride film, an aluminum nitride oxide film, or the like can be used. When such a film is provided, the insulating film 802 can serve as a barrier layer.

For example, in the case where the insulating film 802 is formed as a barrier layer with a single-layer structure, the insulating film 802 can be formed using a silicon nitride film, a silicon nitride oxide film, an aluminum nitride film, or an aluminum nitride oxide film having a thickness greater than or equal to 5 nm and less than or equal to 200 nm.

In the case where the insulating film 802 is a film having a two-layer structure, which serves as a barrier layer, an upper layer is formed using an insulating film having an excellent barrier function. The upper layer can be formed using a silicon nitride film, a silicon nitride oxide film, an aluminum nitride film, or an aluminum nitride oxide film having a thickness greater than or equal to 5 nm and less than or equal to 200 nm. Although such a film has a high blocking effect of preventing an impurity from diffusing, it has high internal stress. Therefore, as an insulating film of a lower layer, which is in contact with the single crystal semiconductor substrate 801, it is preferable to select a film having an effect of relieving the stress of an insulating film of the upper layer. As such an insulating film, a silicon oxide film, a silicon oxynitride film, a thermal oxide film formed by thermally oxidizing the single crystal semiconductor substrate 801, or the like can be used. The thickness of the insulating film of the lower layer can be greater than or equal to 5 nm and less than or equal to 300 nm.

In this embodiment, the insulating film 802 has a two-layer structure including an insulating film 802a and an insulating film 802b. As the insulating film 802a, a 100-mm-hick silicon oxynitride film is formed using $SiH_4$ and $N_2O$ as a source gas by PECVD. As the insulating film 802b, a 50-nm-thick silicon nitride oxide film is formed using $SiH_4$, $N_2O$, and $NH_3$ as a source gas by PECVD.

Next, as illustrated in FIG. 27D, the single crystal semiconductor substrate 801 is irradiated with an ion beam 805 including ions accelerated by an electric field through the insulating film 802, so that a weakened layer 803 is formed to reach a predetermined depth from the surface of the single crystal semiconductor substrate 801. This ion irradiation step is a step in which the single crystal semiconductor substrate 801 is irradiated with the ion beam 805 including accelerated ion species, so that elements included in the ion species are added to the single crystal semiconductor substrate 801. When the single crystal semiconductor substrate 801 is irradiated with the ion beam 805, a layer in which a crystal structure is brittle is formed at a predetermined depth in the single crystal semiconductor substrate 801 by the impact of the accelerated ion species, which corresponds to the weakened layer 803. The depth of a region where the weakened layer 803 is formed can be controlled by the acceleration energy of the ion beam 805 and the injection angle of the ion beam 805. The acceleration energy can be adjusted by accelerating voltage, dosage, or the like. The weakened layer 803 can be formed at the same or substantially the same depth as the average depth at which the ions enter. That is, the thickness of the single crystal semiconductor film separated from the single crystal semiconductor substrate 801 is determined based on the depth at which the ions enter. The depth at which the weakened layer 803 is formed is greater than or equal to 50 nm and less than or equal to 500 nm, preferably greater than or equal to 50 nm and less than or equal to 200 nm.

In order to irradiate the single crystal semiconductor substrate 801 with the ion beam 805, an ion doping method in which mass separation is not performed can be used instead of an ion implantation method in which mass separation is performed.

In the case of using hydrogen ($H_2$) as a source gas, $H_2^+$, $H_2^+$, and $H_3^+$ can be produced by exciting a hydrogen gas. The proportion of ion species produced from the source gas can be changed by adjusting a plasma excitation method, pressure in an atmosphere for generating plasma, the supply amount of the source gas, or the like. In the case of forming the weakened layer 803 by an ion doping method, it is preferable that $H_3^+$ occupy 70% or more of the total amount of $H^+$, $H_2^+$, and $H_3^+$ in the ion beam 805, and it is more preferable that $H_3^+$ occupy 80% or more of the total amount. In order to form the weakened layer 803 at a shallow region, it is necessary to lower the accelerating voltage of the ions. Further, by increasing the proportion of $H_3$ ions in the plasma produced by exciting the hydrogen gas, atomic hydrogen can be efficiently added to the single crystal semiconductor substrate 801.

In the case of performing ion irradiation by using the hydrogen gas by an ion doping method, the accelerating voltage can be made higher than or equal to 10 kV and lower than or equal to 200 kV, and the dosage can be made greater than or equal to $1\times10^{16}$ ions/cm$^2$ and less than or equal to $6\times10^{16}$ ions/cm$^2$. By the irradiation with the hydrogen ions under this condition, the weakened layer 803 can be formed in a region at a depth greater than or equal to 50 nm and less than or equal to 500 nm in the single crystal semiconductor substrate 801, which can vary depending on the ion species included in the ion beam 805 and the proportion of the ion species.

For example, in the case where the single crystal semiconductor substrate 801 is a single crystal silicon substrate, the insulating film 802a is a 50-nm-thick silicon oxynitride film, and the insulating film 802b is a 50-nm-thick silicon nitride oxide film, a single crystal silicon film having a thickness of approximately 120 nm can be separated from the single crystal semiconductor substrate 801 in the following condition; a hydrogen source gas, an accelerating voltage of 40 kV, and a dosage of $2\times10^{16}$ ions/cm$^2$. Alternatively, when the irradiation with the hydrogen ions is performed under the above condition except that the insulating film 802a is a 100-nm-thick silicon oxynitride film, a single crystal silicon film having a thickness of approximately 70 nm can be separated from the single crystal semiconductor substrate 801.

Instead of hydrogen, helium (He) or a halogen gas such as a chlorine gas (a $Cl_2$ gas) or a fluorine gas (a $F_2$ gas) can be used as the source gas in the ion irradiation step.

After the weakened layer 803 is formed, an insulating film 804 is formed on a top surface of the insulating film 802, as illustrated in FIG. 27E. In a step of forming the insulating film 804, the single crystal semiconductor substrate 801 is heated at a temperature at which an element or a molecule which is added to the weakened layer 803 is not separated out, preferably at lower than or equal to 350° C. That is, this heat treatment is performed at a temperature at which the gas is not released from the weakened layer 803. Note that the insulating film 804 can be formed before the ion irradiation step. In this case, the process temperature at the time of forming the insulating film 804 can be set to higher than or equal to 350° C.

The insulating film 804 is a film for forming a bonding surface which is smooth and hydrophilic on the surface of the single crystal semiconductor substrate 801. The thickness of the insulating film 804 is preferably greater than or equal to 5 nm and less than or equal to 500 nm, more preferably greater than or equal to 10 nm and less than or equal to 200 nm. As the insulating film 804, a silicon oxide film or a silicon oxynitride film can be formed. Here, a 50-nm-thick silicon oxide film is formed using TEOS and $O_2$ as a source gas by PECVD.

Note that one of the insulating film 802 and the insulating film 804 is not necessarily formed. In addition, an insulating film having a single-layer structure or a layered structure may be formed over the glass substrate 800. This insulating film can be formed in a manner similar to that of the insulating film 802. In the case where the insulating film has a layered structure, the insulating film which serves as the barrier layer is preferably formed in contact with the glass substrate 800. Further, in the case of forming the insulating film over the glass substrate 800, the insulating film 802 and the insulating film 804 are not necessarily formed.

FIG. 27F is a cross-sectional view for illustrating a bonding step, which illustrates a state where the glass substrate 800 and the single crystal semiconductor substrate 801 are attached to each other. In performing the bonding step, first, the glass substrate 800, and the single crystal semiconductor substrate 801 on which the insulating films 802 and 804 are formed are subjected to ultrasonic cleaning. The ultrasonic cleaning is preferably megahertz ultrasonic cleaning (megasonic cleaning). After the megahertz ultrasonic cleaning, either one or both the glass substrate 800 and the single crystal semiconductor substrate 801 can be cleaned with ozone water. By cleaning either one or both the glass substrate 800 and the single crystal semiconductor substrate 801 with ozone water, organic substances can be removed and the surface can be made more hydrophilic.

After the cleaning step, the glass substrate 800 and the single crystal semiconductor substrate 801 are attached to each other with the insulating film 804 interposed therebetween. When the surface of the glass substrate 800 and a surface of the insulating film 804 are attached to each other, a chemical bond (e.g., a hydrogen bond) is formed at an interface between the glass substrate 800 and the insulating film 804, so that the glass substrate 800 and the insulating film 804 are bonded to each other. Since the bonding step can be performed at room temperature without performing heat treatment, a substrate with low heat resistance, like the glass substrate 800, can be used as a substrate to which the single crystal semiconductor substrate 801 is attached.

In order to increase bonding strength at the interface between the glass substrate 800 and the insulating film 804, heat treatment is preferably performed after the glass substrate 800 and the single crystal semiconductor substrate 801 are attached to each other. This heat treatment is performed at a temperature at which the weakened layer 803 does not crack and can be performed at a temperature higher than or equal to 70° C. and lower than or equal to 300° C., for example.

Subsequently, heat treatment is performed at higher than or equal to 400° C., and the single crystal semiconductor substrate 801 is divided along the weakened layer 803 so that a single crystal semiconductor film 806 is separated from the single crystal semiconductor substrate 801. FIG. 27G is a cross-sectional view illustrating a separation step of separating the single crystal semiconductor film 806 from the single crystal semiconductor substrate 801. As illustrated in FIG.

27G, the single crystal semiconductor film 806 is formed over the glass substrate 800 through the separation step. An element denoted by reference numeral 801A is the single crystal semiconductor substrate 801 from which the single crystal semiconductor film 806 is separated.

By performing the heat treatment at higher than or equal to 400° C., the hydrogen bond formed at the interface between the glass substrate 800 and the insulating film 804 can be changed into a covalent bond. Thus, the bonding strength is increased. As the temperature rises, the element added in the ion irradiation step is separated out to the microvoids formed in the weakened layer 803, so that internal pressure is increased. As the pressure rises, the volume of the microvoids formed in the weakened layer 803 is changed, so that the weakened layer 803 cracks. Thus, the single crystal semiconductor substrate 801 is divided along the weakened layer 803. Since the insulating film 804 is bonded to the glass substrate 800, the single crystal semiconductor film 806 separated from the single crystal semiconductor substrate 801 is fixed over the glass substrate 800. The heat treatment for separating the single crystal semiconductor film 806 from the single crystal semiconductor substrate 801 is performed at a temperature which is not higher than the strain point of the glass substrate 800, specifically, can be performed at a temperature higher than or equal to 400° C. and lower than or equal to 700° C.

After the separation step illustrated in FIG. 27G is completed, an SOI substrate 810 in which the single crystal semiconductor film 806 is attached to the glass substrate 800 is formed. The SOI substrate 810 is a substrate which has a multilayer structure where the insulating film 804, the insulating film 802, the single crystal semiconductor film 806 are sequentially stacked over the glass substrate 800 and in which the insulating film 802 and the insulating film 804 are bonded to each other. In the case where the insulating film 802 is not formed, the SOI substrate 810 is a substrate in which the insulating film 804 and the single crystal semiconductor film 806 are bonded to each other.

Note that the heat treatment for separating the single crystal semiconductor film 806 from the single crystal semiconductor substrate 801 can be performed successively in the same apparatus as in the heat treatment for increasing the bonding strength. Alternatively, the two heat treatments can be performed in different apparatuses. For example, in the case of using the same furnace, heat treatment is performed at a treatment temperature of 200° C. for a treatment time of 2 hours. Subsequently, the temperature is raised to 600° C., and heat treatment is performed at 600° C. for a treatment time of 2 hours. Then, the temperature is lowered from lower than or equal to 400° C. to room temperature, and the single crystal semiconductor substrate 801A and the SOI substrate 810 are taken out from the furnace.

In the case where the heat treatments are performed in different apparatuses, for example, after heat treatment is performed at a treatment temperature of 200° C. for a treatment time of 2 hours in a furnace, the glass substrate 800 and the single crystal semiconductor substrates 801 which are attached to each other are carried out from the furnace. Subsequently, heat treatment is performed at a treatment temperature higher than or equal to 600° C. and lower than or equal to 700° C. for a treatment time longer than or equal to 1 minute and shorter than or equal to 30 minutes, so that the single crystal semiconductor substrate 801 is divided along the weakened layer 803.

Crystal defects are formed in the single crystal semiconductor film 806 in the SOI substrate 810 due to the formation of the weakened layer 803, the separation step, or the like, and the flatness of the surface of the single crystal semiconductor film 806 is damaged. Therefore, in order to reduce the crystal defects and to flatten the surface, 25 the single crystal semiconductor film 806 is preferably irradiated with laser light and melted to be recrystallized. Alternatively, in order to remove the damage of the surface of the single crystal semiconductor film 806 so that the surface is flattened, the surface of the single crystal semiconductor film 806 is preferably polished by a chemical mechanical polishing (CMP) apparatus.

By using the SOI substrate 810 of this embodiment, a variety of semiconductor devices such as photodetectors having SOI structures can be manufactured.

(Embodiment 8)

By attaching the photodetectors of Embodiments 5 and 6 to electronic devices, the operation of the electronic devices can be controlled in accordance with output signals of the photodetectors. For example, by mounting the photodetectors on electronic devices including display panels, the illuminance of use environment can be measured in the photodetectors and the luminance of the display panels can be adjusted by using signals in which the illuminance detected in the photodetectors is used as data. In this embodiment, some examples of such electronic devices are described with reference to FIGS. 28A to 28F.

Figure 28A:
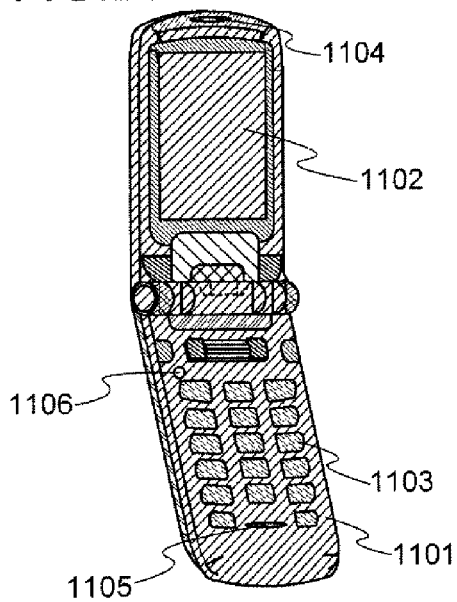
FIGS. 28A and 28B are external views illustrating structural examples of mobile phones including a photodetector.
Figure 28B:
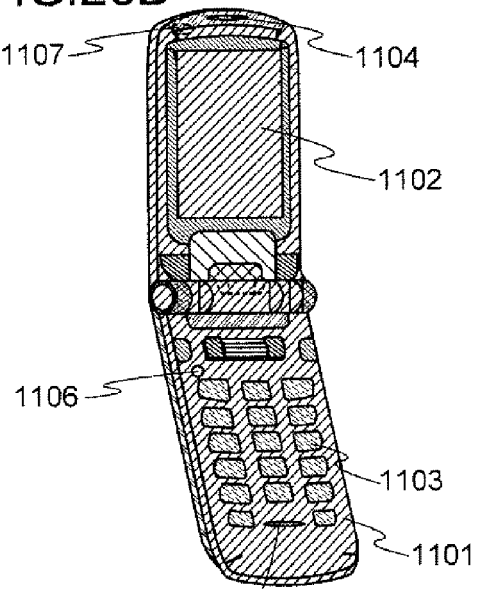

FIGS. 28A and 28B are external views of mobile phones. The mobile phones in FIGS. 28A and 28B include a main body 1101, a display panel 1102, operation keys 1103, an audio output portion 1104, and an audio input portion 1105. In addition, the main body 1101 includes a photodetector 1106. The mobile phones in FIGS. 28A and 28B each have a function of controlling the luminance of the display panel 1102 in accordance with output signals from the photodetector 1106. Further, in the mobile phone in FIG. 28B, a photodetector 1107 for detecting the luminance of a backlight in the display panel 1102 is mounted on the main body 1101.

Figure 28C:
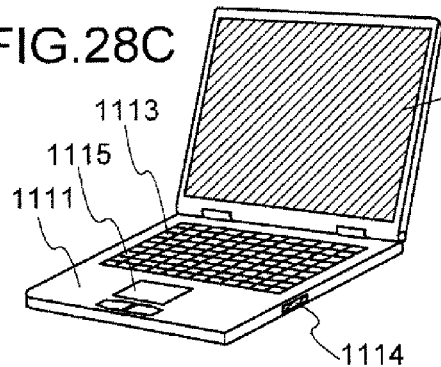
FIG. 28C is an external view illustrating a structural example of a computer including a photodetector.

FIG. 28C is an external view of a computer. The computer includes a main body 1111, a display panel 1112, a keyboard 1113, an external connection port 1114, a pointing device 1115, and the like. Further, a photodetector (not illustrated) for detecting the luminance of a backlight in the display panel 1112 is mounted on the main body 1111.

Figure 28D:
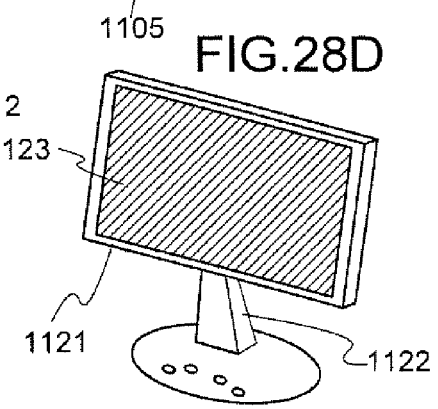
FIG. 28D is an external view illustrating a structural example of a display device including a photodetector.

FIG. 28D is an external view of a display device. A TV receiver, a monitor of a computer, or the like corresponds to the display device. The display device includes a housing 1121, a support base 1122, a display panel 1123, and the like. A photodetector (not illustrated) for detecting the luminance of a backlight in the display panel 1123 is mounted on the housing 1121.

Figure 28E:
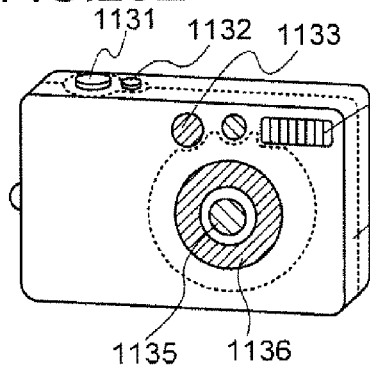
FIGS. 28E and 28F are external views illustrating a digital camera including a photodetector (Embodiment 8)
Figure 28F:
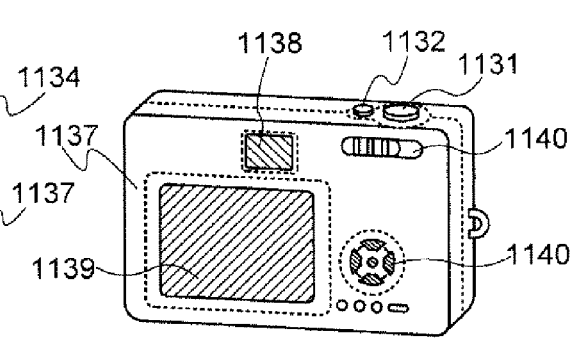

FIG. 28E is an external view of a digital camera when viewed from the front side. FIG. 28F is an external view of the digital camera when viewed from the back side. The digital camera includes a release button 1131, a main switch 1132, a finder window 1133, a flashlight 1134, a lens 1135, a lens barrel 1136, a housing 1137, a finder eyepiece window 1138, a display panel 1139, operation buttons 1140, and the like. By mounting the photodetector on the digital camera, the luminance of a photographing environment can be detected in the photodetector. Exposure, shutter speed, and the like can be adjusted in accordance with electrical signals detected in the photodetector.

EXAMPLE 1

Figure 29:
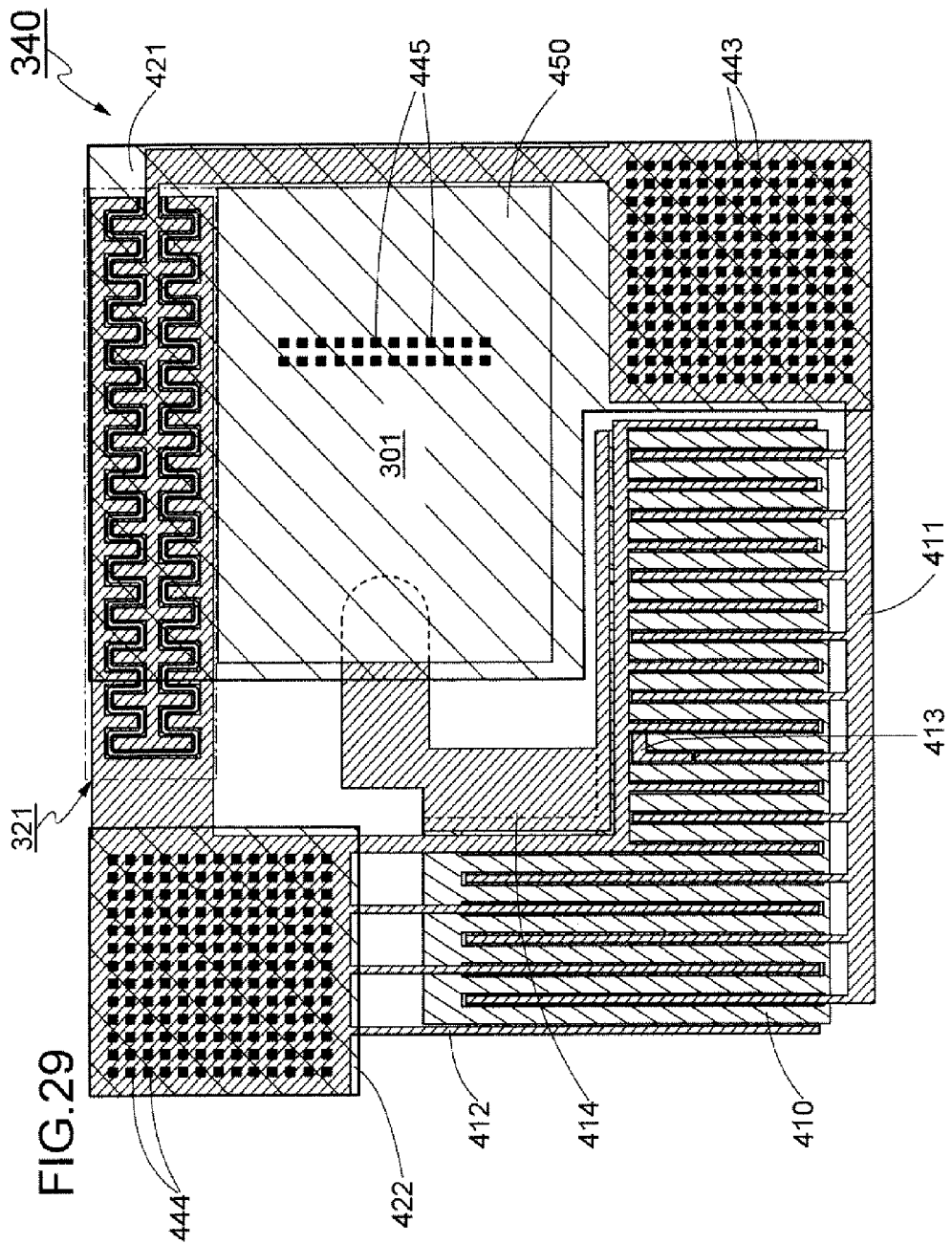
FIG. 29 is a plan view illustrating the structure of a photodetector, which is a comparative example, on which a test of overvoltage application is performed (Example 1)

Overvoltage application tests (also referred to as static electricity tests) were performed on the photodetector 300 of Embodiment 5 and the photodetector 330 of Embodiment 6. In Example 1, the test results are illustrated. Further, as a comparative example, a photodetector 340 including a protection circuit in which a portion where a first conductive film and a second conductive film of a diode are connected to each other does not exist over a semiconductor film of the diode was formed, and an overvoltage application test was performed on the photodetector 340. FIG. 29 is a plan view of the photodetector 340 which is the comparative example.

As illustrated in FIG. 29, the photodetector 340 is a transformation example of the photodetector 300, and the photodetector 340 differs from the photodetector 300 in the following points: the planar shapes of the third conductive films 421 and 422 are different; the opening 441 through which the conductive film 421 and the conductive film 411 are connected to each other is not formed; the opening 442 through which the conductive film 422 and the conductive film 412 are connected to each other is not formed.

That is, in the photodetector 340, a portion where the first conductive films 411 and 412 and the second conductive films 421 and 422 of the diode are connected to each other does not exist over the semiconductor film 405 used for the diode 321 in the protection circuit 320. Therefore, in the photodetector 340 which is the comparative example, wiring resistance between the diode 321 and the power supply terminal 311 and wiring resistance between the diode 321 and the power supply terminal 312 are higher than those of the photodetector 300.

The photodetector 330 and the photodetector 340 on which the overvoltage application tests were performed were formed in the same conditions as the photodetector 300 (see Embodiment 5).

In the overvoltage application tests, an electrostatic discharge simulator for semiconductors (ESS-606A) manufactured by NOISE LABORATORY CO., LTD. was used. As a testing method, a human body model method was used. Note that the photodetectors 300, 330, and 340 on which the tests were performed were devices before the power supply terminal 311 and the power supply terminal 312 were formed. With the simulator, whether the photodetectors were damaged was confirmed by applying high voltage between the conductive film 411 to which the high power supply potential VDD was applied and the conductive film 412 to which the low power supply potential VSS was applied. In the overvoltage application tests, the level of voltage was raised in increments of 0.5 kV from 0.5 kV to 6.0 kV and bipolar voltage was applied every one time. That is, forward bias voltage and reverse bias voltage which have the same levels are applied to the diode 321 every one time.

Figure 30:
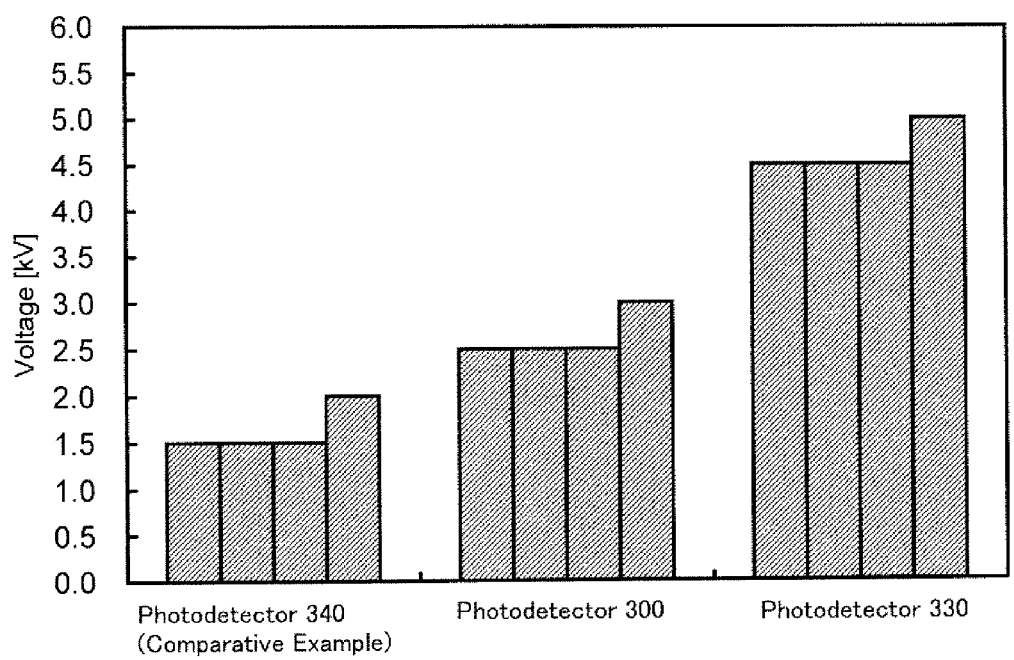
FIG. 30 is a graph illustrating the results of the test of overvoltage application on photodetectors which are an embodiment and the comparative example (Example 1).

FIG. 30 illustrates the test results of the photodetectors 300, 330, and 340. The tests were performed on the photodetectors 300, 330, and 340 by using four devices. The longitudinal axis in a graph of FIG. 30 illustrates the highest level of voltage in the case where the photodetectors are not damaged in the tests. Here, in the case where the amount of output current of the photodetectors after overvoltage is applied is changed from the level before the tests by ±20%, it was determined that the photodetectors were damaged. For example, the graph of 1.5 kV in the photodetector 340 shows that the photodetector 300 is not damaged by application of an overvoltage of ±0.5 to ±1.5 kV and that the photodetector 300 is damaged by application of an overvoltage of +2.0 kV or −2.0 kV.

Note that the bonding length L of the diode 321 which is included in the protection circuit 320 and the 1-layer width W are as follows.

The photodetectors 300 and 340

$L/W=4/3060$ [μm]

The photodetector 330

$L/W=4/2480$ [μm]

The test results in FIG. 30 show that resistance of a semiconductor device to ESD is improved by using the protection circuit of Embodiment 5 or 6. Further, the test results of the photodetector 300 and the photodetector 330 show that it is extremely effective to equalize the resistance of the plurality of current paths between the amplifier circuit 302 and the power supply terminal 311 and to equalize the resistance of the plurality of current paths between the amplifier circuit 302 and the power supply terminal 312 in order to improve resistance of the semiconductor device to ESD.

As described above, according to Example 1, it was confirmed that an integrated circuit including a transistor formed using a non-single-crystal semiconductor film could be protected against damage by an overvoltage higher than or equal to 2.5 kV by using a diode formed using a non-single-crystal semiconductor film.

This application is based on Japanese Patent Application serial no. 2008-180635 filed with Japan Patent Office on Jul. 10, 2008, the entire contents of which are hereby incorporated by reference.

What is claimed is:

1. A semiconductor device comprising:
    a first terminal;
    a second terminal;
    a functional circuit electrically connected to the first terminal and the second terminal, and
    a protection circuit electrically connected to the first terminal and the second terminal,
    wherein the protection circuit comprises:
        a diode over an insulating surface, the diode comprising a semiconductor film comprising an n-type impurity region and a p-type impurity region;
        a first insulating film over the semiconductor film, the first insulating film having a plurality of first openings and a plurality of second openings;
        a first conductive film over the first insulating film;
        a second conductive film over the first insulating film;
        a second insulating film over the first conductive film and the second conductive film, the second insulating film having a plurality of third openings and a plurality of fourth openings;
        a third conductive film over the second insulating film; and
        a fourth conductive film over the second insulating film,
        wherein the n-type impurity region and the first conductive film are electrically connected to each other through the plurality of first openings,
        wherein the p-type impurity region and the second conductive film are electrically connected to each other through the plurality of second openings,
        wherein the first conductive film and the third conductive film are electrically connected to each other through the plurality of third openings, and
        wherein the second conductive film and the fourth conductive film are electrically connected to each other through the plurality of fourth openings.

2. The semiconductor device according to claim 1, wherein a high-resistance region is formed between the n-type impurity region and the p-type impurity region so as to be adjacent to the n-type impurity region and the p-type impurity region in the semiconductor film.

3. The semiconductor device according to claim 1, wherein each of the first conductive film and the second conductive film comprises a portion used for a wiring or an electrode of the functional circuit.

4. The semiconductor device according to claim 1, further comprising a glass substrate and a third insulating film formed over the glass substrate, wherein the functional circuit and the protection circuit are formed over the third insulating film.

5. The semiconductor device according to claim 1, wherein the semiconductor film is a non-single-crystal semiconductor film.

6. The semiconductor device according to claim 1,
wherein the functional circuit comprises a transistor comprising a channel formation region comprising a non-single-crystal semiconductor, and
wherein the semiconductor film comprises a non-single-crystal semiconductor.

7. The semiconductor device according to claim 1, wherein the functional circuit comprises a photodiode and an amplifier circuit for amplifying output current of the photodiode.

8. The semiconductor device according to claim 1,
wherein the plurality of first openings are distributed over an entire region of the n-type impurity region,
wherein the plurality of second openings are distributed over an entire region of the p-type impurity region,
wherein the plurality of third openings are formed over the semiconductor film and are partially formed over the first conductive film, and
wherein the plurality of fourth openings are formed over the semiconductor film and are partially formed over the second conductive film.

9. A semiconductor device comprising:
a first terminal;
a second terminal;
a functional circuit electrically connected to the first terminal and the second terminal; and
a protection circuit, the protection circuit comprising:
    a diode over a substrate, the diode comprising a semiconductor film having an n-type impurity region and a p-type impurity region;
    a first insulating film over the semiconductor film, the first insulating film comprising a first electrical connection portion having a plurality of first openings and a second electrical connection portion having a plurality of second openings;
    a first conductive film over the first insulating film, the first conductive film being electrically connected to the n-type impurity region through the plurality of first openings;
    a second conductive film over the first insulating film, the second conductive film being electrically connected to the p-type impurity region through the plurality of second openings;
    a second insulating film over the first conductive film and the second conductive film, the second insulating film comprising a plurality of third electrical connection portions having a plurality of third openings and a plurality of fourth electrical connection portions having a plurality of fourth openings;
    a third conductive film over the second insulating film, the third conductive film being electrically connected to the first conductive film through the plurality of third openings; and
    a fourth conductive film over the second insulating film, the fourth conductive film being electrically connected to the second conductive film through the plurality of fourth openings,
wherein the third conductive film is electrically connected to the first terminal and the fourth conductive film is electrically connected to the second terminal,
wherein the plurality of third electrical connection portions are arranged at larger intervals than intervals at which the plurality of third openings in each the plurality of third electrical connection portions are arranged,
wherein the plurality of fourth electrical connection portions are arranged at larger intervals than intervals at which the plurality of fourth openings in each the plurality of fourth electrical connection portions are arranged,
wherein the plurality of third electrical connection portions are overlapped with the first electrical connection portion, and
wherein the plurality of fourth electrical connection portions are overlapped with the second electrical connection portion.

10. The semiconductor device according to claim 9, wherein a high-resistance region is formed between the n-type impurity region and the p-type impurity region so as to be adjacent to the n-type impurity region and the p-type impurity region in the semiconductor film.

11. The semiconductor device according to claim 9, wherein each of the first conductive film and the second conductive film comprises a portion used for a wiring or an electrode of the functional circuit.

12. The semiconductor device according to claim 9, further comprising a third insulating film formed over the substrate, wherein the functional circuit and the protection circuit are formed over the third insulating film.

13. The semiconductor device according to claim 9, wherein the semiconductor film is a non-single-crystal semiconductor film.

14. The semiconductor device according to claim 9,
wherein the functional circuit comprises a transistor comprising a channel formation region comprising a non-single-crystal semiconductor, and
wherein the semiconductor film comprises a non-single-crystal semiconductor.

15. The semiconductor device according to claim 9, wherein the functional circuit comprises a photodiode and an amplifier circuit for amplifying output current of the photodiode.

* * * * *

UNITED STATES PATENT AND TRADEMARK OFFICE
CERTIFICATE OF CORRECTION

| | | |
|---|---|---|
| PATENT NO. | : 8,174,047 B2 | |
| APPLICATION NO. | : 12/495963 | |
| DATED | : May 8, 2012 | |
| INVENTOR(S) | : Osamu Fukuoka et al. | |

It is certified that error appears in the above-identified patent and that said Letters Patent is hereby corrected as shown below:

In the Specification:

Col. 3, line 24, "and FIG. 5C is" should read "and FIG. 8C is"

Col. 4, line 6, "a semiconductor Film" should read "a semiconductor film"

Col. 5, line 60, "film such as a CaAs" should read "film such as a GaAs"

Col. 8, line 23, "n-type impurity region 1001" should read "n-type impurity region 101"

Col. 8, line 57, "for this call be understood" should read "for this can be understood"

Col. 8, line 61, "first terminal II or" should read "first terminal 11 or"

Col. 11, line 50, "FIGS. 5A to 8C" should read "FIGS. 8A to 8C"

Col. 11, line 65, "circuit 10. Furthers the" should read "circuit 10. Further, the"

Col. 13, line 19, "FIGS. 5A to 5C" should read "FIGS. 8A to 8C"

Col. 13, line 21, "In FIG. 5B, the openings" should read "In FIG. 8B, the openings"

Col. 13, line 22, "FIG. 5C is a layout" should read "FIG. 8C is a layout"

Col. 14, line 4, "(see FIG. 213)." should read "(see FIG. 2B)."

Col. 14, line 26, "region 102 is a rectangular" should read "region 102 is a rectangle"

Col. 14, line 29, "region 10 and the high-resistance" should read "region 101 and the high-resistance"

Signed and Sealed this
Ninth Day of October, 2012

David J. Kappos
*Director of the United States Patent and Trademark Office*

CERTIFICATE OF CORRECTION (continued)
U.S. Pat. No. 8,174,047 B2

Cont.

In the Specification:

Col. 23, line 8, "silicon nitride oxide film 50S" should read "silicon nitride oxide film 505"

Col. 26, line 65, "terminal due to ESI)" should read "terminal due to ESD"

Col. 28, line 42, "100-mm-hick silicon" should read "100-nm-thick silicon"

Col. 32, line 2, "the surface, 25 the single" should read "the surface, the single"

Col. 33, line 64, "Ware as follows." should read "W are as follows."